(12) United States Patent
Ueki

(10) Patent No.: US 11,093,812 B2
(45) Date of Patent: Aug. 17, 2021

(54) RFIC MODULE, RFID TAG, AND ARTICLE

(71) Applicant: Murata Manufacturing Co., Ltd., Nagaokakyo (JP)

(72) Inventor: Noriyuki Ueki, Nagaokakyo (JP)

(73) Assignee: MURATA MANUFACTURING CO, LTD, Kyoto (JP)

(*) Notice: Subject to any disclaimer, the term of this patent is extended or adjusted under 35 U.S.C. 154(b) by 45 days.

(21) Appl. No.: 16/674,198

(22) Filed: Nov. 5, 2019

(65) Prior Publication Data
US 2020/0074263 A1 Mar. 5, 2020

Related U.S. Application Data

(63) Continuation of application No. PCT/JP2019/020293, filed on May 22, 2019.

(30) Foreign Application Priority Data

Sep. 5, 2018 (JP) .............................. JP2018-166313
Oct. 24, 2018 (JP) .............................. JP2018-200026

(51) Int. Cl.
*G06K 19/077* (2006.01)
*H01L 25/16* (2006.01)
(Continued)

(52) U.S. Cl.
CPC ... *G06K 19/07773* (2013.01); *G06K 19/0723* (2013.01); *H01L 25/16* (2013.01);
(Continued)

(58) Field of Classification Search
CPC .......... G06K 19/07773; G06K 19/0723; H01L 25/16; H03H 1/00; H05K 1/115; H05K 1/185
See application file for complete search history.

(56) References Cited

U.S. PATENT DOCUMENTS 6,177,908 B1 * 1/2001 Kawahata .............. H01Q 1/243
343/700 MS
6,300,909 B1 * 10/2001 Tsubaki ................ H01Q 1/243
343/700 MS
(Continued)

FOREIGN PATENT DOCUMENTS

JP H11312919 A 11/1999
JP 2004282250 A 10/2004
(Continued)

OTHER PUBLICATIONS

International Search Report issued for PCT/JP2019/020293, dated Jul. 30, 2019 (Japanese language only).

*Primary Examiner* — Thien M Le
*Assistant Examiner* — Asifa Habib
(74) *Attorney, Agent, or Firm* — Arent Fox LLP

(57) ABSTRACT

An RFIC module is provided that includes a first planar conductor and a second planar conductor that faces each other. Moreover, an inductor is provided of which both ends are connected between the first planar conductor and the second planar conductor. An RFIC also has both ends connected between the first planar conductor and the second planar conductor. In a plan view of the first planar conductor, the inductor is adjacent to a first point that is at an outer edge of the first planar conductor, and the RFIC is adjacent to a second point of the outer edges of the first planar conductor. In addition, the second point is positioned away from the first point.

19 Claims, 57 Drawing Sheets

(51) Int. Cl.
  *H05K 1/11*   (2006.01)
  *H05K 1/18*   (2006.01)
  *H03H 1/00*   (2006.01)
  *H01Q 1/36*   (2006.01)
  *G06K 19/07*  (2006.01)
  *H01Q 9/16*   (2006.01)

(52) U.S. Cl.
  CPC ............... *H01Q 1/36* (2013.01); *H03H 1/00* (2013.01); *H05K 1/115* (2013.01); *H05K 1/185* (2013.01); *H01Q 9/16* (2013.01); *H03H 2001/0078* (2013.01); *H05K 2201/1003* (2013.01); *H05K 2201/10015* (2013.01)

(56) References Cited

U.S. PATENT DOCUMENTS

| | | | | |
|---|---|---|---|---|
| 6,624,786 | B2* | 9/2003 | Boyle | H01Q 9/0421 |
| | | | | 343/700 MS |
| 7,466,277 | B2* | 12/2008 | Ishizuka | H01Q 1/243 |
| | | | | 343/700 MS |
| 7,538,732 | B2* | 5/2009 | Ishihara | H01Q 1/38 |
| | | | | 343/700 MS |
| 8,098,202 | B2* | 1/2012 | Annamaa | H01Q 9/0407 |
| | | | | 343/700 MS |
| 9,203,154 | B2* | 12/2015 | Korva | H01Q 5/378 |
| 9,973,228 | B2* | 5/2018 | Heikura | H01Q 1/44 |
| 2014/0001274 | A1 | 1/2014 | Kato | |
| 2014/0361089 | A1* | 12/2014 | Kai | G06K 19/07786 |
| | | | | 235/492 |
| 2016/0351514 | A1* | 12/2016 | Ikeda | H01L 24/17 |
| 2017/0026089 | A1* | 1/2017 | Kato | G06K 19/0775 |
| 2018/0032853 | A1 | 2/2018 | Sugimura et al. | |
| 2019/0199001 | A1* | 6/2019 | Kato | G06K 7/10 |
| 2019/0228283 | A1* | 7/2019 | Eshima | H01Q 1/2225 |
| 2019/0280366 | A1* | 9/2019 | Kato | G06K 19/07786 |
| 2020/0042852 | A1* | 2/2020 | Omori | G06K 19/07724 |
| 2020/0285927 | A1* | 9/2020 | Yabuhara | G06K 19/0716 |

FOREIGN PATENT DOCUMENTS

| | | |
|---|---|---|
| JP | 2012253700 A | 12/2012 |
| JP | 2018061276 A | 4/2018 |
| WO | 2007083574 A1 | 7/2007 |
| WO | 2012141070 A1 | 10/2012 |
| WO | 2016129542 A1 | 8/2016 |

\* cited by examiner

Fig. 48A
Fig. 48B
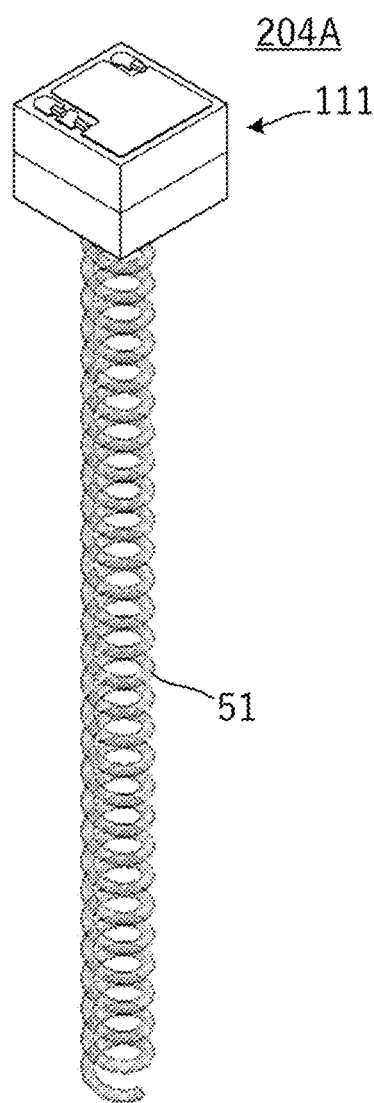
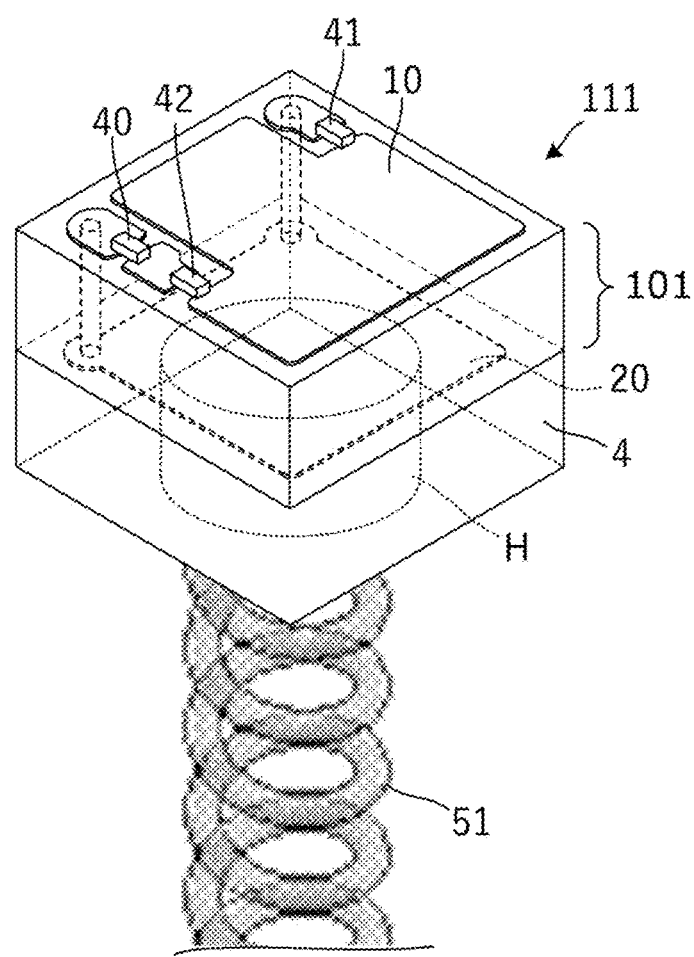

COMPARATIVE EXAMPLE

COMPARATIVE EXAMPLE

COMPARATIVE EXAMPLE

COMPARATIVE EXAMPLE

RFIC MODULE, RFID TAG, AND ARTICLE

CROSS REFERENCE TO RELATED APPLICATIONS

The present application is a continuation of PCT/JP2019/020293 filed May 22, 2019, which claims priority to JP Application No. 2018-166313, filed Sep. 5, 2018, and JP Application No. 2018-200026, filed Oct. 24, 2018, the entire contents of each of which are incorporated herein by reference.

TECHNICAL FIELD

The present invention relates to an RFIC module that includes an IC configured to process a high frequency signal, and an RFID tag and an article that include such an RFIC module.

BACKGROUND

International Publication No. 2007/083574 discloses a wireless IC device that includes a wireless IC chip, a feed circuit substrate that includes a feed circuit to be connected to the wireless IC chip, and a radiation plate to which the feed circuit substrate is adjacent. This wireless IC device combines an RFIC module that includes a resonant circuit provided on the feed circuit substrate and the wireless IC chip, with a radiation plate so as to cause the entirety to function as an RFID tag.

In the wireless IC device disclosed in International Publication No. 2007/083574, the RFIC module is disposed at the center or in the vicinity of the center of the radiation plate. In other words, since the RFIC module is disposed in a position in which a current density distribution of the radiation plate is maximum, this device is designed with consideration for how efficiently the RFIC module flows a current in the radiation plate. Therefore, when the RFIC module is disposed at an end of the radiation plate, the radiation plate does not effectively act as a radiating element.

SUMMARY OF THE INVENTION

In view of the existing wireless IC device described above, exemplary embodiments of the present invention provide an RFIC module suited to be disposed at an end of a radiation portion or a conductor that acts as a radiation plate, and an RFID tag and an article that include such an RFIC module.

In particular, an RFIC module as an exemplary embodiment of the present disclosure includes a first planar conductor, a second planar conductor that faces the first planar conductor, an inductor that includes a first end and a second end, and an RFIC that includes a first end and a second end. Moreover, the first end of the inductor is connected to a first point that is a portion of an outer edge of the first planar conductor, the second end of the inductor is connected to a second point that is a portion of an outer edge of the second planar conductor, the first end of the RFIC is connected to a third point that is a portion of the outer edge of the first planar conductor, and the second end of the RFIC is connected to a fourth point that is a portion of the outer edge of the second planar conductor.

In the RFIC module of the above-described configuration, the gradient of the current density distribution of the first planar conductor and the second planar conductor is low, and, similarly, the gradient of the electric field intensity distribution between the first planar conductor and the second planar conductor is low. Therefore, a uniform (or substantially uniform) electric field is distributed between the first planar conductor and the second planar conductor, and a voltage phase of the first planar conductor and a voltage phase of the second planar conductor are inverted to each other. Accordingly, when this RFIC module is disposed at an end of a radiation portion or a conductor that acts as a radiation plate, a proper voltage intensity distribution is provided in the radiation portion or the conductor portion, and the radiation portion or the conductor portion acts as an efficient radiating element.

In addition, an RFID tag as an exemplary embodiment of the present disclosure includes a radiator that includes a conductor that extends in a longitudinal direction, and an RFIC module that includes a first planar conductor, a second planar conductor that faces the first planar conductor, an inductor that includes a first end and a second end, and an RFIC that includes a first end and a second end. Moreover, the first end of the inductor is connected to a first point that is a portion of an outer edge of the first planar conductor, the second end of the inductor is connected to a second point that is a portion of an outer edge of the second planar conductor, the first end of the RFIC is connected to a third point that is a portion of the outer edge of the first planar conductor, the second end of the RFIC being is to a fourth point that is a portion of the outer edge of the second planar conductor, and the RFIC module is disposed in a vicinity of an end of the radiator in the longitudinal direction.

In the RFID tag of the above-described configuration, as described above, a uniform (or substantially uniform) electric field is distributed between the first planar conductor and the second planar conductor, and a voltage phase of the first planar conductor and a voltage phase of the second planar conductor are inverted to each other. Accordingly, a proper voltage intensity distribution is provided in the radiation portion, and an RFID tag including the radiation portion with a high radiation efficiency is able to be obtained.

In another exemplary aspect, an article is provided that has a conductor portion that extends in a longitudinal direction, and the article includes an RFIC module that includes a first planar conductor, a second planar conductor that faces the first planar conductor, an inductor that includes a first end and a second end, and an RFIC that includes a first end and a second end. Moreover, the first end of the inductor is connected to a first point that is a portion of an outer edge of the first planar conductor, the second end of the inductor is connected to a second point that is a portion of an outer edge of the second planar conductor, the first end of the RFIC is connected to a third point that is a portion of the outer edge of the first planar conductor, the second end of the RFIC is connected to a fourth point that is a portion of the outer edge of the second planar conductor, and the RFIC module is disposed in a vicinity of an end portion of the conductor portion in the longitudinal direction.

In the article of the above-described configuration, as described above, a uniform (or substantially uniform) electric field is distributed between the first planar conductor and the second planar conductor, and a voltage phase of the first planar conductor and a voltage phase of the second planar conductor are inverted to each other. Accordingly, a proper voltage intensity distribution is provided in the conductor portion, and an article including a conductor portion with a high radiation efficiency is able to be obtained.

According to the exemplary embodiment of the present invention, by being disposed at an end of a radiation portion or a conductor portion that acts as a radiation plate, an RFIC module that causes the radiation portion or the conductor portion to act as an efficient radiating element, is provided. In addition, a proper voltage intensity distribution is provided in the radiation portion, and an RFID tag including the radiation portion with a high radiation efficiency is able to be obtained. In addition, an article including a conductor portion with a high radiation efficiency is able to be obtained.

BRIEF DESCRIPTION OF DRAWINGS

FIG. 48A is a perspective view of an RFID tag according to a sixteenth exemplary embodiment of the present invention. FIG. 48B is a partially enlarged perspective view of the RFID tag.

DETAILED DESCRIPTION

Figure 1:
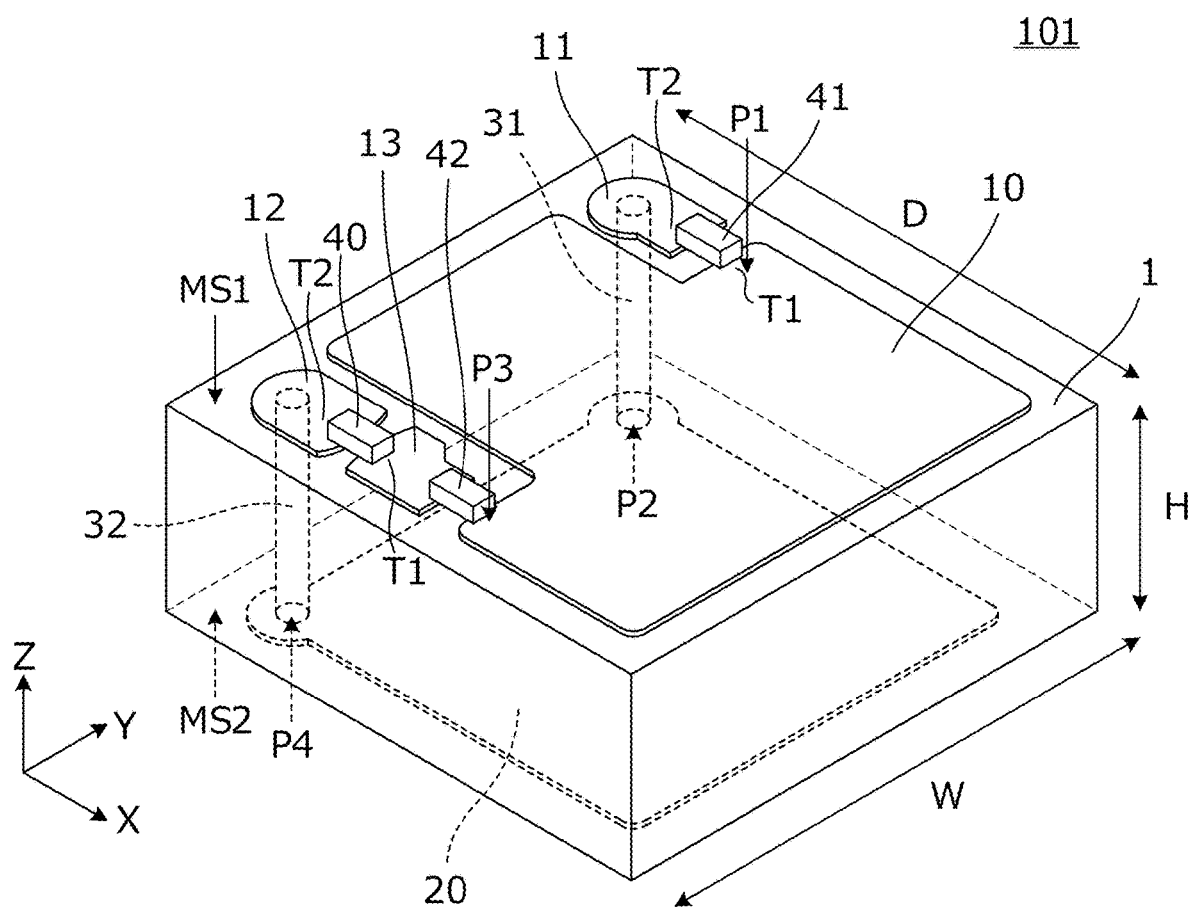
FIG. 1 is a perspective view of an RFIC module according to a first exemplary embodiment of the present invention.

Hereinafter, a plurality of exemplary embodiments of the present invention will be described with reference to the attached drawings and several specific examples. In the drawings, components and elements assigned with the same reference numerals or symbols will represent identical components and elements. While exemplary embodiments of the present invention are divided and described for the sake of convenience in consideration of ease of description or understanding of main points, it should be appreciated that constituent elements described in different exemplary embodiments are able to be partially replaced and combined with each other. In the second and subsequent exemplary embodiments, a description of matters common to the first exemplary embodiment will be omitted and only different points are described. In particular, the same functions and effects by the same configuration will not be described one by one for each exemplary embodiment.

First Exemplary Embodiment

FIG. 1 is a perspective view of an RFIC module according to a first exemplary embodiment of the present invention. As shown, this RFIC module 101 includes a first planar conductor 10, a second planar conductor 20, an RFIC 40, an inductor 41, and a capacitor 42. In FIG. 1, the RFIC module 101 includes an insulating base material 1 of a rectangular parallelepiped shape, and the first planar conductor 10 is provided on a first principal surface MS1 of the insulating base material 1. The second planar conductor 20 is provided on a second principal surface MS2 of the insulating base material 1. In other words, the first planar conductor 10 and the second planar conductor 20 face in parallel to each other.

Moreover, electrodes 11, 12, and 13 are provided on the first principal surface MS1 of the insulating base material 1. The electrode 11 is connected to the second planar conductor 20 through a first via conductor 31. The electrode 12 is connected to the second planar conductor 20 through a second via conductor 32.

The insulating base material 1 is a resin base material such as a glass-epoxy substrate, for example. Each of the first planar conductor 10, the second planar conductor 20, and the electrodes 11, 12, and 13 is defined by patterned copper foil. The via conductors 31 and 32 are through hole vias provided in the insulating base material 1.

In the exemplary aspect, the RFIC 40, the inductor 41, and the capacitor 42 are all chip components, and are surface-mounted on the first principal surface MS1 of the insulating base material 1. The inductor 41 is connected between a point of the first planar conductor 10 that is adjacent to the electrode 11, and the electrode 11. In addition, the capacitor 42 is connected between a point of the first planar conductor 10 that is adjacent to the electrode 13, and the electrode 13. Furthermore, the RFIC 40 is connected between the electrode 12 and the electrode 13.

A first end T1 of the inductor 41 is connected to a first point P1 that is a portion of an outer edge of the first planar conductor 10, and a second end T2 of the inductor 41 is connected to a second point P2 that is a portion of an outer edge of the second planar conductor 20 through the electrode 11 and the first via conductor 31.

A first end T1 of the RFIC 40 is connected to a third point P3 that is a portion of the outer edge of the first planar conductor 10 through the electrode 13 and the capacitor 42, and a second end T2 of the RFIC 40 is connected to a fourth point P4 that is a portion of the outer edge of the second planar conductor 20 through the electrode 12 and the second via conductor 32.

According to an exemplary aspect, the dimensions of each portion of a width W, a depth D, and a height H of the insulating base material 1 are as follows in this example.

W: 3 mm
D: 3 mm
H: 1.2 mm

Moreover, the frequency of a communication signal that the RFIC 40 processes is 900-MHz band (860 MHz to 960 MHz). In other words, lengths of the first planar conductor 10 and the second planar conductor 20, in any direction, are one-eighth wavelength or less of the communication signal that the RFIC 40 processes. However, with a wavelength shortening effect due to the permittivity of insulating base material 1, the phrase "one-eighth wavelength or less" indicates a wavelength in consideration of this wavelength shortening effect.

In this example, the inductance of the inductor 41 is 30 nH, the equivalent series resistance (ESR) of the inductor 41 is 5.75 Ω, the capacitance of the capacitor 42 is 0.9 pF, the equivalent series resistance (ESR) of the capacitor 42 is 0.346 Ω, the output resistance of the RFIC 40 is 1.2 kΩ, and the capacitance of the RFIC 40 is 1.23 pF. It is to be noted that the inductance component of the first planar conductor 10 and the second planar conductor 20 is sufficiently smaller than the inductance of the inductor 41, and is 1 nH or less, for example.

Figure 2A:
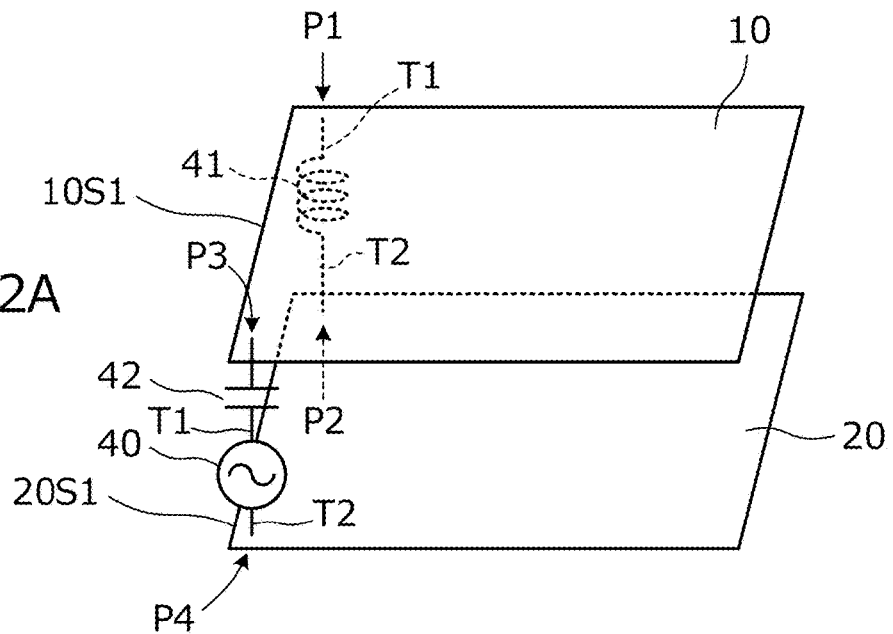
FIG. 2A is a three-dimensional circuit diagram of an RFIC module of the first exemplary embodiment of the present invention.
Figure 2B:
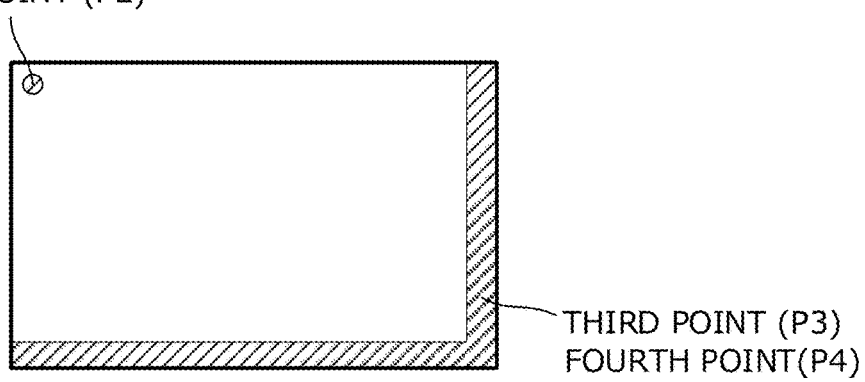
FIG. 2B is a plan view of the RFIC module 101 according to the present exemplary embodiment of the present invention.

FIG. 2A is a three-dimensional circuit diagram of the RFIC module 101 of the present exemplary embodiment. FIG. 2B is a plan view of the RFIC module 101 according to the present exemplary embodiment. Each of the first planar conductor 10 and the second planar conductor 20 has four sides, the first end T1 of the inductor 41 is connected to the first point P1 that is in the vicinity of one end of one side 10S1 of the first planar conductor 10, and the second end T2 of the inductor 41 is connected to the second point P2 that is in the vicinity of one end of one side 20S1 of the second planar conductor 20. In addition, the first end T1 of the RFIC 40 is connected to the third point P3 that is in the vicinity of the other end of the one side 10S1 of the first planar conductor 10 through the capacitor 42, and the second end T2 of the RFIC 40 is connected to the fourth point P4 that is in the vicinity of the other end of the one side 20S1 of the second planar conductor 20.

Although, in the example shown in FIG. 2A, the first point P1 and the second point P2 are disposed in the vicinity of the one end of the side 10S1 of the first planar conductor 10, and in the vicinity of the one end of the side 20S1 of the second planar conductor 20, and the third point P3 and the fourth point P4 are disposed in the vicinity of the other end of the side 10S1 of the first planar conductor 10, and in the vicinity of the other end of the side 20S1 of the second planar conductor 20, the third point P3 and the fourth point P4 may be disposed at other points. For example, in FIG. 2B, a hatched area indicates a position in which the third point P3 and the fourth point P4 may be disposed. As shown in FIG. 2B, the first point P1 is a portion of the outer edge of the first planar conductor 10, and the third point P3 is a point of the outer edge of the first planar conductor 10, away from the first point P1. Similarly, the second point P2 is a portion of the outer edge of the second planar conductor 20, and the fourth point P4 is a point of the outer edge of the second planar conductor 20, away from the second point P2. For purposes of this disclosure, the phrase "point of the outer edge of the first planar conductor 10, away from the first point P1" refers to a point far away from the first point P1, compared with a distance from the first point P1 to the center of gravity of the first planar conductor 10. Similarly, the "point of the outer edge of the second planar conductor 20, away from the first point P2" refers to a point far away from the second point P2, compared with a distance from the second point P2 to the center of gravity of the second planar conductor 20.

Figure 3:
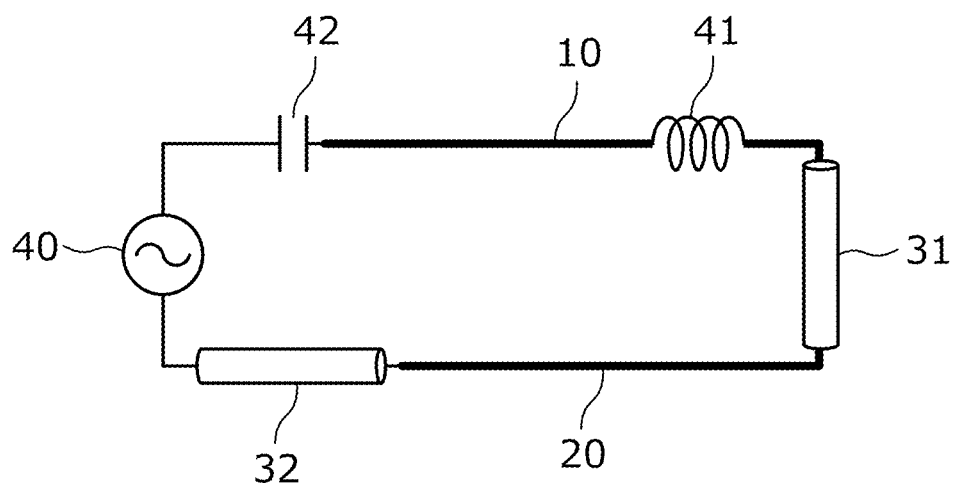
FIG. 3 is an equivalent circuit diagram of the RFIC module of the first exemplary embodiment of the present invention.

FIG. 3 is an equivalent circuit diagram of the RFIC module 101 of the present exemplary embodiment. When viewed from the RFIC 40, a current path of the capacitor 42, the first planar conductor 10, the inductor 41, the first via conductor 31, the second planar conductor 20, and the second via conductor 32, is provided. The inductor 41 and the capacitor 42 are connected into a closed loop through the RFIC 40, a series resonant circuit is constituted by inductor 41 and capacitor 42. The resonance frequency of this resonant circuit is a frequency that matches the frequency of a communication frequency band or is a frequency in the vicinity of the communication frequency band. It is to be noted that, although a stray capacitance is generated between the first planar conductor 10 and the second planar conductor 20, this stray capacitance has almost no effect at the resonance frequency.

Figure 4:
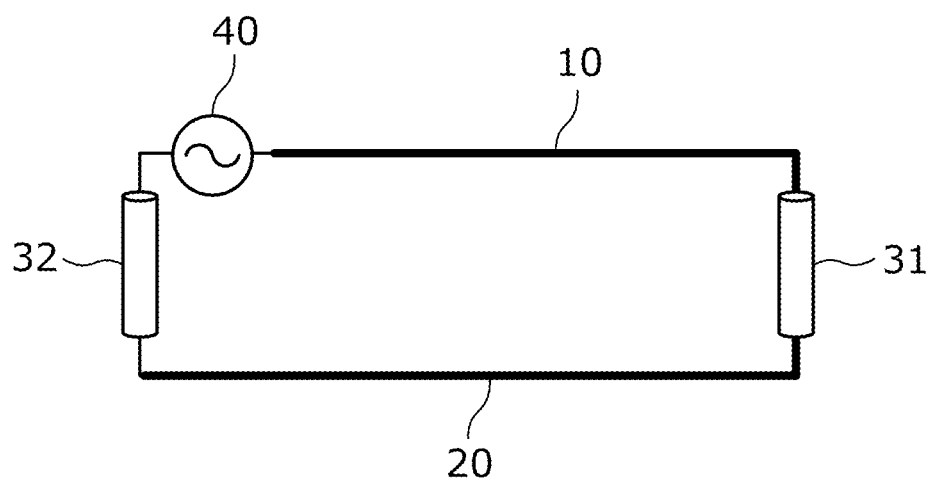
FIG. 4 is a circuit diagram without an inductor and a capacitor shown in FIG. 3.
Figure 5:
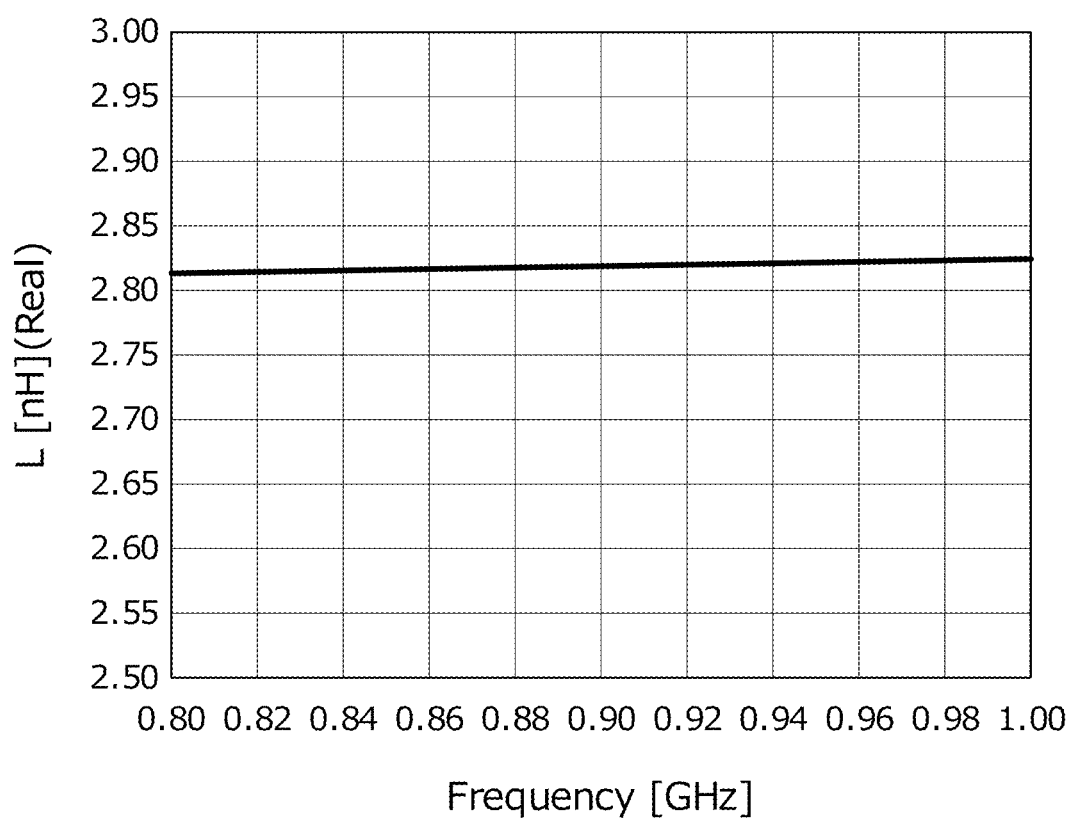
FIG. 5 is a diagram showing frequency characteristics of an inductance component of a first planar conductor, a second planar conductor, a first via conductor, and a second via conductor, viewed from an RFIC in FIG. 4.

FIG. 4 is a circuit diagram without an inductor 41 and a capacitor 42 shown in FIG. 3. FIG. 5 is a diagram showing frequency characteristics of an inductance component of a first planar conductor 10, a second planar conductor 20, a first via conductor 31, and a second via conductor 32, viewed from an RFIC 40 in FIG. 4. In this example, the inductance component of the first planar conductor 10, the second planar conductor 20, the first via conductor 31, and the second via conductor 32 is about 2.82 nH. Accordingly, the inductance (30 nH) of the inductor 41 is more than twice the inductance component of the first planar conductor 10, the second planar conductor 20, the first via conductor 31, and the second via conductor 32. Therefore, more than half of the current to be inputted from and outputted to the RFIC 40 is confined by the inductor 41, so that the gradient of the current density distribution on the first planar conductor 10 and the second planar conductor 20 becomes low. In other words, an almost uniform voltage is distributed over the first planar conductor 10 and the second planar conductor 20. In addition, the inductor 41 confines more than half of the current, even when the lengths of the first planar conductor 10 and the second planar conductor 20 are one-eighth wavelength or less, the phases of the voltage to be applied to the first planar conductor 10 and the second planar conductor 20 are substantially inverted to each other.

Figure 12:
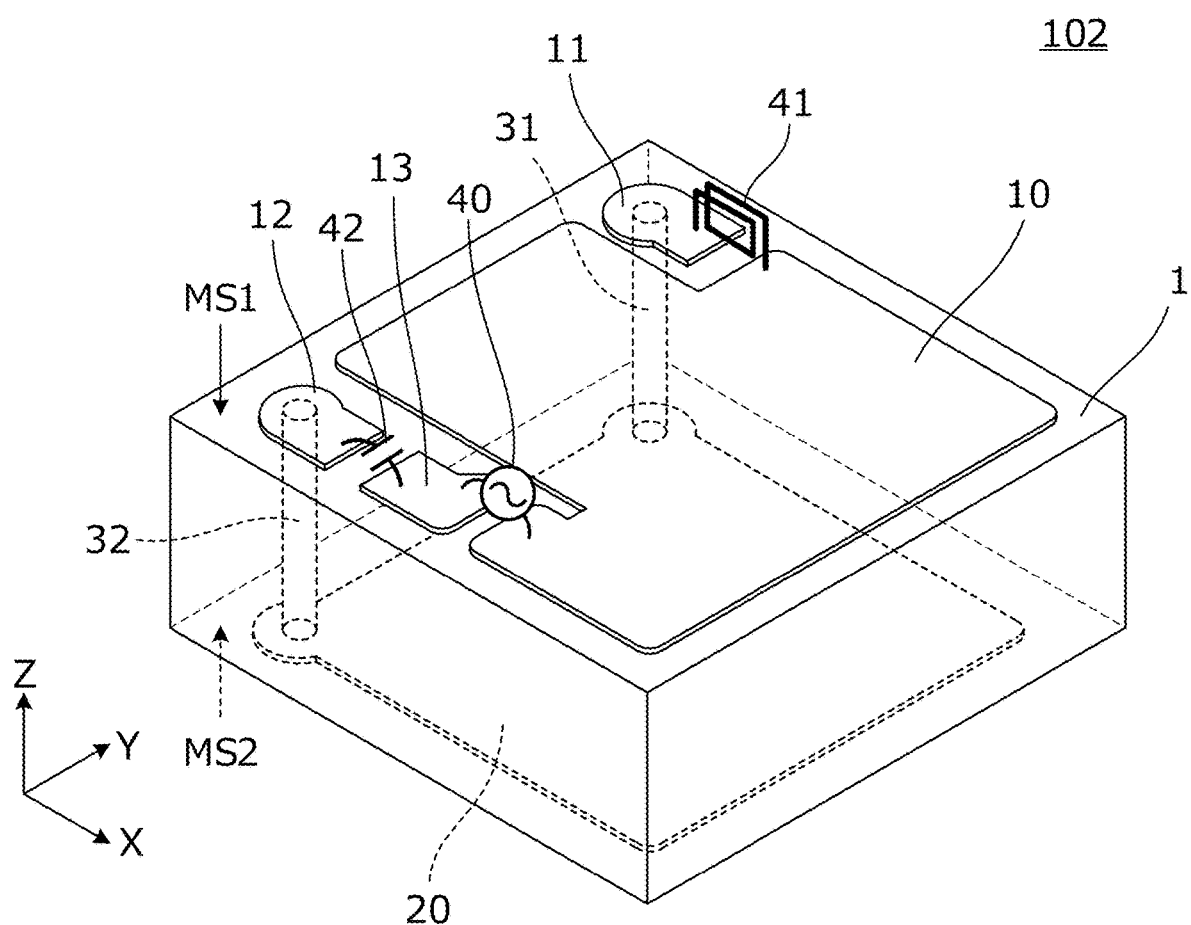
FIG. 12 is a perspective view of an RFIC module according to a second exemplary embodiment of the present invention.
Figure 54:
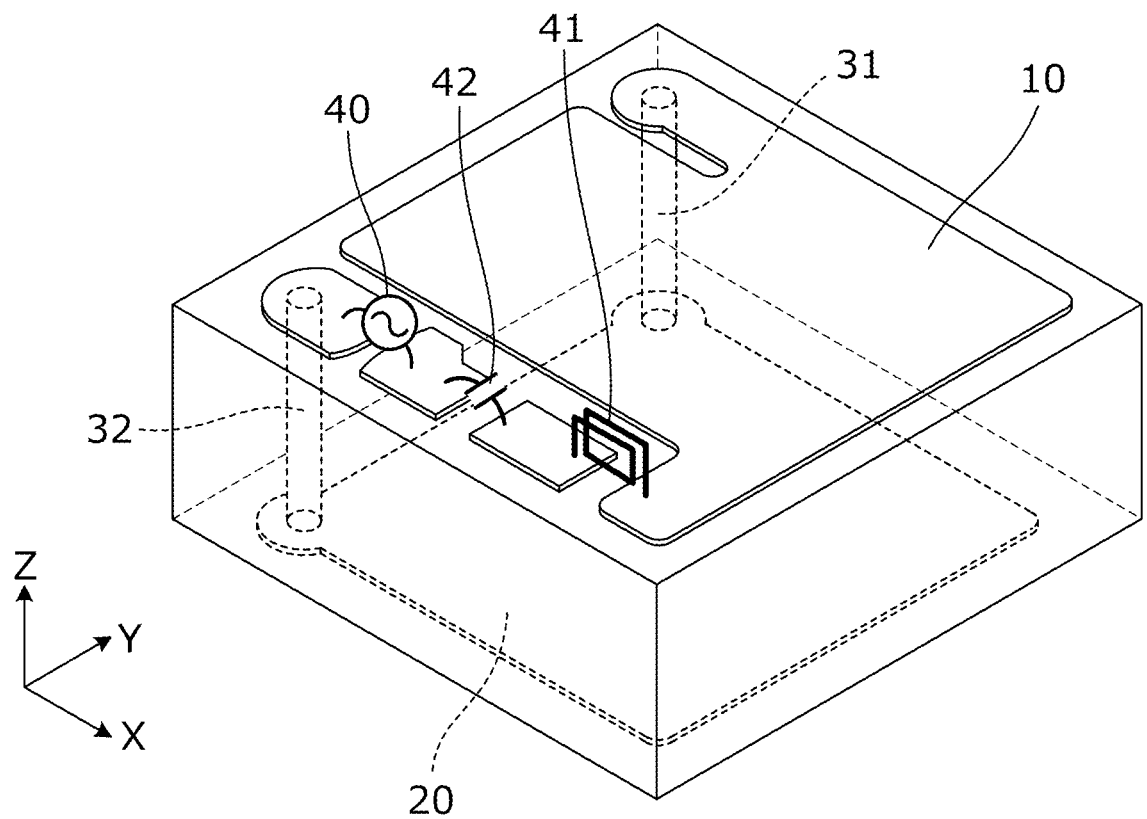
FIG. 54 is a perspective view of an RFIC module as a comparative example to the RFIC module shown in FIG. 1.
Figure 55:
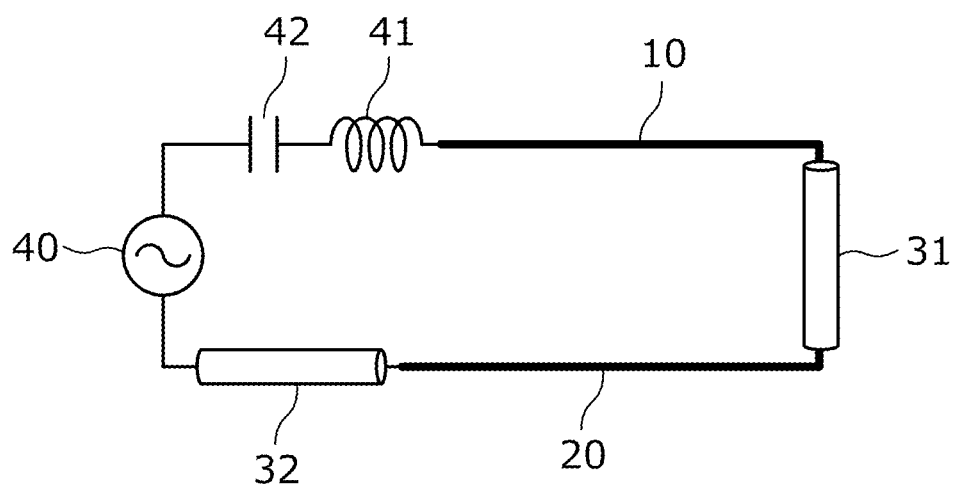
FIG. 55 is an equivalent circuit diagram of the RFIC module shown in FIG. 54.

Hereinafter, an RFIC module as a comparative example is shown. FIG. 54 is a perspective view of an RFIC module as a comparative example to the RFIC module 101 shown in FIG. 1. However, the RFIC 40, the inductor 41, and the capacitor 42 are represented by a conceptual symbol. FIG. 55 is an equivalent circuit diagram of the RFIC module shown in FIG. 54. In this example, the distance between the inductor 41 and the RFIC 40 is smaller than the distance between the inductor 41 and the first via conductor 31. In such a structure, a portion of the first planar conductor 10 and a portion of the second planar conductor 20 are structured to be directly connected through the first via conductor 31, so that the voltage phase of the first planar conductor 10 and the voltage phase of the second planar conductor 20 are not inverted to each other. Accordingly, as shown in FIG. 12 or FIG. 1, the distance between the inductor 41 and the RFIC 40 is preferably larger than the distance between the inductor 41 and the first via conductor 31.

It is noted that capacitor 42 is not essential according to the exemplary embodiment. However, as the area of the first planar conductor 10 and the second planar conductor 20 is reduced, the radiation resistance is reduced, so that it becomes difficult to couple the first planar conductor 10 and the second planar conductor 20 to the RFIC 40. In other words, it becomes difficult to supply electric power to the RFIC 40. Therefore, it is effective to perform impedance matching of the inductor 41, the first planar conductor 10 and the second planar conductor 20, and the RFIC 40, by the connection of the RFIC 40 through the capacitor 42. In addition, in order that the voltage phase of the first planar conductor 10 and the voltage phase of the second planar conductor 20 are inverted to each other, the distance between the inductor 41 and the capacitor 42 is preferably larger than the distance between the inductor 41 and the first via conductor 31.

Figure 6:
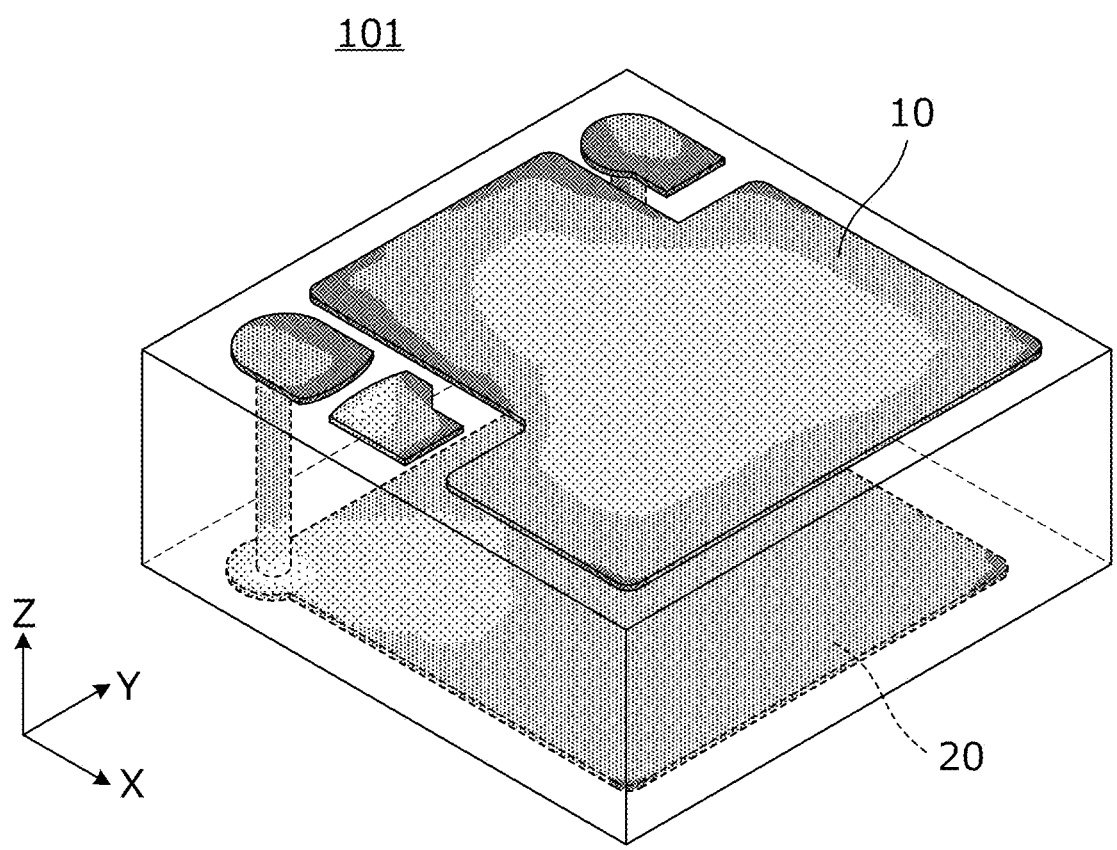
FIG. 6 is a view showing an intensity distribution of voltage generated in the first planar conductor and the second planar conductor of the RFIC module.

FIG. 6 is a view showing an intensity distribution of voltage generated in the first planar conductor 10 and the second planar conductor 20 of the RFIC module 101. In FIG. 6, as the concentration is increased, the voltage is increased. In FIG. 6, although the same voltage is distributed over a portion along the four sides of the first planar conductor 10 and substantially the entirety of the second planar conductor 20, the polarities are inverted to each other.

Figure 7:
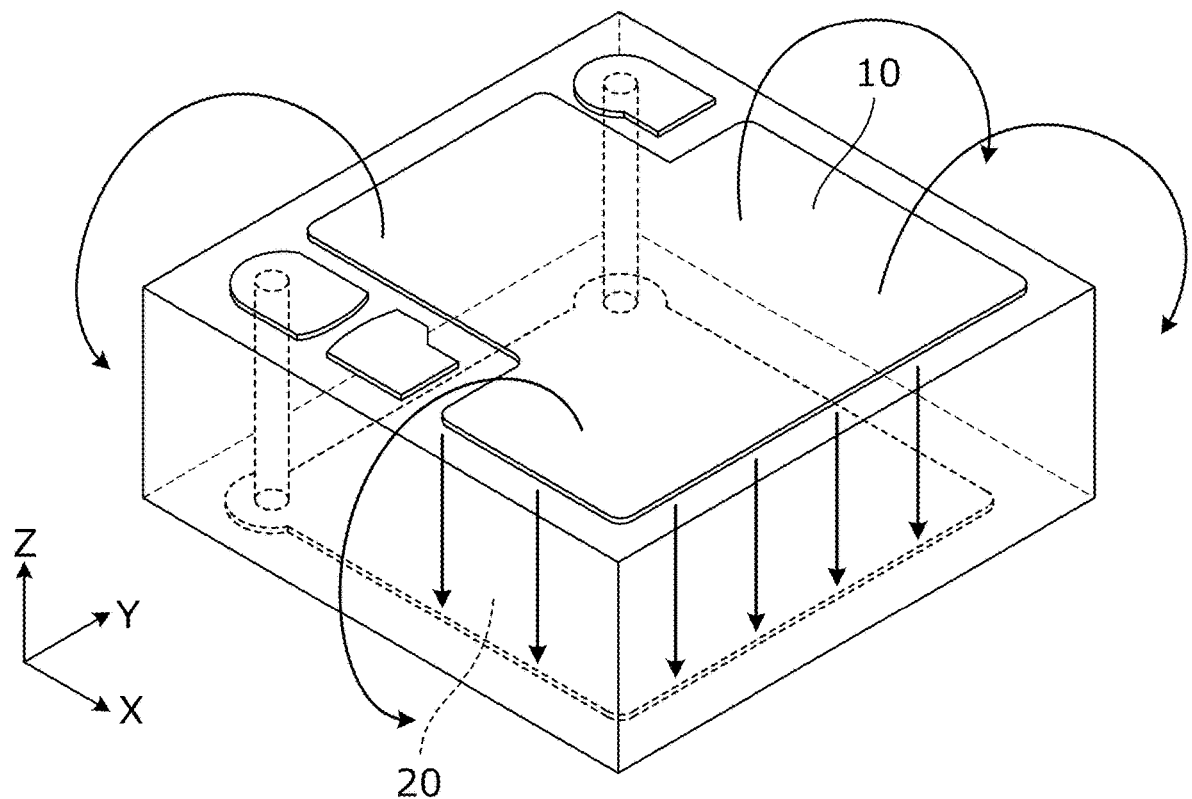
FIG. 7 is a perspective view showing a state of an electric field generated between the first planar conductor and the second planar conductor of the RFIC module.

FIG. 7 is a perspective view showing a state of an electric field generated between the first planar conductor 10 and the second planar conductor 20 of the RFIC module 101. In FIG. 7, the line with an arrowhead schematically indicates a line of electric force. In this manner, a potential difference between a peripheral end of the first planar conductor 10 and a peripheral end of the second planar conductor 20 is large, and an electric field extends outside a position in which the peripheral end of the first planar conductor 10 and the peripheral end of the second planar conductor 20 face each other.

Figure 52:
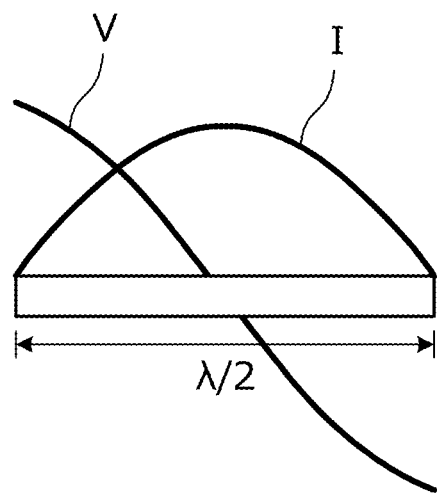
FIG. 52 is a concept diagram showing a current density distribution and a voltage intensity distribution of a radiation plate with a width or length of a half wavelength of a resonance frequency.

Hereinafter, a configuration for causing electromagnetic waves to be efficiently emitted from a radiation plate will be described. FIG. 52 is a concept diagram showing a current density distribution and a voltage intensity distribution of a radiation plate with a width or length of a half wavelength of a resonance frequency. As shown in FIG. 52, in the radiation plate having a half wavelength of the resonance frequency, the current density distribution I with no current at an open end and the maximum current at the center is generated. Similarly, a voltage intensity distribution V with the maximum voltage at the open end and no voltage at the center is generated.

Figure 53A:
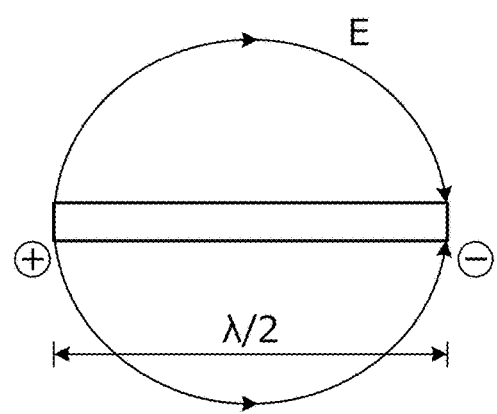
FIG. 53A and FIG. 53B are concept diagrams showing a line of electric force that exits from a vicinity of one end of a radiation plate and enters a vicinity of the other end of the radiation plate.
Figure 53B:
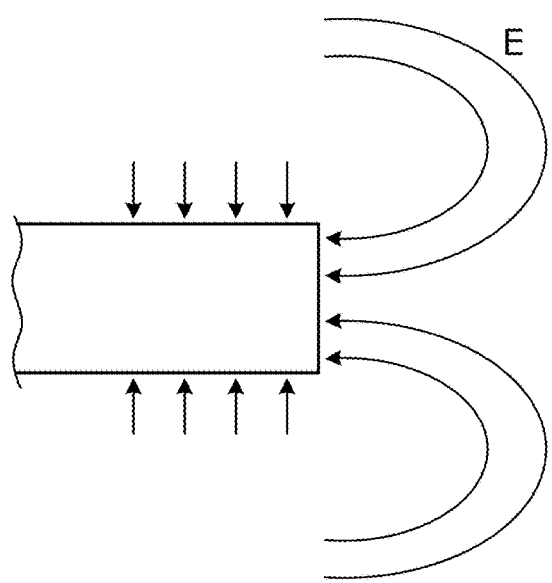

FIG. 53A and FIG. 53B are concept diagrams showing a line of electric force that exits from a vicinity of one end of a radiation plate and enters a vicinity of the other end of the radiation plate. FIG. 53B is an enlarged diagram in the vicinity of a right end in FIG. 53A.

In this manner, when the RFIC module 101 described in the present exemplary embodiment is disposed at the open end or in the vicinity of the open end of the radiation plate of which the resonance voltage is at the maximum, the line E of electric force efficiently enters and exits the open end of the radiation plate. Accordingly, when the RFIC module 101 described in the exemplary embodiment is disposed in the vicinity of the open end of the radiation plate, the RFIC module 101 is electric-field coupled to the radiation plate. More specifically, the radiation plate and the second planar conductor 20, by being disposed to face each other, are electric-field coupled to each other. The radiation plate and the second planar conductor 20 may be fixed in a state of facing each other, through an adhesive layer or the like.

Figure 8A:
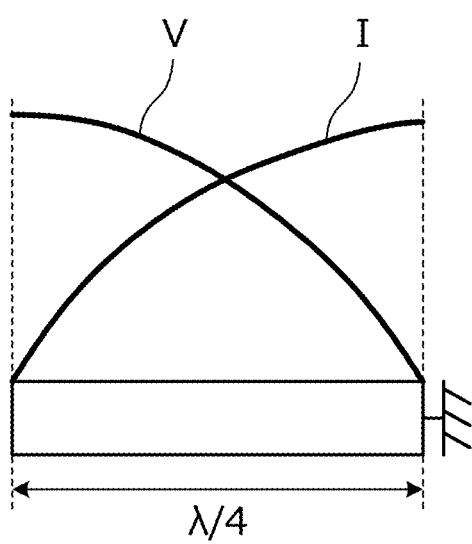
FIG. 8A is a concept diagram showing a current density distribution and a voltage intensity distribution of a radiation plate with a width or length of a quarter wavelength of a resonance frequency.
Figure 8B:
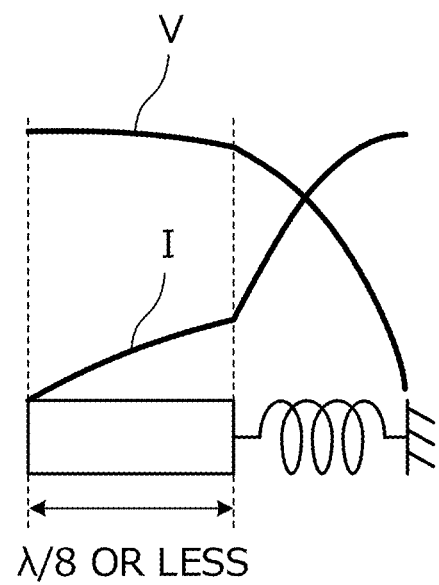
FIG. 8B is a concept diagram showing a current density distribution and a voltage intensity distribution of a radiating element in which one end of a radiation plate with a width or length of one-eighth wavelength or less of a resonance frequency is grounded through an inductor.

FIG. 8A is a concept diagram showing a current density distribution and a voltage intensity distribution of a radiation plate with a width or length of a quarter wavelength of a resonance frequency. FIG. 8B is a concept diagram showing a current density distribution and a voltage intensity distribution of a radiating element in which one end of a radiation plate with a width or length of one-eighth wavelength or less of a resonance frequency is grounded through an inductor.

As shown in FIG. 8A, in the radiation plate having a quarter wavelength of the resonance frequency, the current density distribution I with the maximum current at a ground end and no current at an open end is generated. Similarly, the voltage intensity distribution V with no current at the ground end and the maximum voltage at the open end is generated.

In the example shown in FIG. 8B, the width or length of the radiation plate is one-eighth wavelength or less, and one end is grounded through the inductor, so that a confinement ratio of current by the inductor is sufficiently large, and the gradient of the voltage intensity distribution V of the radiation plate is sufficiently low.

Figure 9A:
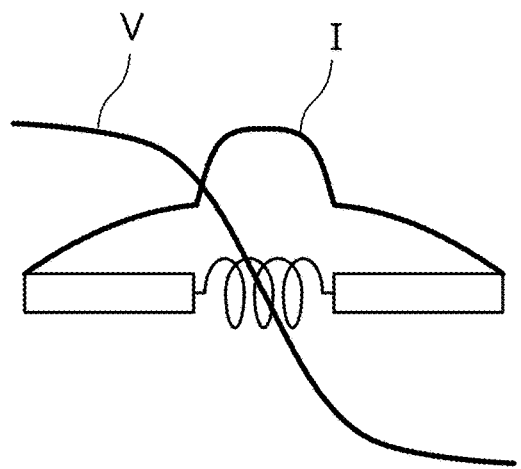
FIG. 9A is a view showing a current density distribution and a voltage intensity distribution of a radiation plate obtained by changing the radiation plate shown in FIG. 8B into a both-end open type radiation plate.
Figure 9B:
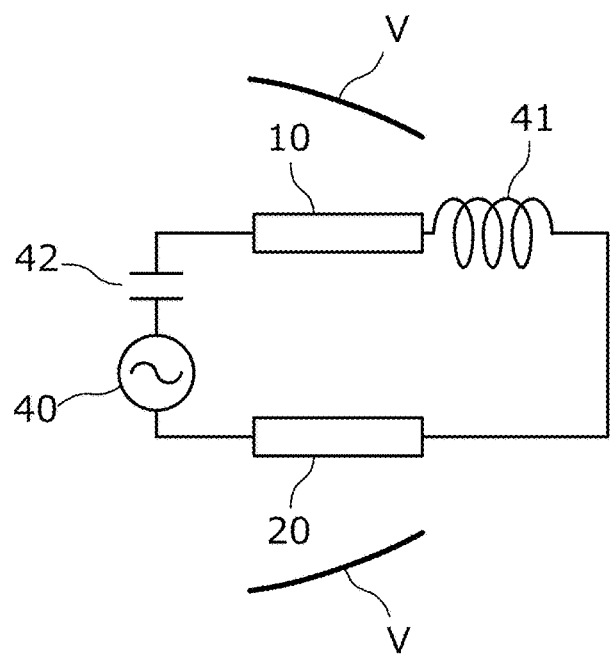
FIG. 9B is a view showing that the two radiation plates shown in FIG. 9A are configured by the first planar conductor and the second planar conductor and both are disposed so as to face each other.
Figure 9C:
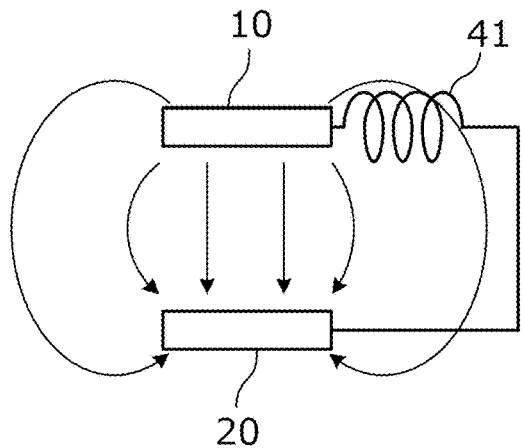
FIG. 9C is a view showing an electric field generated between the first planar conductor and the second planar conductor by a line of electric force.

FIG. 9A is a view showing a current density distribution and a voltage intensity distribution of a radiation plate obtained by changing the radiation plate shown in FIG. 8B into a both-end open type radiation plate. FIG. 9B is a view showing that the two radiation plates shown in FIG. 9A are configured by the first planar conductor 10 and the second planar conductor 20 and both are disposed so as to face each other. In this FIG. 9B, the RFIC 40 and the capacitor 42 are also illustrated. FIG. 9C is a view showing an electric field generated between the first planar conductor 10 and the second planar conductor 20 by a line of electric force.

As shown in FIG. 9A, even when the width or length obtained by combining two radiation plates is shorter than a half wavelength of the resonance frequency, the voltage of which the phases are inverted to each other is generated in the two radiation plates. As shown in FIG. 9B, an almost uniform electric field is distributed between the first planar conductor 10 and the second planar conductor 20, and the phases of a voltage applied to the first planar conductor 10 and the second planar conductor 20 are inverted to each other. As a result, as shown in FIG. 9C, an electric field is substantially uniformly distributed between the first planar conductor 10 and the second planar conductor 20, and the electric field extends outside a position in which the peripheral end of the first planar conductor 10 and the peripheral end of the second planar conductor 20 face each other. The same has already been shown in FIG. 7. It is noted that the term "substantially uniform" takes into account minor differences in electric field distribution that may arise from manufacturing variances, for example.

Figure 10:
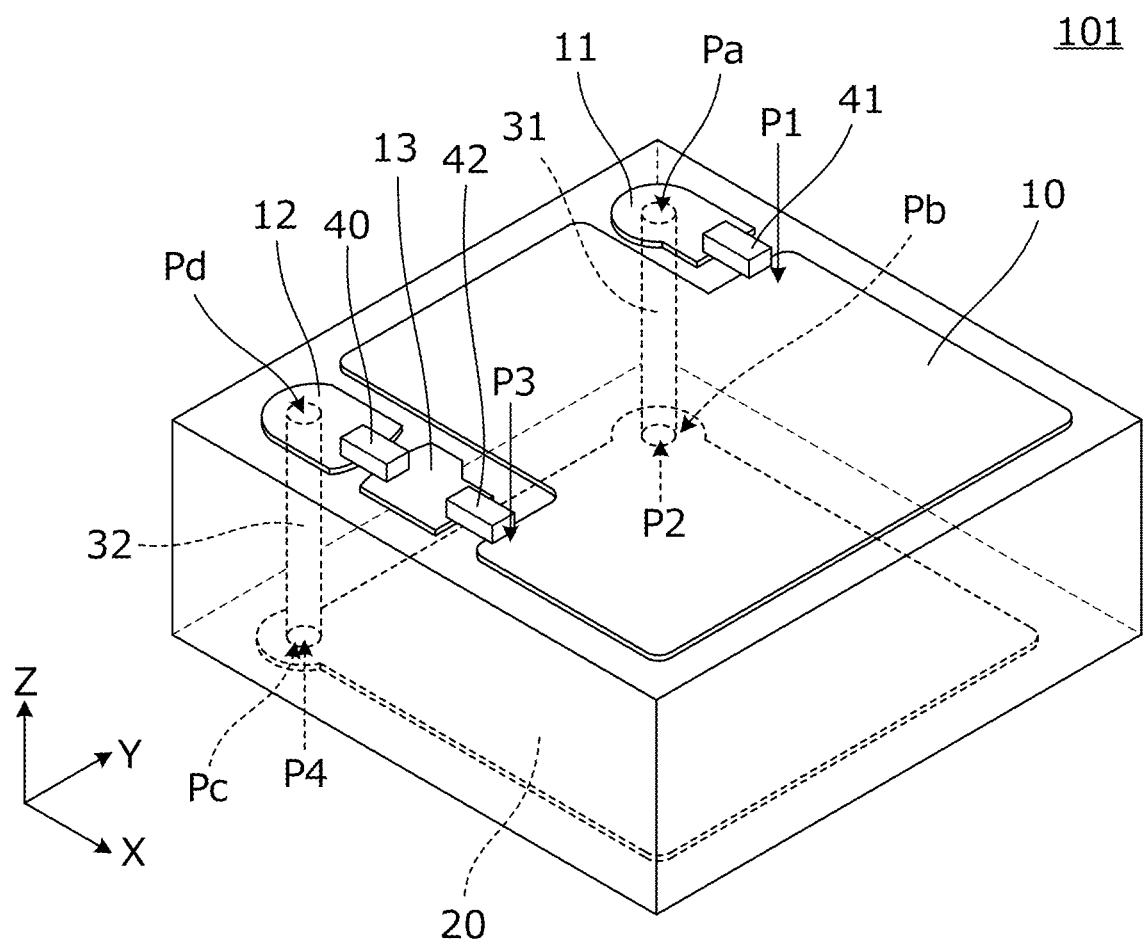
FIG. 10 is a perspective view of the RFIC module.
Figure 11:
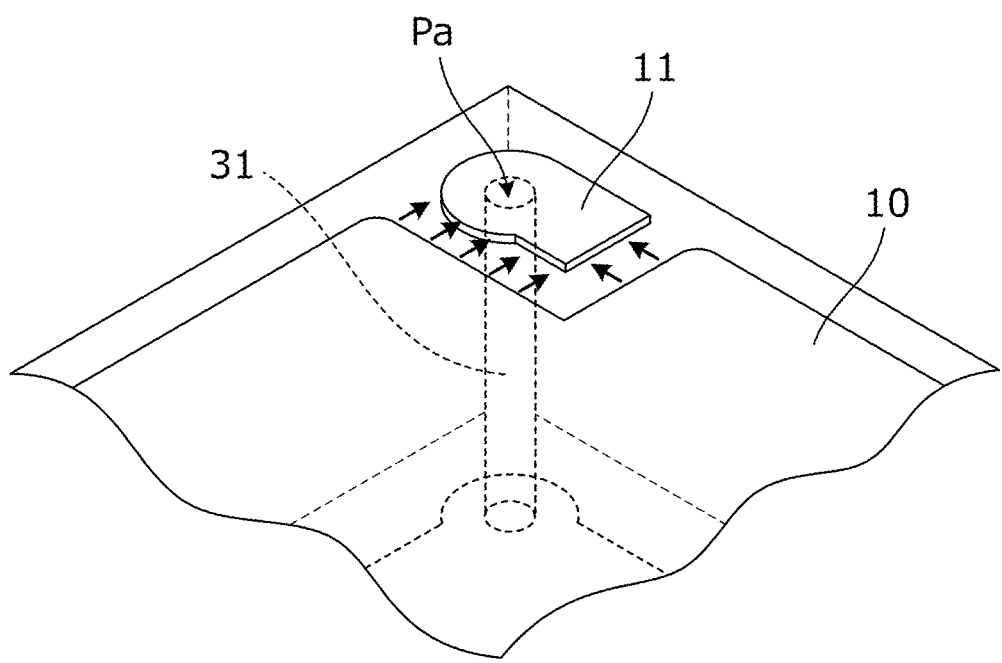
FIG. 11 is a view illustrating a relationship with a structure for connecting an inductor between the first planar conductor and the second planar conductor, and electric field emission.

FIG. 10 and FIG. 11 are views illustrating a relationship between a structure for connecting an inductor between the first planar conductor 10 and the second planar conductor 20, and electric field emission.

FIG. 10 is a perspective view of the RFIC module 101. FIG. 11 is a partial perspective view of FIG. 10. In FIG. 11, the inductor 41 is not illustrated.

In FIG. 10, the first via conductor 31 is connected to the second planar conductor 20, so that both ends Pa and Pb of the first via conductor 31 are at substantially the same potential as the second planar conductor 20. In addition, the second via conductor 32 is connected to the second planar conductor 20, so that both ends Pc and Pd of the second via conductor 32 are at substantially the same potential as the second planar conductor 20.

In FIG. 11, the arrow indicates an electric field to be generated between the first planar conductor 10 and the electrode 11. In this manner, an electric field is generated in points at which the voltage phases are inverted to each other, and, when the points are adjacent to each other, the electric field is confined and is hard to be radiated. However, when the distance between the points at which the voltage phases are inverted to each other is large, the length of the peripheral end of the first planar conductor 10 becomes shorter, so that field emission capability is reduced. In the present exemplary embodiment, a single via conductor (i.e., the first via conductor 31) as a path for connecting the inductor 41 is provided between the first planar conductor 10 and the second planar conductor 20, the area of the electrode 11 is at the minimum, and the length of the peripheral end of the first planar conductor 10 is sufficiently secured. As a result, while being small, the RFIC module with high field emission from the peripheral end of the first planar conductor 10 and the second planar conductor 20 is able to be obtained. In addition, the area of the first planar conductor 10 is able to be sufficiently increased, the field emission from the peripheral end of the first planar conductor 10 and the second planar conductor 20 is able to be increased.

In the RFIC module 101 according to the present exemplary embodiment, a line that connects the second point P2 and the fourth point P4 that are shown in FIG. 1 and a line that connects the first point P1 and the third point P3 that are shown in FIG. 1 are parallel to each other. Moreover, in a plan view of the first planar conductor 10 and the second planar conductor 20, the two lines overlap with each other. It is to be noted that, in the structure shown in FIG. 1, the two lines are not completely overlapped but are substantially overlapped. In the conceptual view showing in FIG. 2A, a line that connects the second point P2 and the fourth point P4, and a line that connects the first point P1 and the third point P3 are parallel to each other, and, in the plan view of the first planar conductor 10 and the second planar conductor 20, the two lines overlap with each other. According to such a structure, a directivity in which a directivity direction is oriented (does not incline) in a plane direction in parallel to the first planar conductor 10 and the second planar conductor 20 is provided.

In a case in which the RFIC module 101 is provided on a conductive element to cause the conductive element to act as a radiating element, the second planar conductor 20 may be attached to the conductive element. The second planar conductor 20 can be electrically connected in a direct-current manner to the conductive element or may be attached to the conductive element through an insulator layer (e.g., a dielectric layer).

Second Exemplary Embodiment

A second exemplary embodiment of the present invention provides an example of an RFIC module that is different in a connection positional relationship of the RFIC 40 and the capacitor 42 from the connection positional relationship of the RFIC module described in the first exemplary embodiment of the present invention.

FIG. 12 is a perspective view of an RFIC module 102 according to the second exemplary embodiment of the present invention. This RFIC module 102 includes a first planar conductor 10, a second planar conductor 20, an RFIC 40, an inductor 41, and a capacitor 42. In FIG. 12, the RFIC module 102 includes an insulating base material 1 of a rectangular parallelepiped shape, and the first planar conductor 10 is provided on a first principal surface MS1 of the insulating base material 1. The second planar conductor 20 is provided on a second principal surface MS2 of the insulating base material 1.

Electrodes 11, 12, and 13 are provided on the first principal surface MS1 of the insulating base material 1. The electrode 11 is connected to the second planar conductor 20 through a first via conductor 31. The electrode 12 is connected to the second planar conductor 20 through a second via conductor 32.

The inductor 41 is connected between a point of the first planar conductor 10 that is adjacent to the electrode 11, and the electrode 11. In addition, the RFIC 40 is connected between a point of the first planar conductor 10 that is adjacent to the electrode 13, and the electrode 13. Furthermore, the capacitor 42 is connected between the electrode 12 and the electrode 13. It is to be noted that the RFIC 40, the inductor 41, and the capacitor 42 are represented by conceptual symbols.

Figure 13:
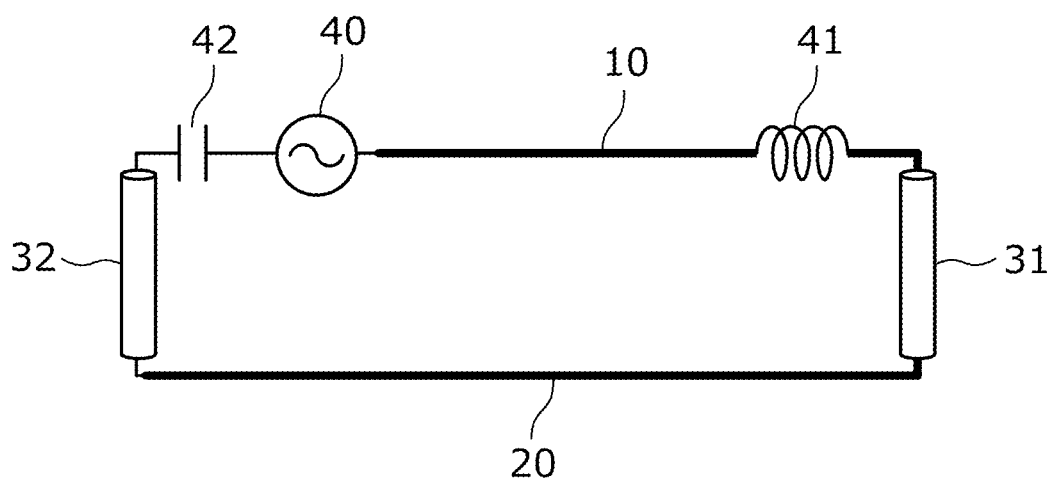
FIG. 13 is an equivalent circuit diagram of the RFIC module shown in FIG. 12.

FIG. 13 is an equivalent circuit diagram of the RFIC module 102 shown in FIG. 12. When viewed from the RFIC 40, a current path of the first planar conductor 10, the inductor 41, the first via conductor 31, the second planar conductor 20, the second via conductor 32, and the capacitor 42, is provided.

Compared to the example shown in FIG. 1, only the positional relationship between the RFIC 40 and the capacitor 42 is reversed, and others are the same. Since the RFIC 40 and the capacitor 42 may be connected in series and may be connected between the first planar conductor 10 and the second planar conductor 20, the RFIC 40 and the capacitor 42 may be mounted as shown in FIG. 12.

Third Exemplary Embodiment

A third exemplary embodiment of the present invention provides an example of an RFIC module that is different in a connection positional relationship of the capacitor 42 from the connection positional relationship of the RFIC module described in the second exemplary embodiment of the present invention.

Figure 14:
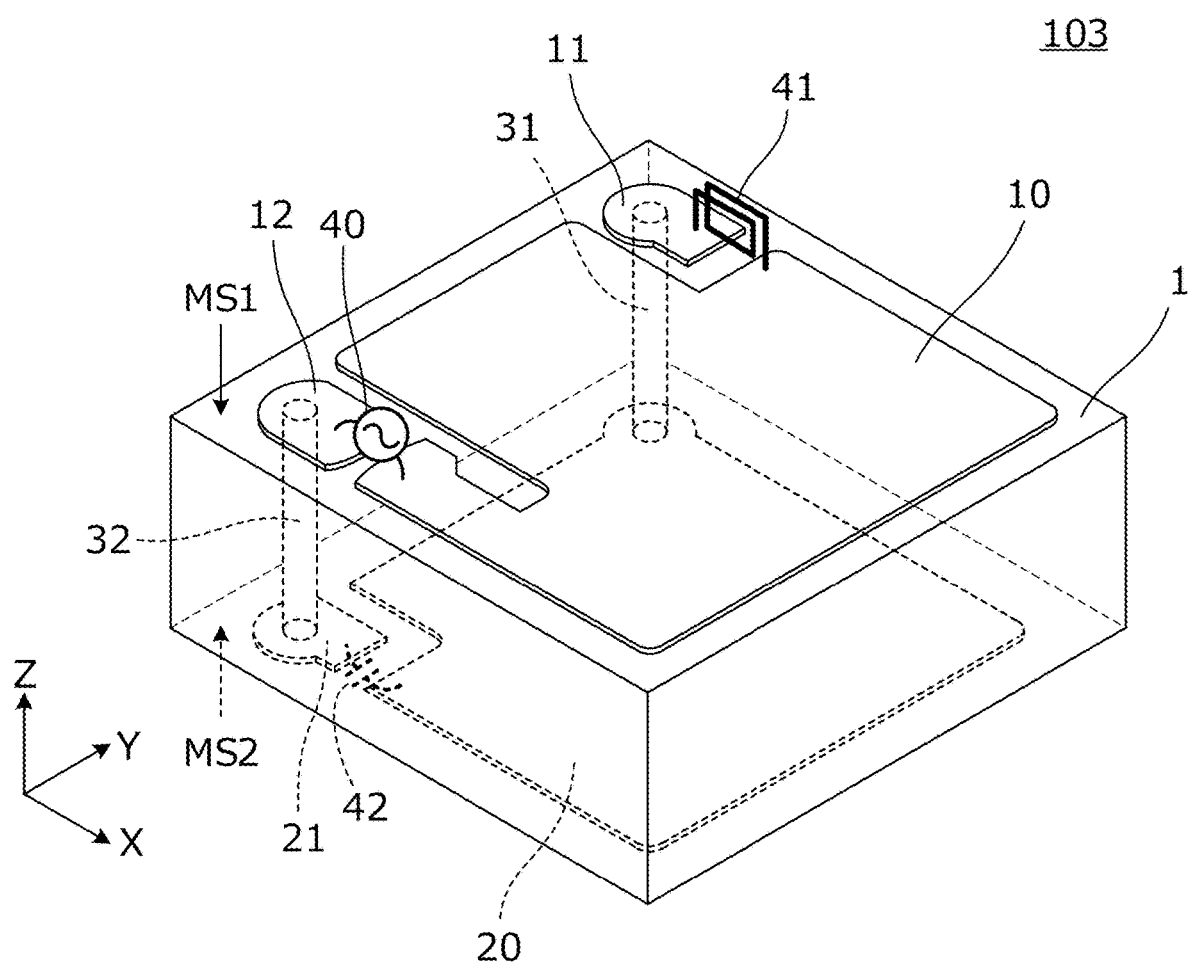
FIG. 14 is a perspective view of an RFIC module according to a third exemplary embodiment of the present invention.

FIG. 14 is a perspective view of an RFIC module 103 according to the third exemplary embodiment. This RFIC module 103 includes a first planar conductor 10, a second planar conductor 20, an RFIC 40, an inductor 41, and a capacitor 42. In FIG. 14, the RFIC module 103 includes an insulating base material 1 of a rectangular parallelepiped shape, and the first planar conductor 10 is provided on a first principal surface MS1 of the insulating base material 1. The second planar conductor 20 is provided on a second principal surface MS2 of the insulating base material 1.

Electrodes 11 and 12 are provided on the first principal surface MS1 of the insulating base material 1, and an electrode 21 is provided on the second principal surface MS2. The electrode 11 is connected to the second planar conductor 20 through a first via conductor 31. The electrode 21 is connected to the electrode 12 through a second via conductor 32.

The inductor 41 is connected between a point of the first planar conductor 10 that is adjacent to the electrode 11, and the electrode 11. In addition, the RFIC 40 is connected between a point of the first planar conductor 10 that is adjacent to the electrode 12, and the electrode 12. The capacitor 42 is connected between a point of the second planar conductor 20 that is adjacent to the electrode 21, and the electrode 21. It is to be noted that the RFIC 40, the inductor 41, and the capacitor 42 are represented by conceptual symbols.

Figure 15:
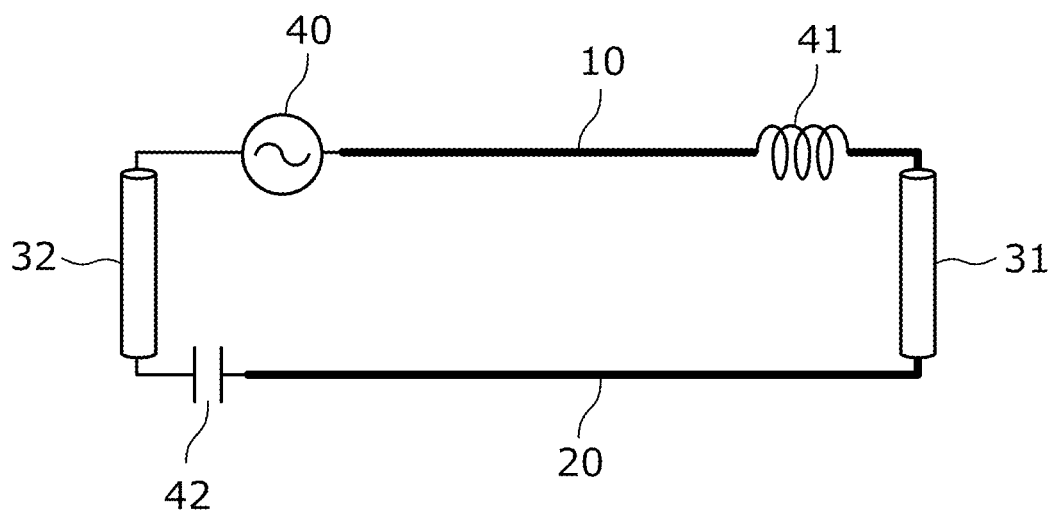
FIG. 15 is an equivalent circuit diagram of the RFIC module shown in FIG. 14.

FIG. 15 is an equivalent circuit diagram of the RFIC module 103 shown in FIG. 14. When viewed from the RFIC 40, a current path of the first planar conductor 10, the inductor 41, the first via conductor 31, the second planar conductor 20, the capacitor 42, and the second via conductor 32, is provided.

As shown in FIG. 14, the capacitor 42 may be mounted on the second principal surface MS2 on which the second planar conductor 20 is provided. Similarly, the RFIC 40 may be mounted on the second principal surface MS2 on which the second planar conductor 20 is provided.

Figure 56:
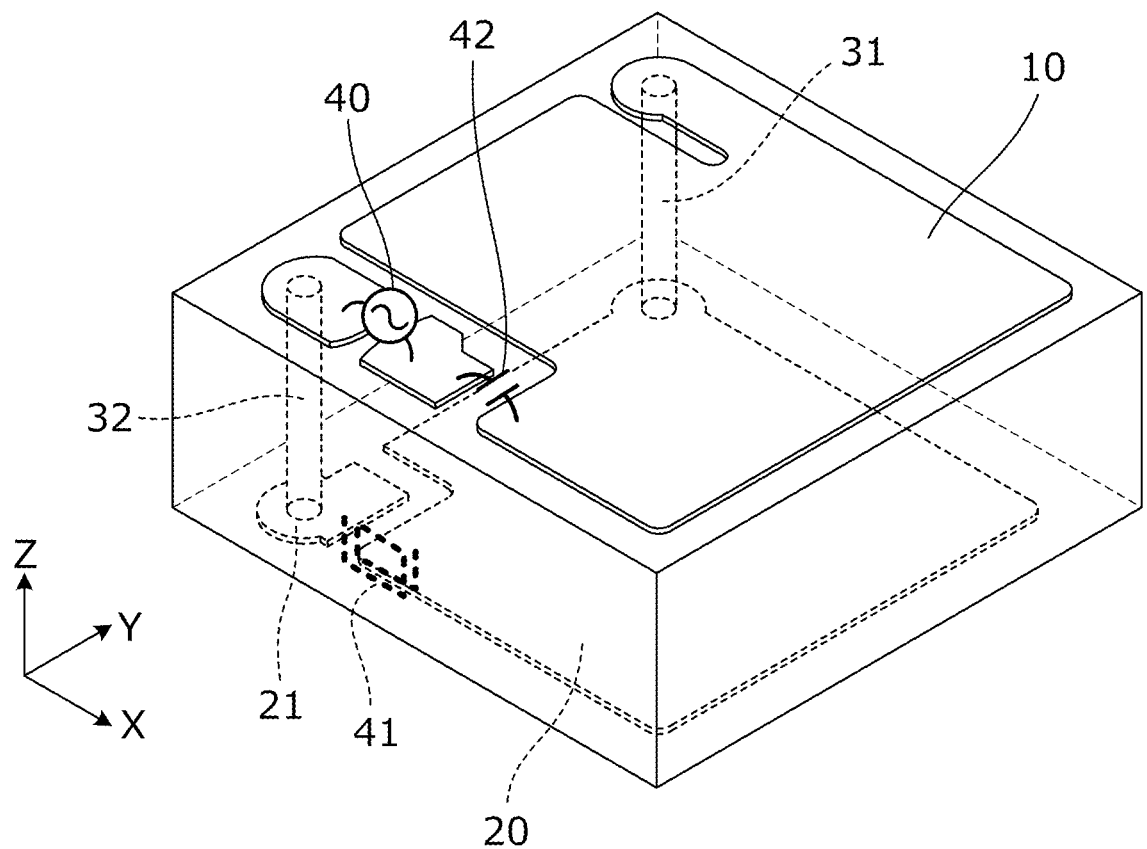
FIG. 56 is a perspective view of an RFIC module as a comparative example to the RFIC module shown in FIG. 14.
Figure 57:
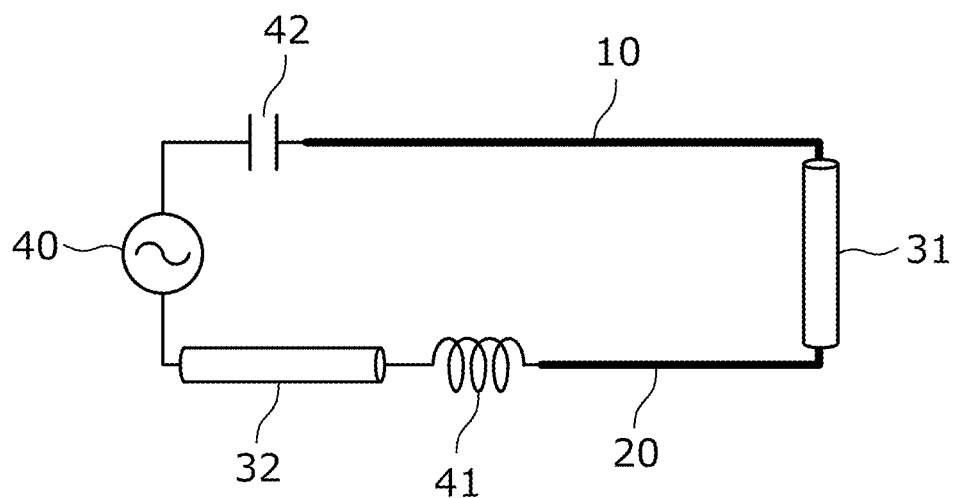
FIG. 57 is an equivalent circuit diagram of the RFIC module shown in FIG. 56.

Hereinafter, an RFIC module as a comparative example is shown. FIG. 56 is a perspective view of an RFIC module as a comparative example to the RFIC module 103 shown in FIG. 14. FIG. 57 is an equivalent circuit diagram of the RFIC module shown in FIG. 56. In this example, the distance between the inductor 41 and the RFIC 40 is smaller than the distance between the inductor 41 and the first via conductor 31. In such a structure, a portion of the first planar conductor 10 and a portion of the second planar conductor 20 are structured to be directly connected through the first via conductor 31, so that the voltage phase of the first planar conductor 10 and the voltage phase of the second planar conductor 20 are not inverted to each other. Accordingly, as shown in FIG. 14, the distance between the inductor 41 and the RFIC 40 is preferably larger than the distance between the inductor 41 and first via conductor 31.

Fourth Exemplary Embodiment

A fourth exemplary embodiment of the present invention provides an example of an RFIC module in which an element such as an inductor is disposed between the first planar conductor and the second planar conductor.

Figure 16A:
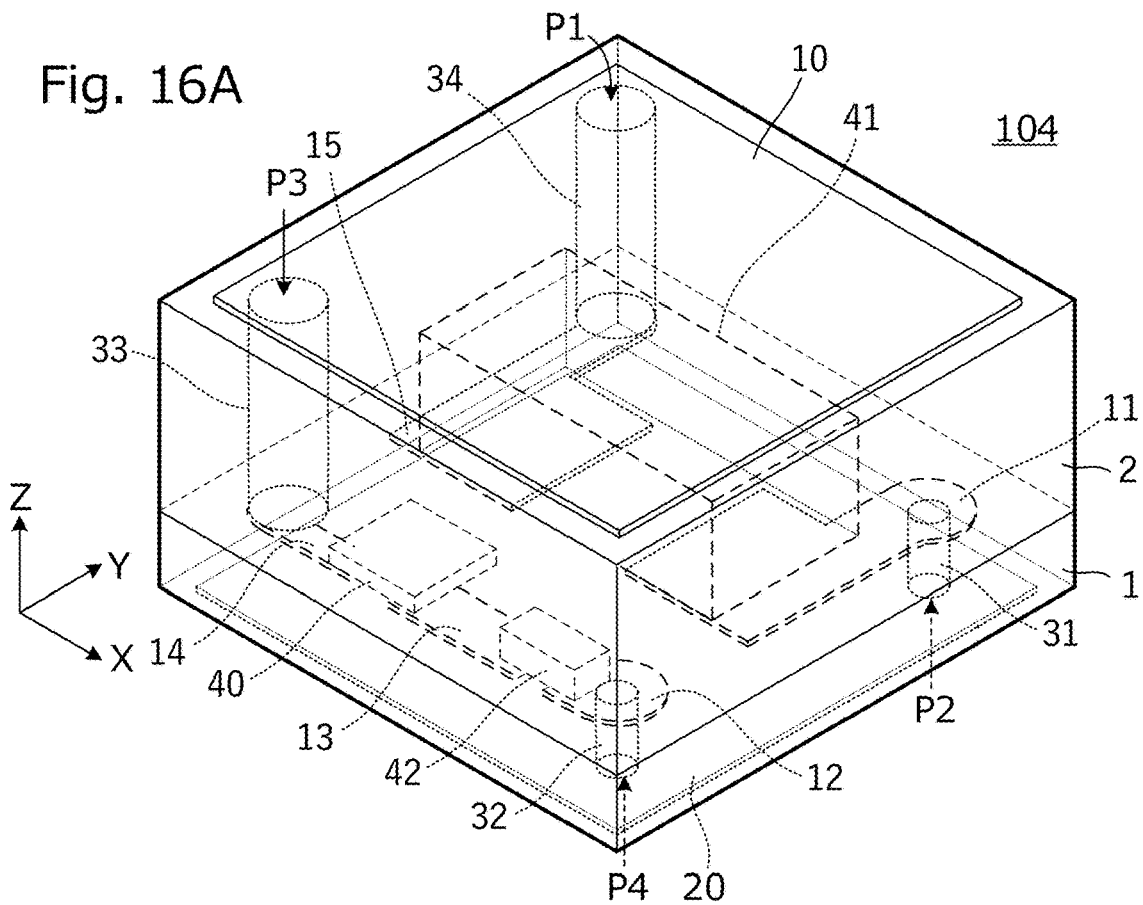
FIG. 16A is a perspective view of an RFIC module according to a fourth exemplary embodiment of the present invention.
Figure 16B:
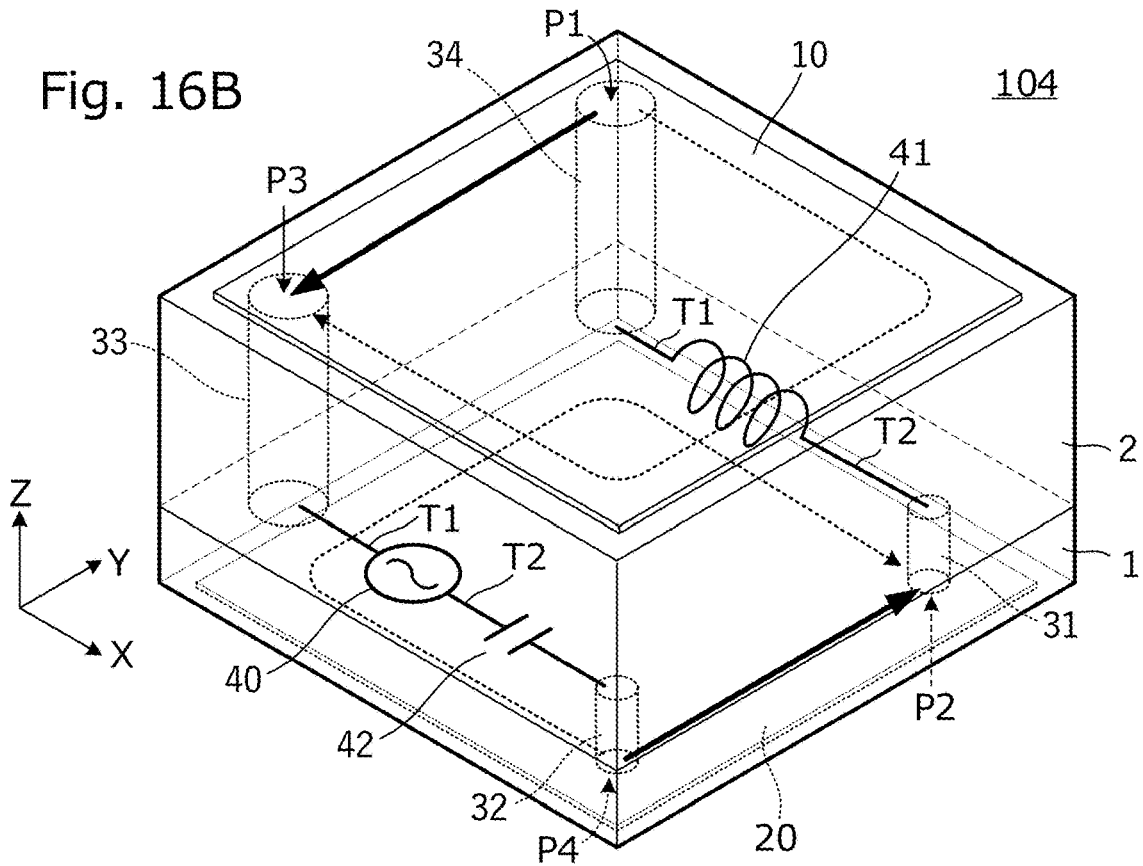
FIG. 16B is a perspective view in which each circuit element included in the RFIC module is represented by a circuit symbol.
Figure 17A:
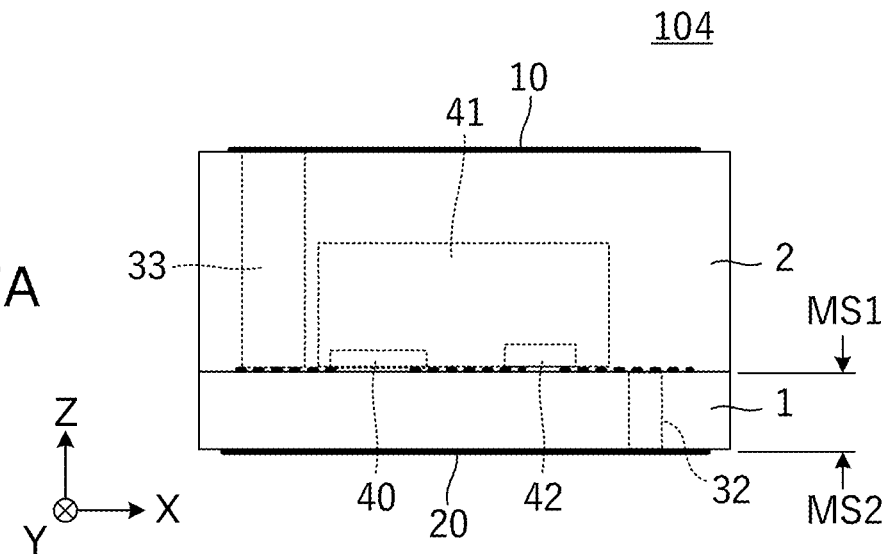
FIG. 17A and FIG. 17B are front views in a Y-axis direction in FIG. 16A.
Figure 17B:
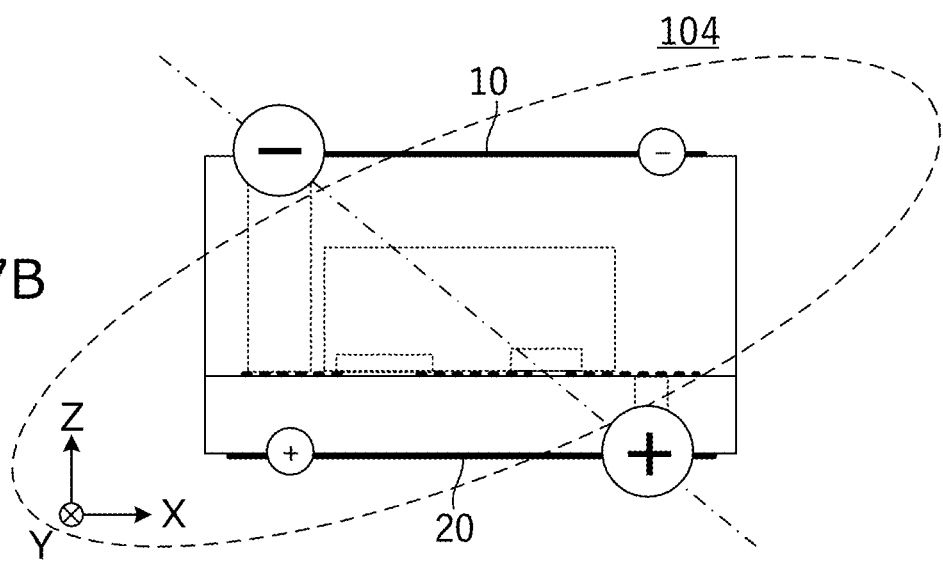

FIG. 16A is a perspective view of an RFIC module 104 according to the fourth exemplary embodiment. FIG. 16B is a perspective view in which each circuit element included in the RFIC module 104 is represented by a circuit symbol. FIG. 17A and FIG. 17B are front views in a Y-axis direction in FIG. 16A.

The RFIC module 104 includes a first planar conductor 10, a second planar conductor 20, an RFIC 40, an inductor 41, and a capacitor 42.

The RFIC module 104 includes an insulating base material 1 that includes a first principal surface (i.e., MS1 shown in FIG. 17A) and a second principal surface (i.e., MS2 shown in FIG. 17A) that are opposite to each other, and an insulator layer 2 with which the first principal surface MS1 of this insulating base material 1 is covered.

The first planar conductor 10 is provided on a surface or in the vicinity of the surface of the insulator layer 2, and the second planar conductor 20 is provided on the second principal surface MS2 of the insulating base material 1. The inductor 41 and the RFIC 40 are disposed on the first principal surface MS1 of the insulating base material 1.

Electrodes 11, 12, 13, 14, and 15 are provided on the first principal surface MS1 of the insulating base material 1. A first end T1 of the inductor 41 is connected to the electrode 15, and a second end T2 of the inductor 41 is connected to the electrode 11. A first end T1 of the RFIC 40 is connected to the electrode 14, and a second end T2 of the RFIC 40 is connected to the electrode 13. The capacitor 42 is connected to the electrode 12 and the electrode 13.

The insulating base material 1 includes a first via conductor 31 that connects the second end (i.e., T2 shown in FIG. 16B) of the inductor 41, and the second planar conductors 20, and a second via conductor 32 that connects the second end (i.e., T2 shown in FIG. 16B) of the RFIC 40, and the second planar conductors 20. The insulator layer 2 includes a fourth via conductor 34 that connects the first end T1 of the inductor 41, and the first planar conductor 10, and a third via conductor 33 that connects the first end T1 of the RFIC 40, and the first planar conductor 10.

The first end T1 of the inductor 41 is connected to a first point P1 that is a portion of an outer edge of the first planar conductor 10, and the second end T2 of the inductor 41 is connected to a second point P2 that is a portion of an outer edge of the second planar conductor 20. In addition, the first end T1 of the RFIC 40 is connected to a third point P3 that is a portion of the outer edge of the first planar conductor 10, and the second end T2 of the RFIC 40 is connected to a fourth point P4 that is a portion of the outer edge of the second planar conductor 20.

It is to be noted that term "connection" herein includes not only direct connection but also indirect connection (e.g., by electrical connection). In the example described above, the second end T2 of the RFIC 40 is connected to the second planar conductor 20 through the capacitor 42 and the second via conductor 32.

The RFIC module 104 according to the present exemplary embodiment, since the inductor 41, the RFIC 40, and the capacitor 42 are structured so as to be embedded in the insulator layer 2, has a high environmental resistance.

In the RFIC module 104 according to the present exemplary embodiment, a line that connects the second point P2 and the fourth point P4 and a line that connects the first point P1 and the third point P3 are parallel to each other, and, in the plan view of the first planar conductor 10 and the second planar conductor 20, do not overlap with each other. According to this structure, as will be described below, a gain of radiation by the first planar conductor 10 and the second planar conductor 20 is able to obtain a directivity.

In FIG. 16B, the line with an arrowhead shown along the first planar conductor 10 and the second planar conductor 20 conceptually represents a path of a current that flows in the first planar conductor 10 and the second planar conductor 20.

In FIG. 16B, the potential difference between the first point P1 and the third point P3 is large, so that, in the first planar conductor 10, the current that flows in the shortest path between the first point P1 and the third point P3 is large, and the current that flows bypassing along the edge of the first planar conductor 10 as shown by a dashed line is relatively small. Similarly, the potential difference between the second point P2 and the fourth point P4 is large, so that, in the second planar conductor 20, the current that flows in the shortest path between the second point P2 and the fourth point P4 is large, and the current that flows bypassing along the edge of the second planar conductor 20 as shown by a dashed line is relatively small.

FIG. 17B is a view conceptually showing a distribution (i.e., a distribution of electric charge) of a potential difference applied between the first planar conductor 10 and the second planar conductor 20. A circled plus sign and a circled minus sign in FIG. 17B conceptually indicate the polarity and magnitude of the electric charge (i.e., the current) on the first planar conductor 10 and the second planar conductor 20. As shown in FIG. 17B, in a front view of the RFIC module 104, large electric charges that have different polarities face each other in the oblique direction, so that a direction (a-dashed-dotted line) in which this potential difference is applied is inclined. As a result, as shown by a dashed line, a directivity direction of a radiation gain inclines from an X-Y plane.

Figure 18:
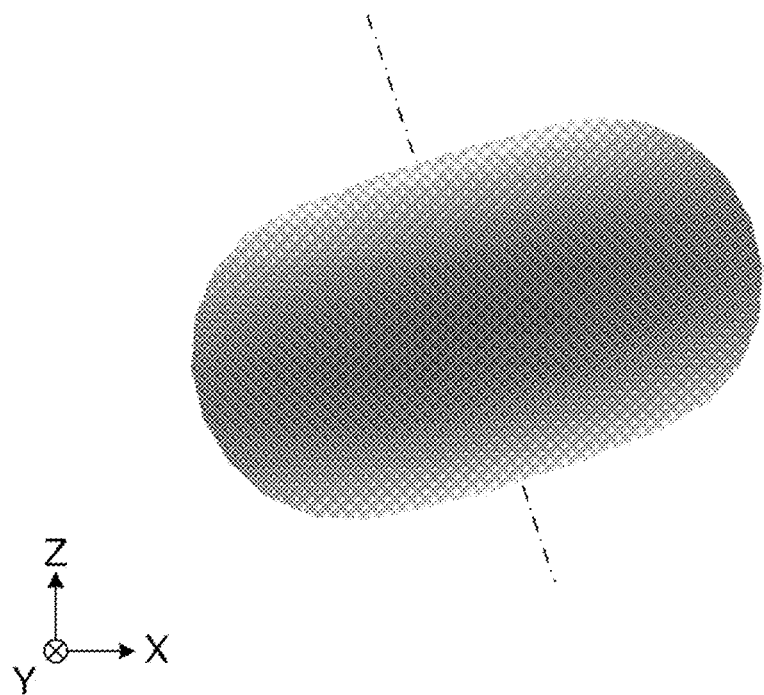
FIG. 18 is a contour view of a radiation gain of the RFIC module.

FIG. 18 is a contour view of a radiation gain of the RFIC module 104. The RFIC module 104 is located in the center of FIG. 18, and the contour of the radiation gain is represented as a torus shape. The center line of a torus shown by a dashed-dotted line is inclined from the Z axis.

Figure 19:
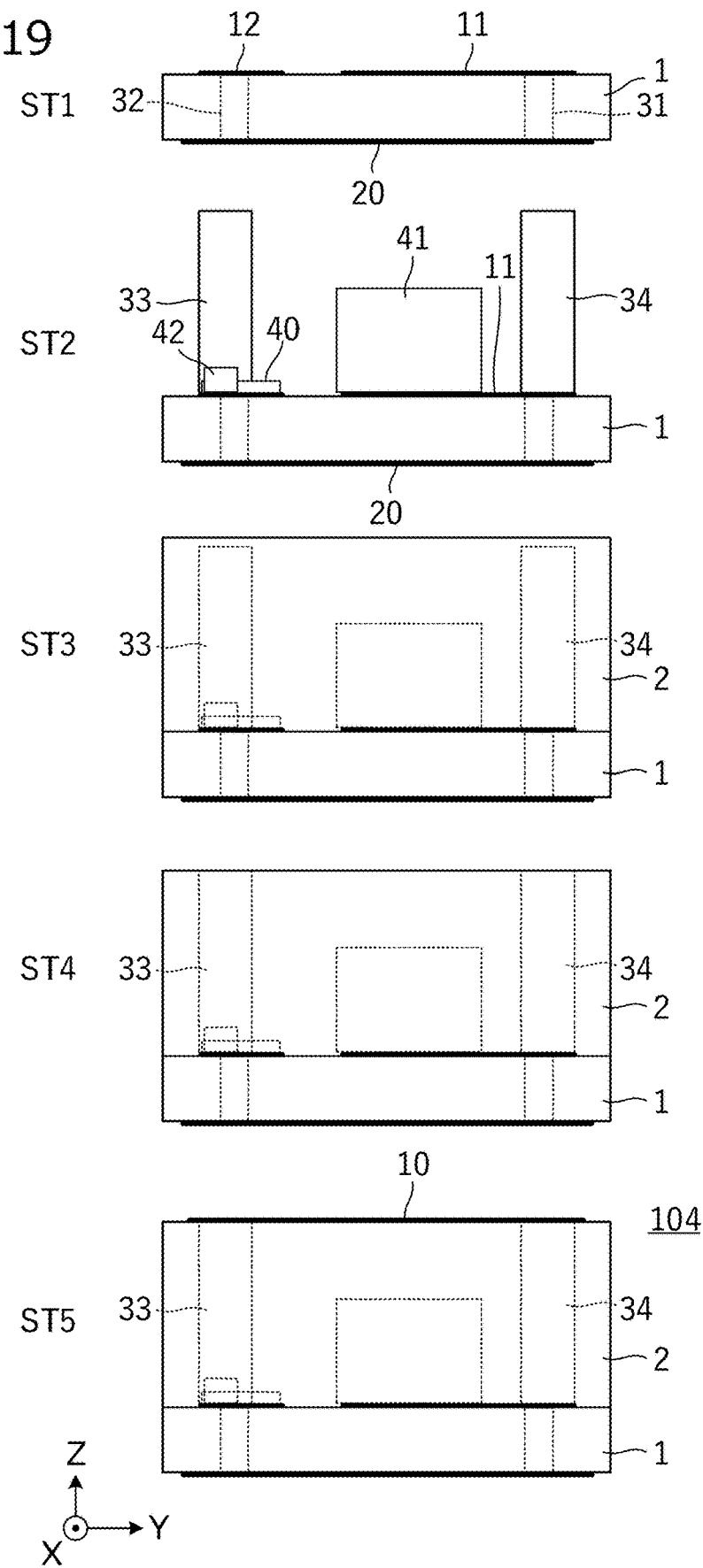
FIG. 19 is a front view seen in a negative X-axis direction at each stage of a process of manufacturing the RFIC module.

FIG. 19 is a front view seen in the negative X-axis direction at each stage of a process of manufacturing the RFIC module 104. In a step ST1, a second planar conductor 20, a first via conductor 31, a second via conductor 32, and electrodes 11 and 12 are provided on an insulating base material 1. In a step ST2, an inductor 41, an RFIC 40, a capacitor 42, a third via conductor 33, and a fourth via conductor 34 are mounted on a first principal surface of the insulating base material 1. In a step ST3, the first principal surface of the insulating base material 1 is covered with an insulator layer 2. As a result, the inductor 41, the RFIC 40, and the capacitor 42 are embedded in the insulator layer 2. In a step ST4, a surface of the insulator layer 2 is ground to cause a top portion of the third via conductor 33 and the fourth via conductor 34 to be exposed. In a step ST5, a first planar conductor 10 is provided on the surface of the insulator layer 2.

An RFIC module 104 can be manufactured according to the steps described above.

Fifth Exemplary Embodiment

A fifth exemplary embodiment of the present invention provides an example in which positions in which an inductor and an RFIC are connected to a first planar conductor and a second planar conductor are different from the positions described in the fourth exemplary embodiment.

Figure 20:
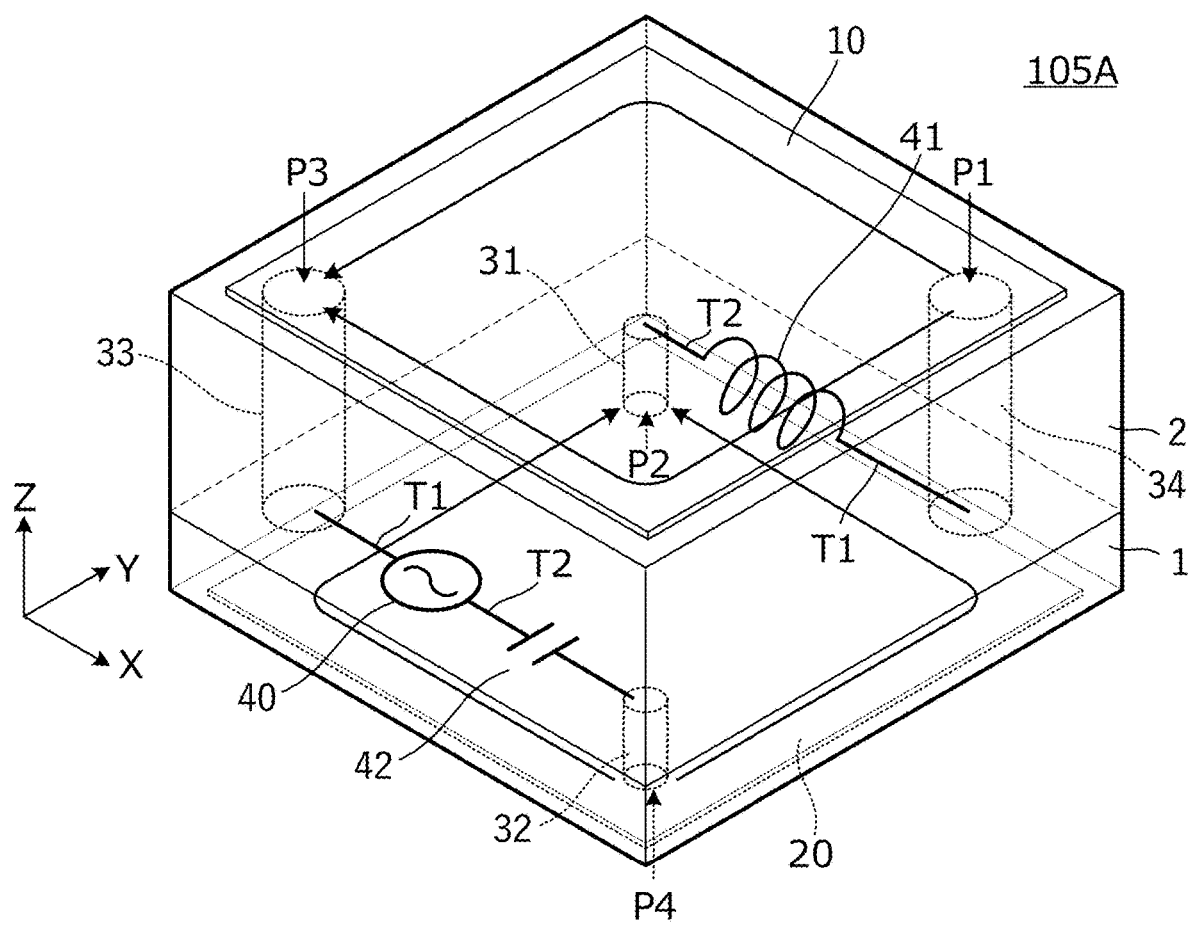
FIG. 20 is a perspective view of an RFIC module according to a fifth exemplary embodiment of the present invention.
Figure 21A:
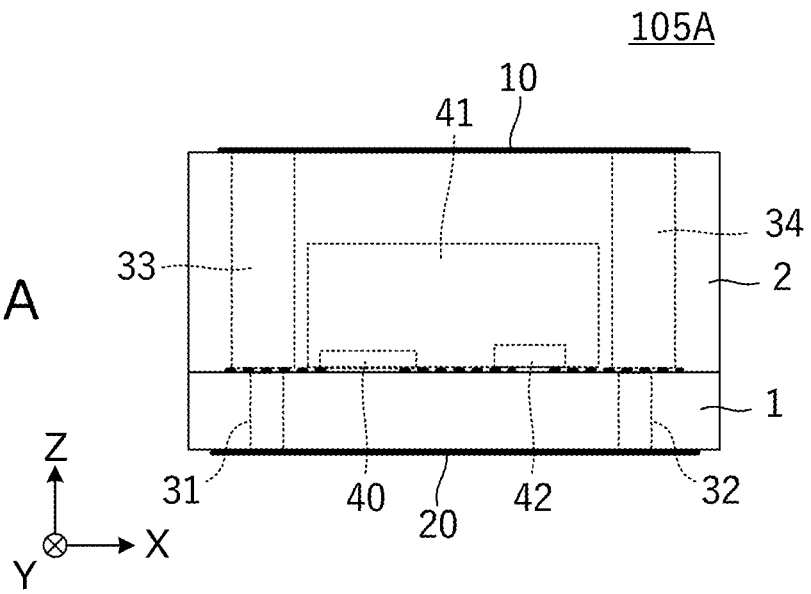
FIG. 21A and FIG. 21B are front views in the Y-axis direction in FIG. 20.
Figure 21B:
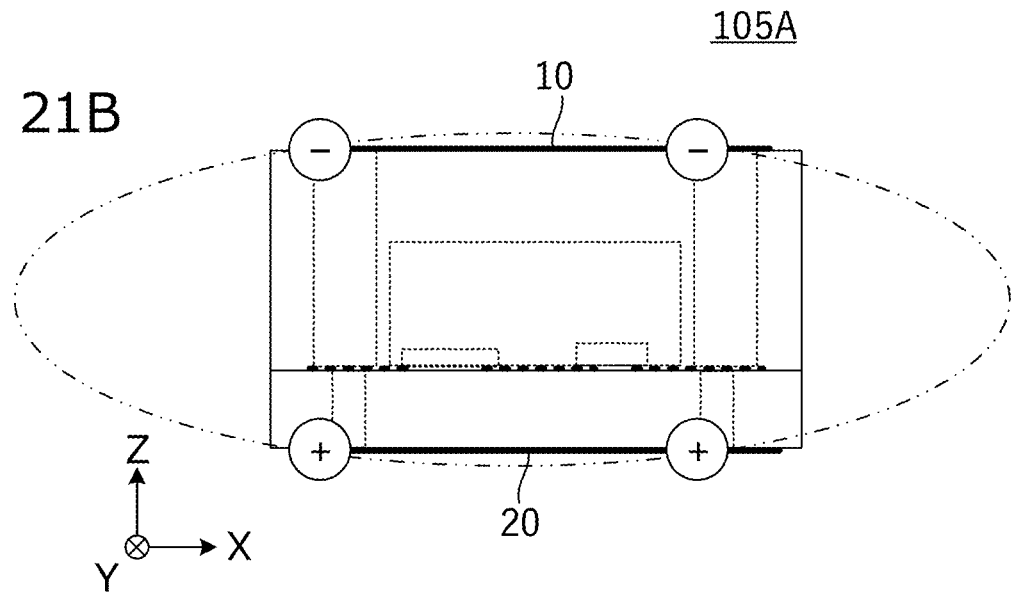

FIG. 20 is a perspective view of an RFIC module 105A according to the fifth exemplary embodiment. FIG. 21A and FIG. 21B are front views in the Y-axis direction in FIG. 20. The same components as those of the RFIC module 104 described in the fourth exemplary embodiment are designated by the same reference numerals.

Compared with the RFIC module 104 shown in FIG. 16A and FIG. 16B, the positions of the first point P1 of the first planar conductor 10 to which the first end T1 of the inductor 41 is connected, and the second point P2 of the second planar conductor 20 to which the second end T2 of the inductor 41 is connected are different.

In FIG. 20, in the same mode of expression as FIG. 16B, each circuit element included in the RFIC module 105A is represented by a circuit symbol. In addition, in FIG. 20, the line with an arrowhead shown along the first planar conductor 10 and the second planar conductor 20 conceptually represents a path of a current that flows in the first planar conductor 10 and the second planar conductor 20.

In the plan view of the first planar conductor 10 and the second planar conductor 20, the line that connects the first point P1 and the third point P3, and the line that connects the second point P2 and the fourth point P4 cross in a central portion of the lines.

In FIG. 20, although the potential difference between the first point P1 and the third point P3 is large, in the first planar conductor 10, a current flows between the first point P1 and the third point P3 along an edge of the first planar conductor 10. Similarly, although the potential difference between the second point P2 and the fourth point P4 is large, in the second planar conductor 20, a current flows between the second point P2 and the fourth point P4 along an edge of the second planar conductor 20.

FIG. 21B is a view conceptually showing a distribution (i.e., a distribution of electric charge) of a potential difference applied between the first planar conductor 10 and the second planar conductor 20. A circled plus sign and a circled minus sign in FIG. 21B conceptually indicate the polarity and magnitude of the electric charge (i.e., the current) on the first planar conductor 10 and the second planar conductor 20. As shown in FIG. 21B, in a front view of the RFIC module 105A, electric charges substantially equally face between the first planar conductor 10 and the second planar conductor 20. Therefore, as shown by a dashed line, the directivity direction of a radiation gain is parallel to the X-Y plane.

Figure 22:
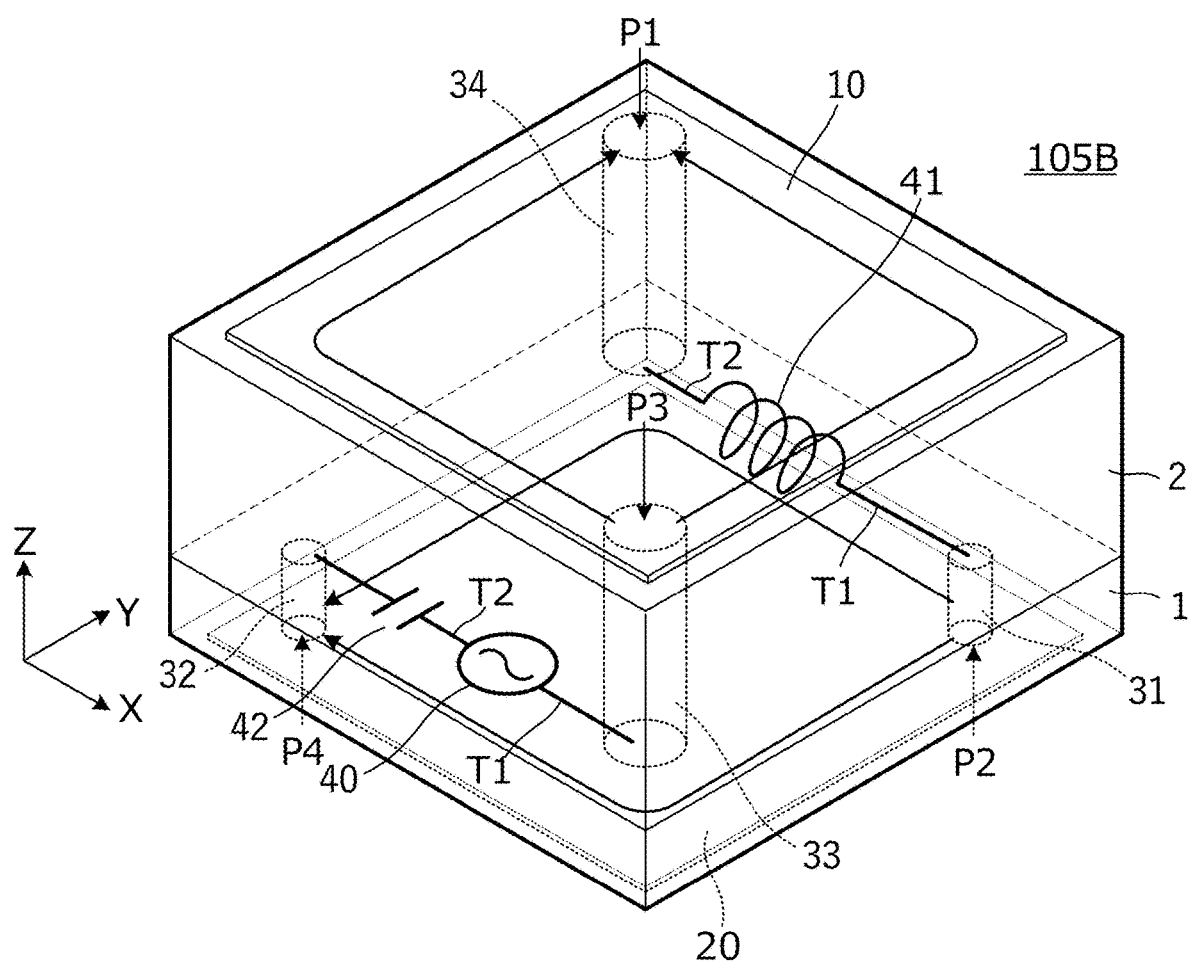
FIG. 22 is a perspective view of an RFIC module.

FIG. 22 is a perspective view of another RFIC module 105B according to the present exemplary embodiment. The same components as those of the RFIC module 104 described in the fourth exemplary embodiment are designated by the same reference numerals. Compared with the RFIC module 105A shown in FIG. 20, the positions in which the inductor 41 and the RFIC 40 are connected to the first planar conductor 10 and the second planar conductor 20 are different. However, the structure such that, in the plan view of the first planar conductor 10 and the second planar conductor 20, the line that connects the first point P1 and the third point P3, and the line that connects the second point P2 and the fourth point P4 cross in the central portion of the lines is the same. In other words, a current flows between the first point P1 and the third point P3 along the edge of the first planar conductor 10, and a current flows between the second point P2 and the fourth point P4 along the edge of the second planar conductor 20.

Figure 23:
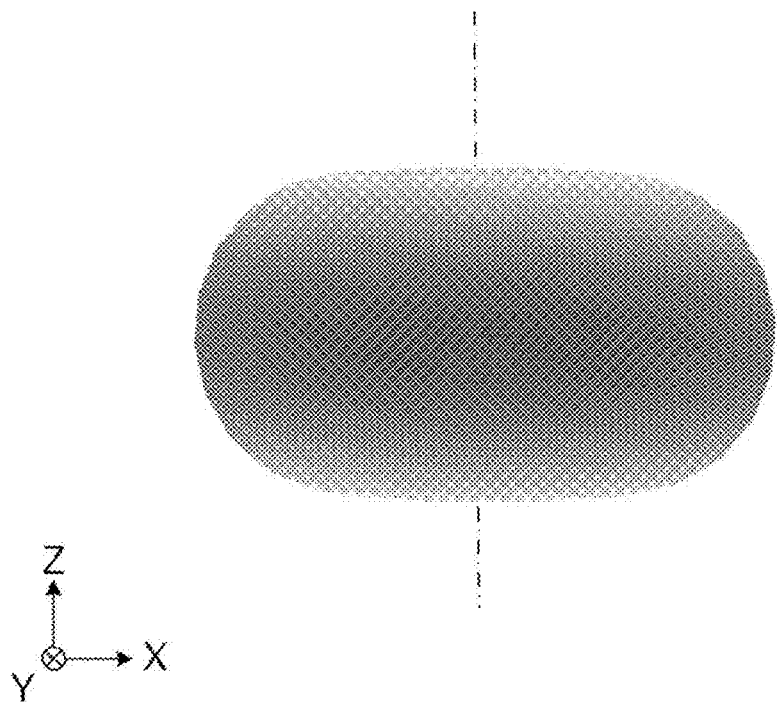
FIG. 23 is a contour view of radiation gain of the RFIC modules.

FIG. 23 is a contour view of a radiation gain of the RFIC modules 105A and 105B. The RFIC module 105A or 105B is located in the center of FIG. 23, and the contour of the radiation gain is represented as a torus shape. The center line of a torus shown by a dashed-dotted line is parallel to the Z axis.

Figure 24A:
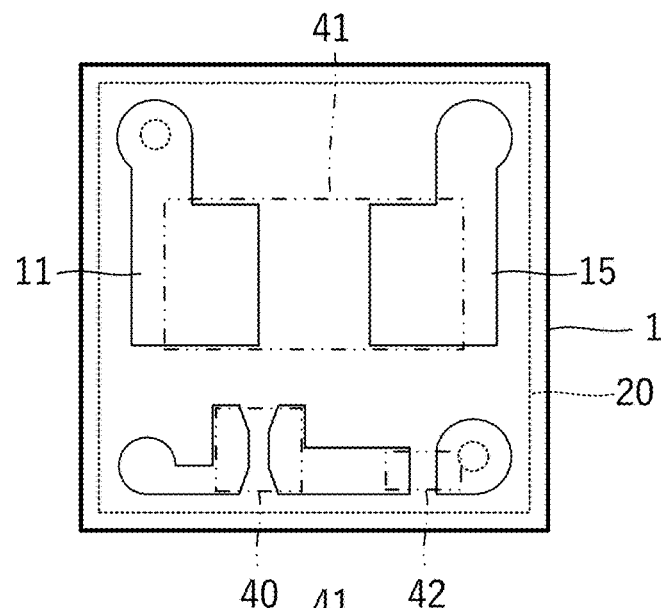
FIG. 24A, FIG. 24B, and FIG. 24C are all plan views of an insulating base material.
Figure 24B:
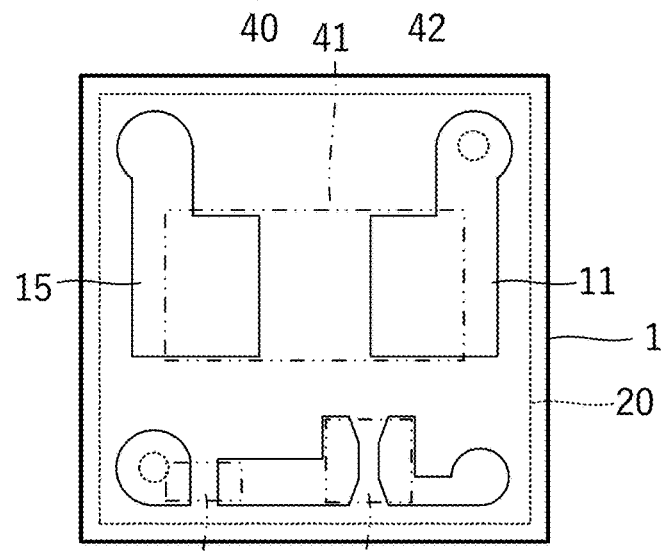
Figure 24C:
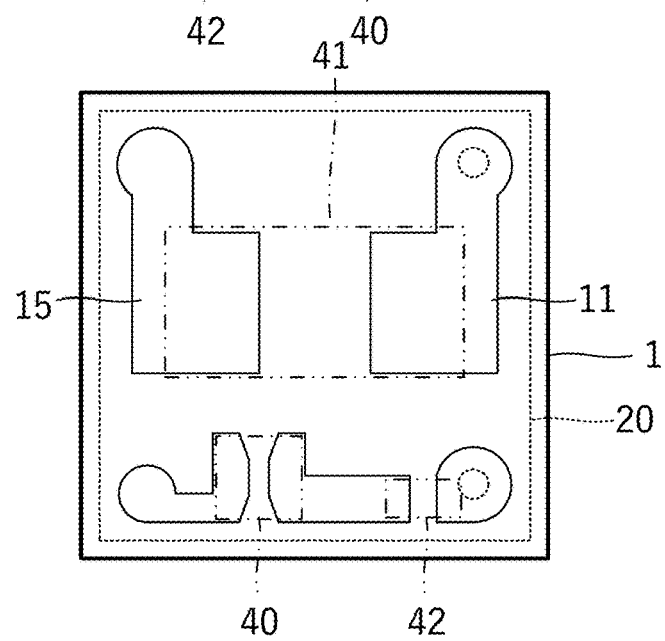

Each of FIG. 24A, FIG. 24B, and FIG. 24C is a plan view of an insulating base material 1. The insulating base material 1 shown in FIG. 24A is an insulating base material to be used for the RFIC module 105A shown in FIG. 20, and the insulating base material 1 shown in FIG. 24B is an insulating base material to be used for the RFIC module 105B shown in FIG. 22. In FIG. 24A and FIG. 24B, the patterns of each electrode that are provided on the first principal surface of the insulating base material 1 have a mirror image relationship. Incidentally, FIG. 24C is a plan view of the insulating base material 1 to be used for the RFIC module 104 shown in FIG. 16A.

In this manner, an electrode pattern provided on the first principal surface of the insulating base material 1 is changed, so that the positions in which the inductor 41 and the RFIC 40 are connected to the first planar conductor 10 and the second planar conductor 20 are able to be changed, which is able to set the directivity of a radiation gain.

Sixth Exemplary Embodiment

A sixth exemplary embodiment of the present invention provides an example in which the positions in which the inductor and the RFIC are connected to the first planar conductor and the second planar conductor are further different from the positions described in the fourth exemplary embodiment or the fifth exemplary embodiment.

Figure 25:
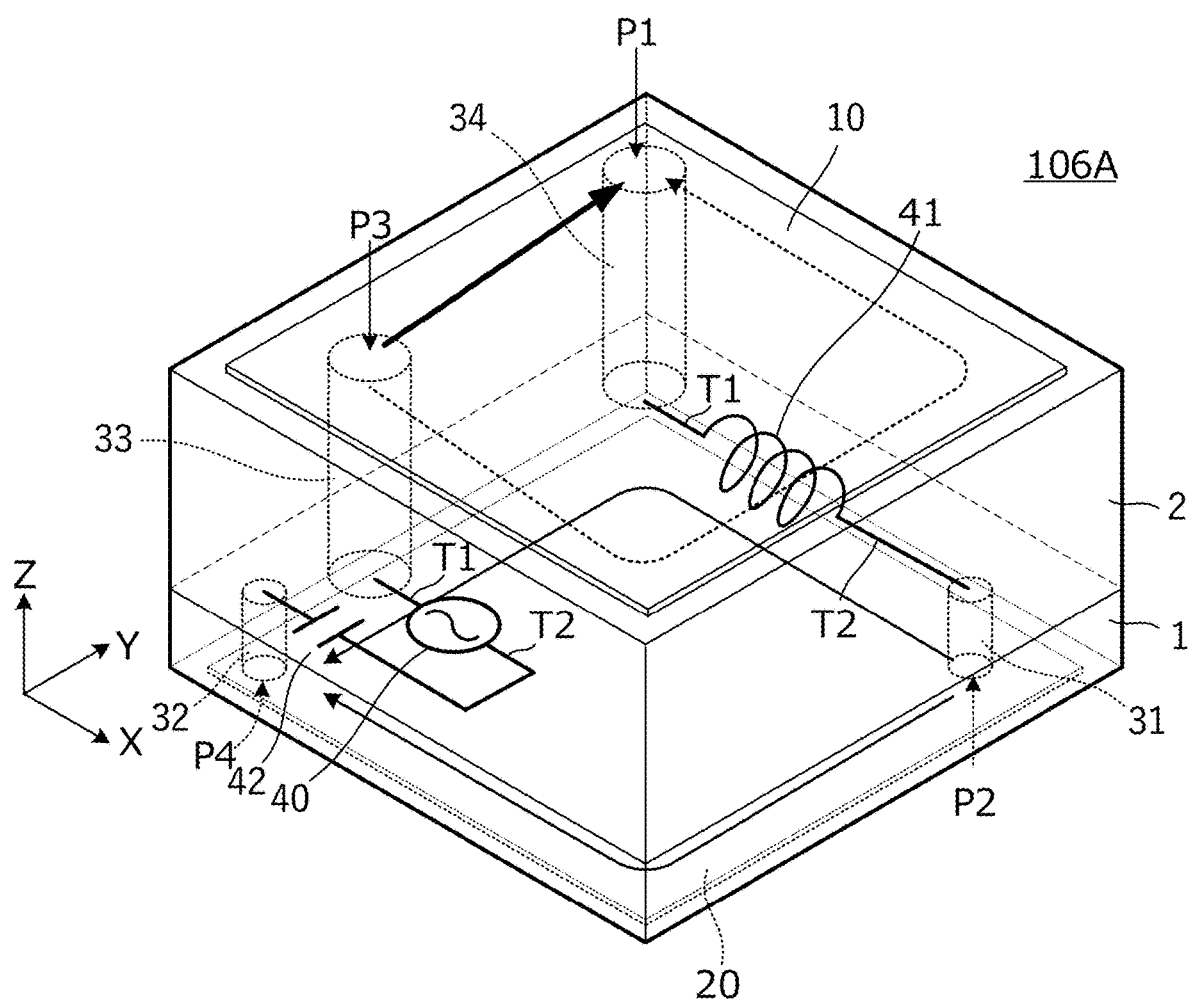
FIG. 25 is a perspective view of an RFIC module according to a sixth exemplary embodiment of the present invention.
Figure 26:
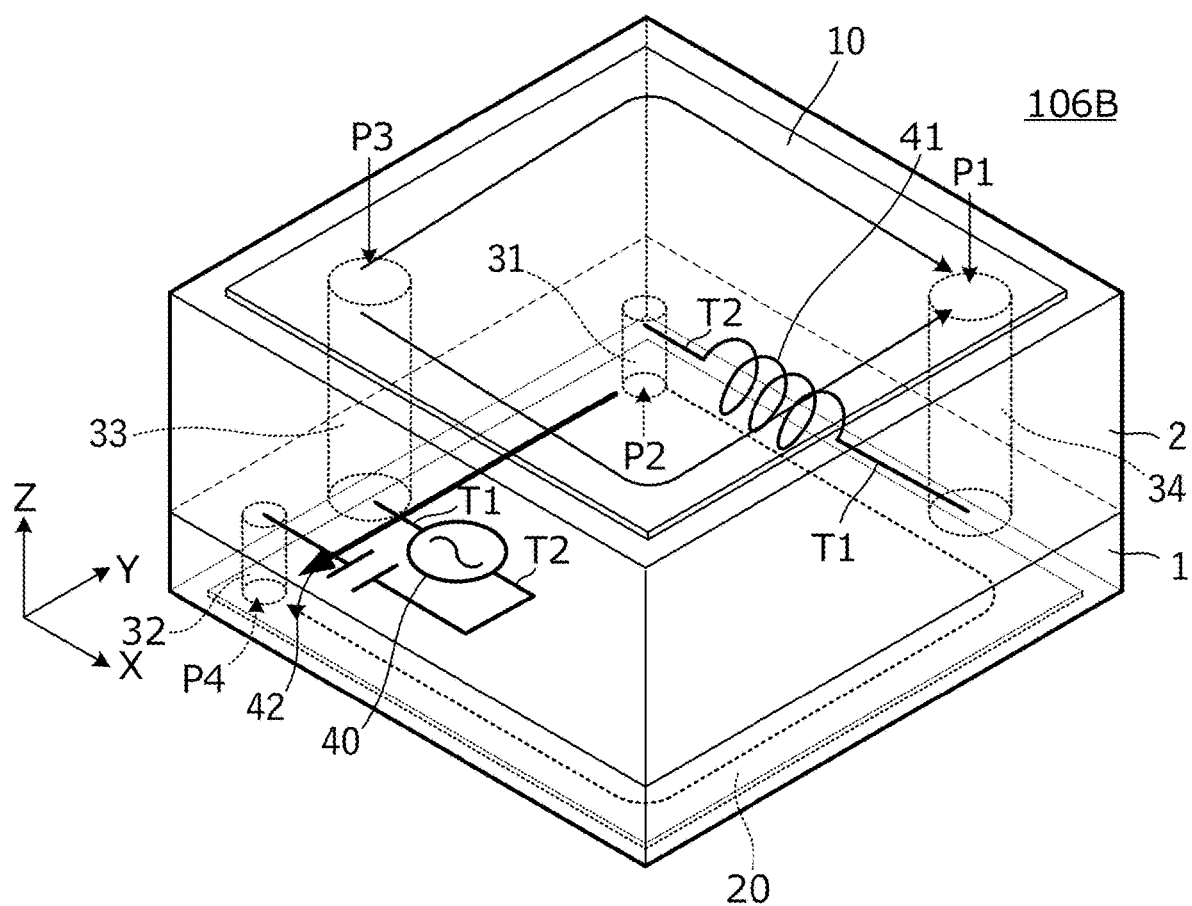
FIG. 26 is a perspective view of another RFIC module according to the sixth exemplary embodiment.

FIG. 25 is a perspective view of an RFIC module 106A according to the sixth exemplary embodiment. FIG. 26 is a perspective view of another RFIC module 106B according to the sixth exemplary embodiment. The same components as those of the RFIC module 104 described in the fourth exemplary embodiment are designated by the same reference numerals.

In both of the RFIC modules 106A and 106B, in the plan view of the first planar conductor 10 and the second planar conductor 20, the line that connects the first point P1 and the third point P3, and the line that connects the second point P2 and the fourth point P4 are not parallel to each other and do not cross in the central portion of the lines.

In FIG. 25, the potential difference between the first point P1 and the third point P3 is large, so that, in the first planar conductor 10, a current that flows in the shortest path between the first point P1 and the third point P3 is large, and, as shown by a dashed line, a current that flows bypassing along the edge of the first planar conductor 10 is relatively small. On the other hand, although the potential difference between the second point P2 and the fourth point P4 is large, in the second planar conductor 20, a current flows between the second point P2 and the fourth point P4 along the edge of the second planar conductor 20.

In FIG. 26, although the potential difference between the first point P1 and the third point P3 is large, in the first planar conductor 10, a current flows between the first point P1 and the third point P3 along an edge of the first planar conductor 10. On the other hand, the potential difference between the second point P2 and the fourth point P4 is large, so that, in the second planar conductor 20, a current that flows in the shortest path between the second point P2 and the fourth point P4 is large, and, as shown by a dashed line, a current that flows bypassing along the edge of the second planar conductor 20 is relatively small.

In this manner, deviation occurs in the electric charge (i.e., the current) concentrated on the first planar conductor 10 or the second planar conductor 20 in the present exemplary embodiment, so that the directivity direction of a radiation gain is inclined similarly to the case described in the fourth exemplary embodiment. However, since the concentration of the electric charge (i.e., the current) is on either of the first planar conductor 10 or the second planar conductor 20, the inclination is small.

Seventh Exemplary Embodiment

A seventh exemplary embodiment of the present invention provides an example in which the positions in which the inductor and the RFIC are connected to the first planar conductor and the second planar conductor are further different from the positions described in the exemplary embodiments that have been described.

Figure 27:
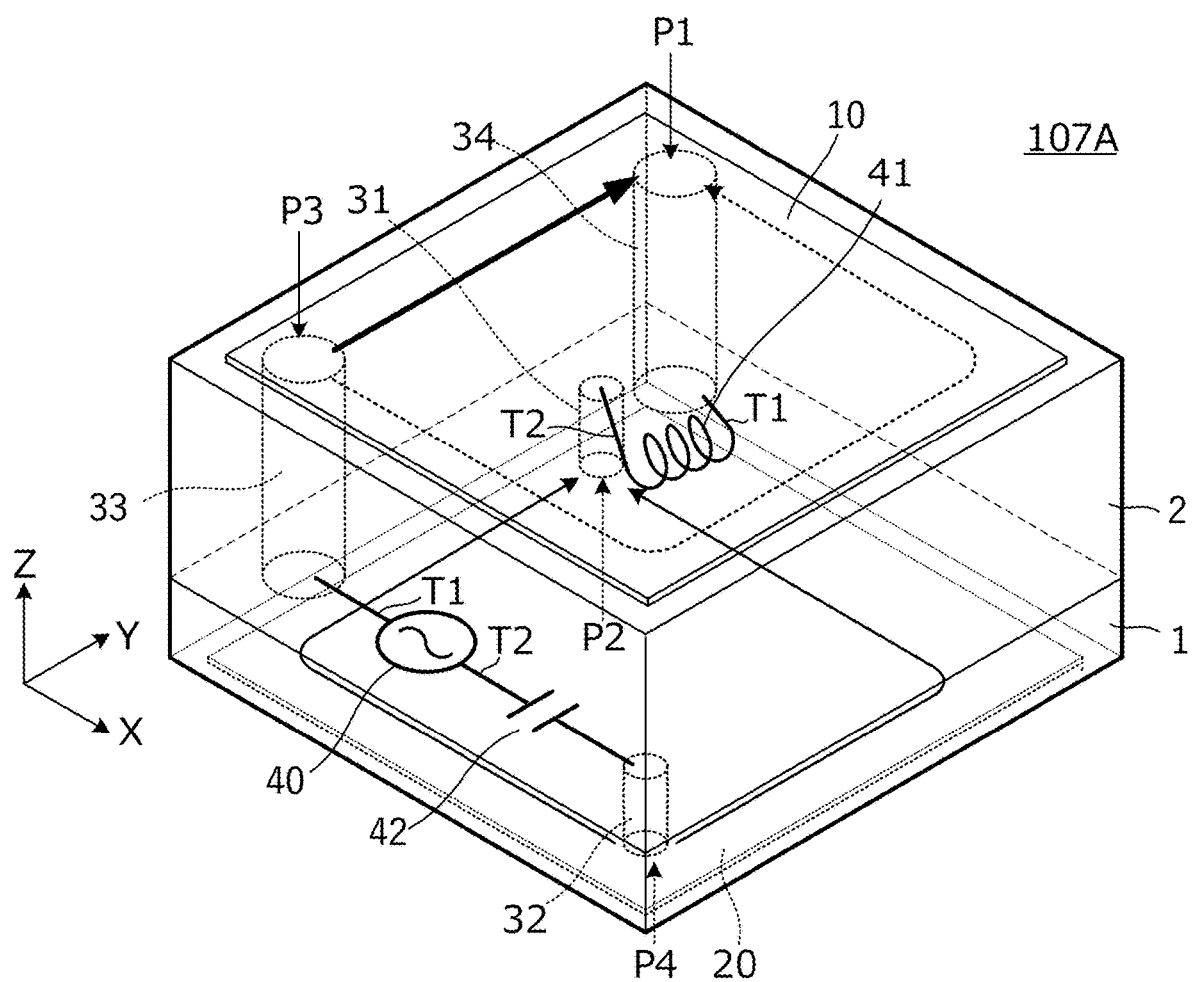
FIG. 27 is a perspective view of an RFIC module according to a seventh exemplary embodiment of the present invention.
Figure 28:
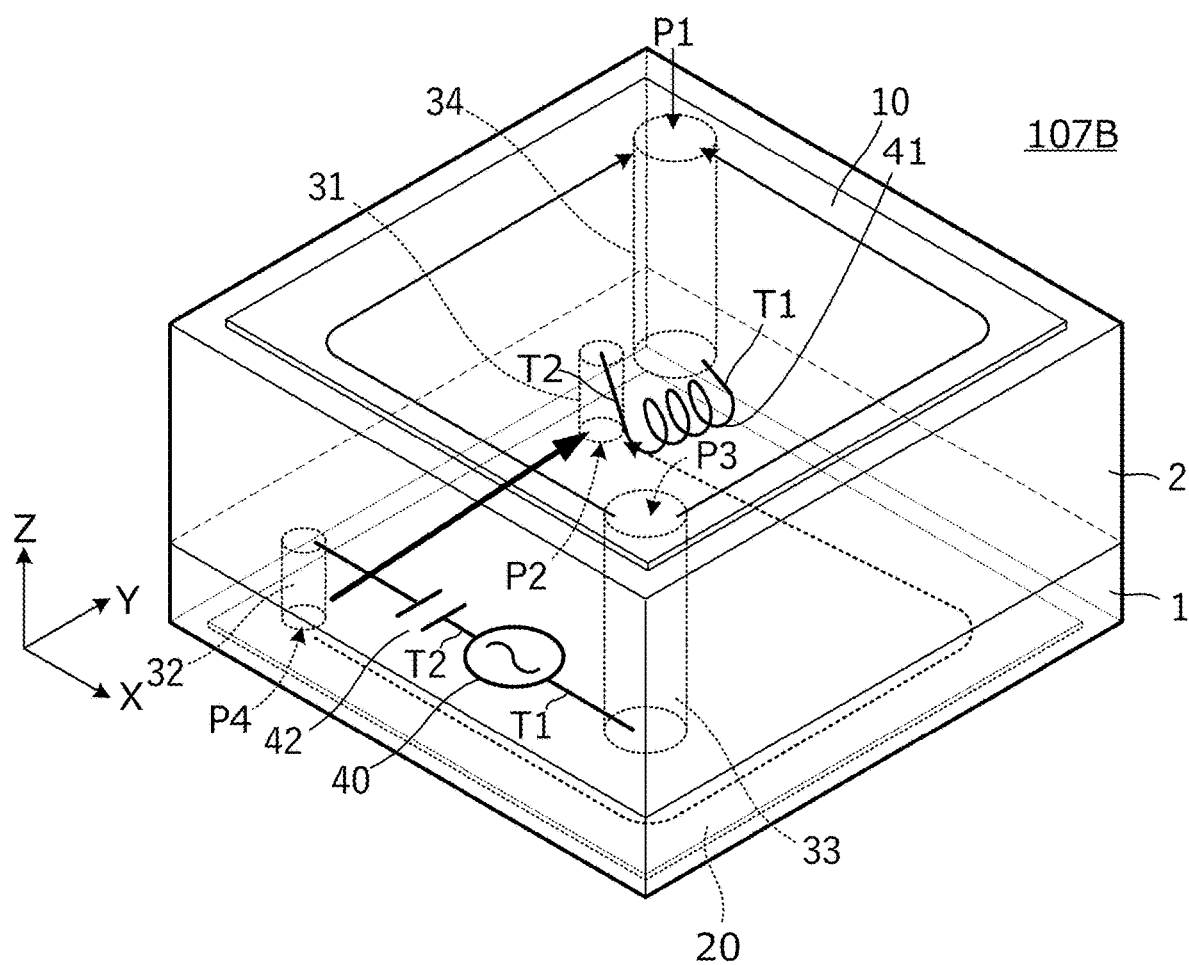
FIG. 28 is a perspective view of another RFIC module according to the seventh exemplary embodiment.

FIG. 27 is a perspective view of an RFIC module 107A according to the seventh exemplary embodiment. FIG. 28 is a perspective view of another RFIC module 107B according to the seventh exemplary embodiment. The same components as those of the RFIC module 104 described in the fourth exemplary embodiment are designated by the same reference numerals.

In both of the RFIC modules 107A and 107B, in the plan view of the first planar conductor 10 and the second planar conductor 20, the line that connects the first point P1 and the third point P3, and the line that connects the second point P2 and the fourth point P4 are not parallel to each other and do not cross in the central portion of the lines.

In FIG. 27, the potential difference between the first point P1 and the third point P3 is large, so that, in the first planar conductor 10, a current that flows in the shortest path between the first point P1 and the third point P3 is large, and, as shown by a dashed line, a current that flows bypassing along the edge of the first planar conductor 10 is relatively small. On the other hand, although the potential difference between the second point P2 and the fourth point P4 is large, in the second planar conductor 20, a current flows between the second point P2 and the fourth point P4 along the edge of the second planar conductor 20.

In FIG. 28, although the potential difference between the first point P1 and the third point P3 is large, in the first planar conductor 10, a current flows between the first point P1 and the third point P3 along an edge of the first planar conductor 10. On the other hand, the potential difference between the second point P2 and the fourth point P4 is large, so that, in the second planar conductor 20, a current that flows in the shortest path between the second point P2 and the fourth point P4 is large, and, as shown by a dashed line, a current that flows bypassing along the edge of the second planar conductor 20 is relatively small.

In this manner, deviation is generated in the electric charge (i.e., the current) concentrated on the first planar conductor 10 or the second planar conductor 20 in the present exemplary embodiment, so that the directivity of a radiation gain is inclined similarly to the case described in the fourth exemplary embodiment. However, since the concentration of the electric charge (the current) is on either of the first planar conductor 10 or the second planar conductor 20, the inclination is small.

Eighth Exemplary Embodiment

An eighth exemplary embodiment of the present invention provides an example in which the positions in which the inductor and the RFIC are connected to the first planar conductor and the second planar conductor are further different from the positions described in the exemplary embodiments that have been described.

Figure 29:
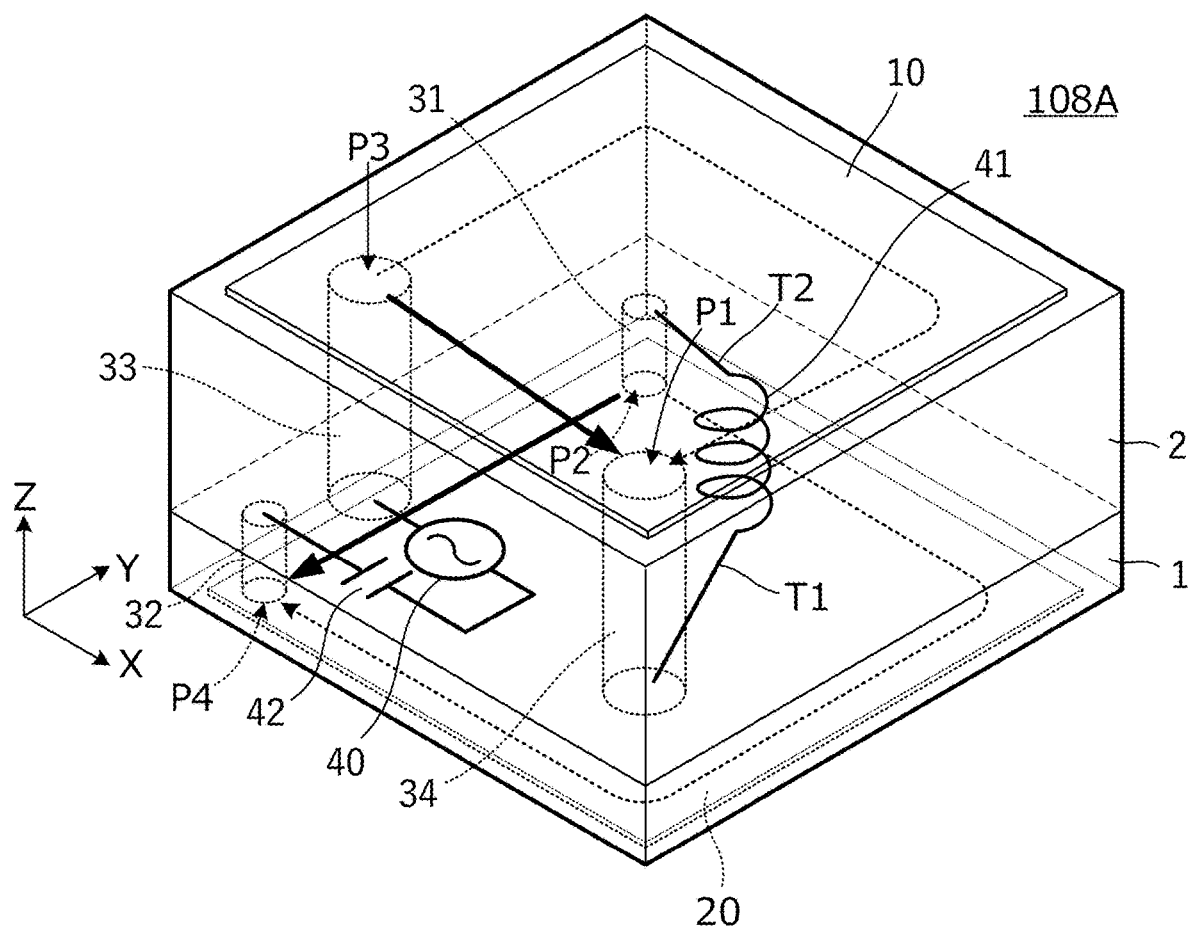
FIG. 29 is a perspective view of an RFIC module according to an eighth exemplary embodiment of the present invention.
Figure 30:
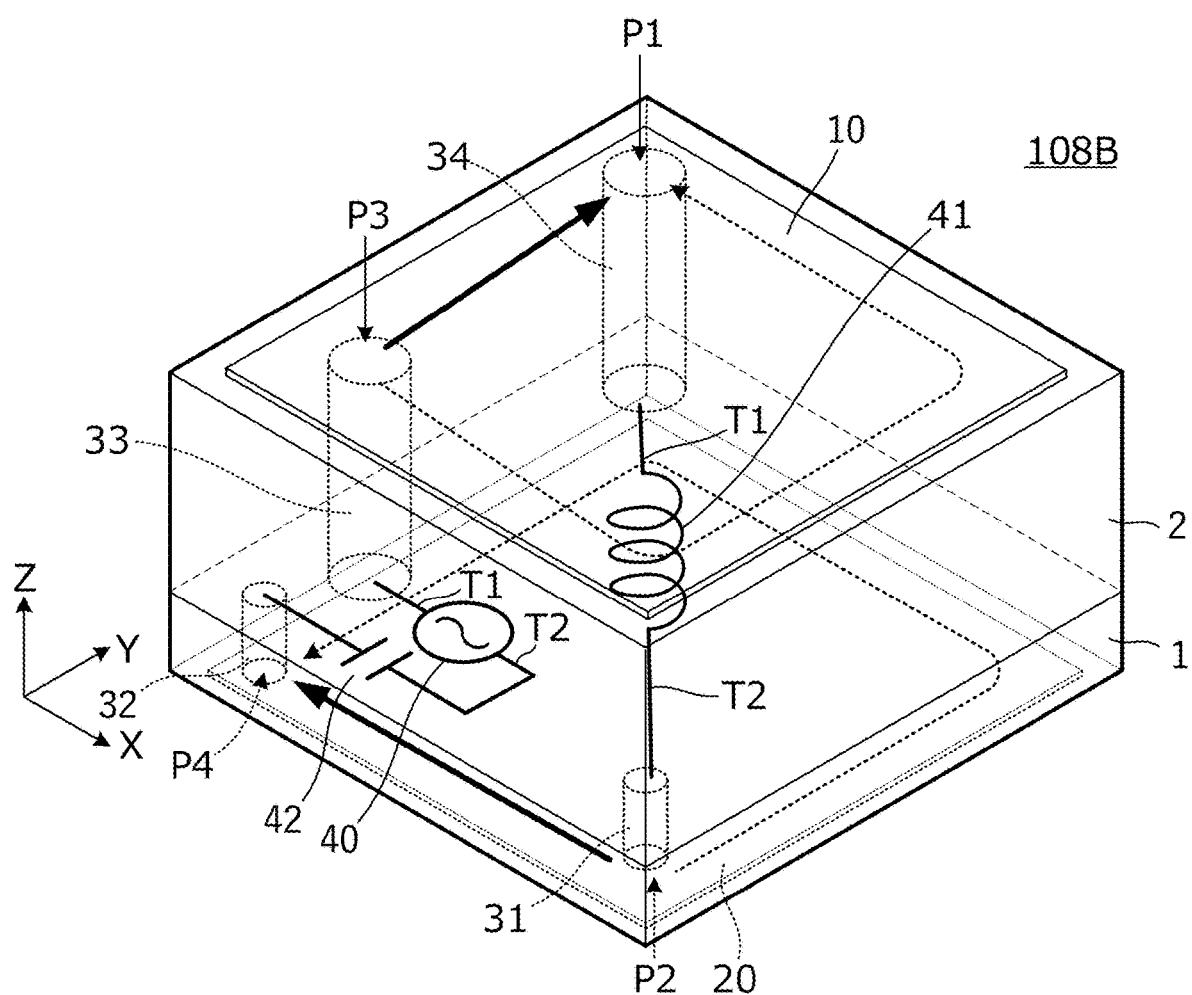
FIG. 30 is a perspective view of another RFIC module according to the eighth exemplary embodiment of the present invention.

FIG. 29 is a perspective view of an RFIC module 108A according to the eighth exemplary embodiment. FIG. 30 is a perspective view of another RFIC module 108B according to the eighth exemplary embodiment. The same components as those of the RFIC module 104 described in the fourth exemplary embodiment are designated by the same reference numerals.

In both of the RFIC modules 108A and 108B, in the plan view of the first planar conductor 10 and the second planar conductor 20, the line that connects the first point P1 and the third point P3, and the line that connects the second point P2 and the fourth point P4 are not parallel to each other and do not cross in the central portion of the lines.

In both of FIG. 29 and FIG. 30, the potential difference between the first point P1 and the third point P3 is large, so that, in the first planar conductor 10, a current that flows in the shortest path between the first point P1 and the third point P3 is large, and, as shown by a dashed line, a current that flows bypassing along the edge of the first planar conductor 10 is relatively small. Similarly, in the second planar conductor 20, a current that flows in the shortest path between the second point P2 and the fourth point P4 is large, and, as shown by a dashed line, a current that flows bypassing along the edge of the second planar conductor 20 is relatively small.

In the RFIC module 108A, the electric charge (i.e., the current) of the first planar conductor 10 is deviated in a negative Y direction, and the electric charge (i.e., the current) of the second planar conductor 20 is deviated in the negative X direction. In addition, in the RFIC module 108B, the electric charge (i.e., the current) of the first planar conductor 10 is deviated in the negative X direction, and the electric charge (i.e., the current) of the second planar conductor 20 is deviated in the negative Y direction. Therefore, according to this structure, deviation occurs in the electric charge (i.e., the current) concentrated on the first planar conductor 10 and the second planar conductor 20, so that the directivity direction of a radiation gain is inclined.

Ninth Exemplary Embodiment

A ninth exemplary embodiment of the present invention provides an example in which the positions in which the inductor and the RFIC are connected to the first planar conductor and the second planar conductor are still further different from the positions described in the exemplary embodiments that have been described.

Figure 31:
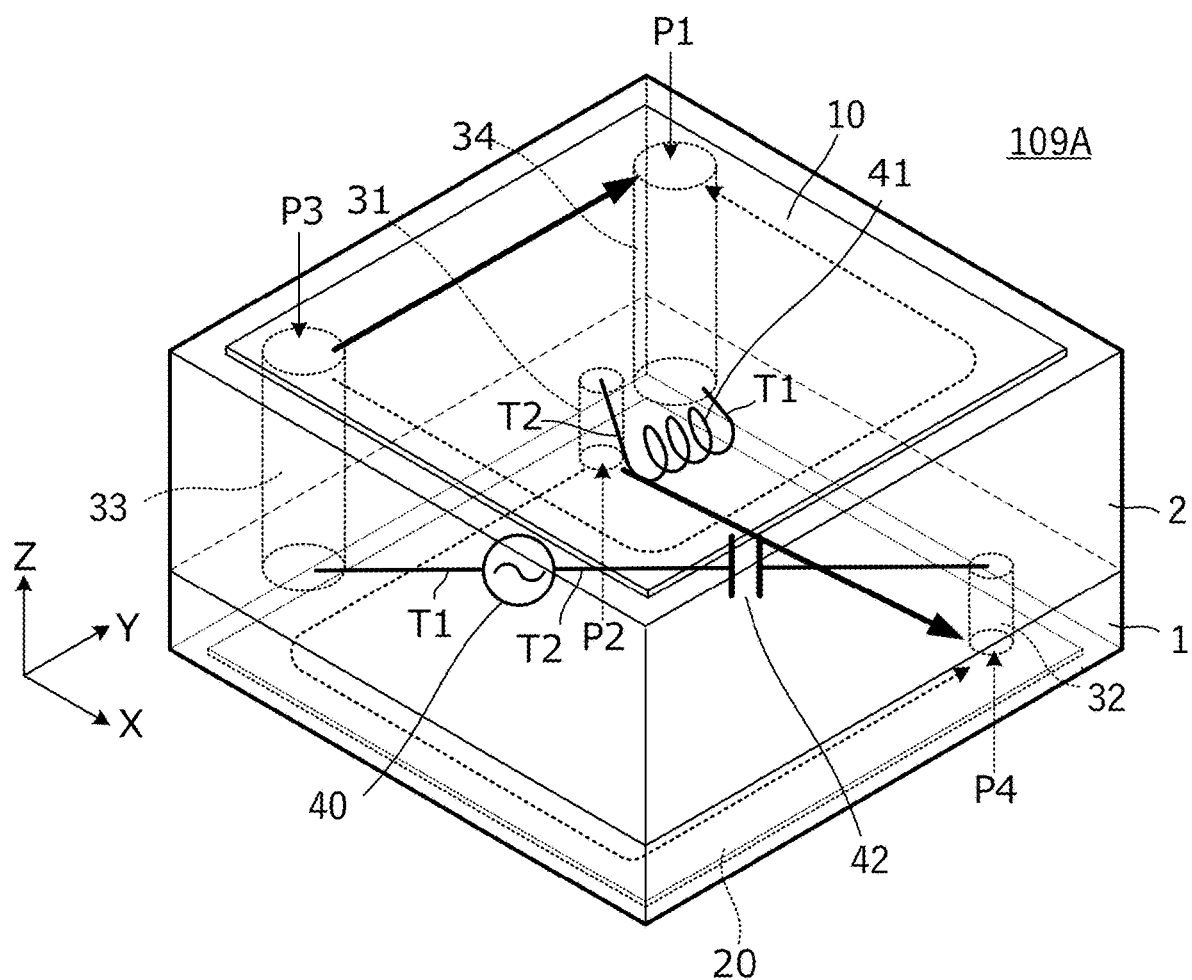
FIG. 31 is a perspective view of an RFIC module according to a ninth exemplary embodiment of the present invention.
Figure 32:
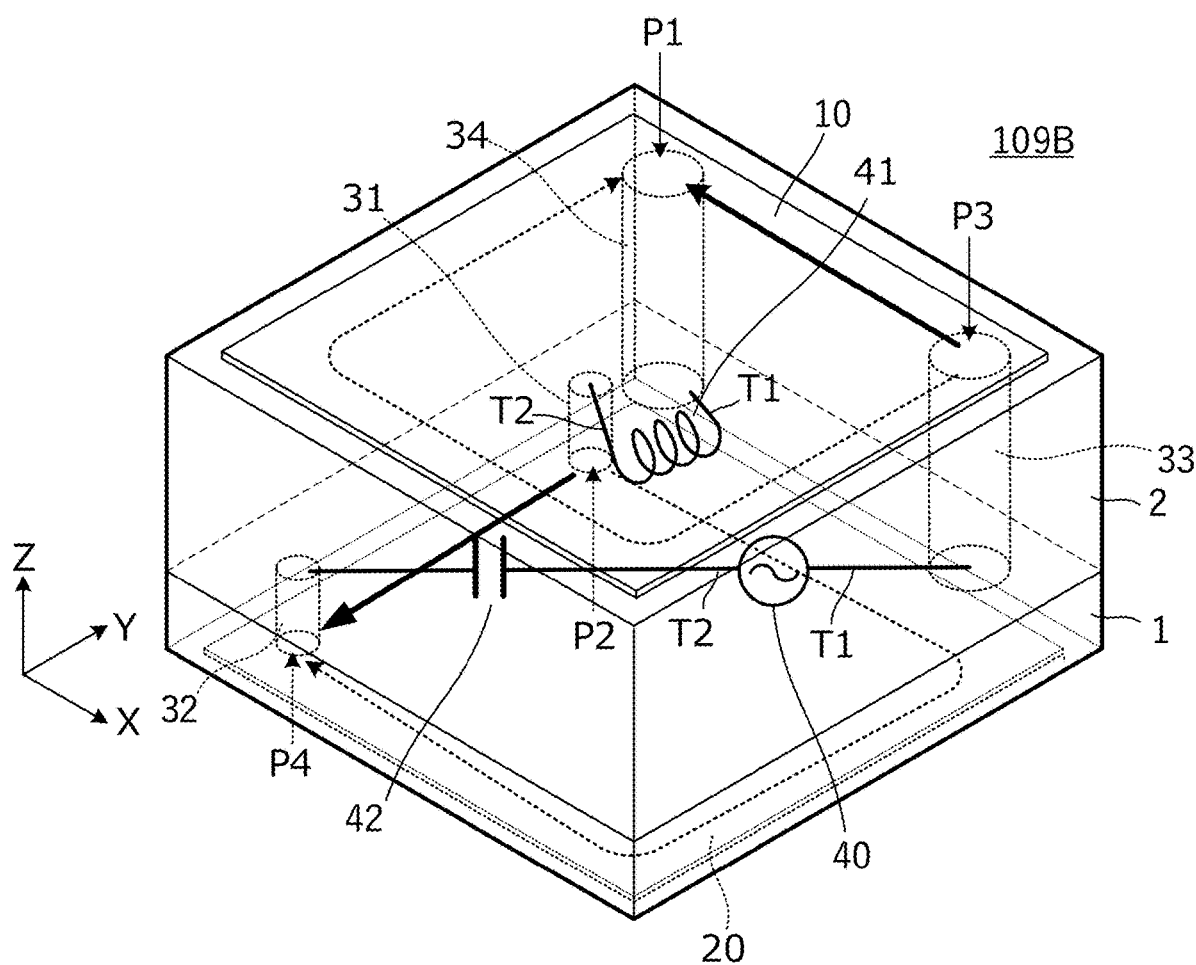
FIG. 32 is a perspective view of another RFIC module according to the ninth exemplary embodiment of the present invention.

FIG. 31 is a perspective view of an RFIC module 109A according to the ninth exemplary embodiment. FIG. 32 is a perspective view of another RFIC module 109B according to the ninth exemplary embodiment. It is noted that the same components as those of the RFIC module 104 described in the fourth exemplary embodiment are designated by the same reference numerals.

In both of the RFIC modules 109A and 109B, in the plan view of the first planar conductor 10 and the second planar conductor 20, the line that connects the first point P1 and the third point P3, and the line that connects the second point P2 and the fourth point P4 are not parallel to each other and do not cross in the central portion of the lines.

In both of FIG. 31 and FIG. 32, the potential difference between the first point P1 and the third point P3 is large, so that, in the first planar conductor 10, a current that flows in the shortest path between the first point P1 and the third point P3 is large, and, as shown by a dashed line, a current that flows bypassing along the edge of the first planar conductor 10 is relatively small. Similarly, in the second planar conductor 20, a current that flows in the shortest path between the second point P2 and the fourth point P4 is large, and, as shown by a dashed line, a current that flows bypassing along the edge of the second planar conductor 20 is relatively small.

In the RFIC module 109A, the electric charge (i.e., the current) of the first planar conductor 10 is deviated in the negative X direction, and the electric charge (i.e., the current) of the second planar conductor 20 is deviated in the Y direction. In addition, in the RFIC module 109B, the electric charge (i.e., the current) of the first planar conductor 10 is deviated in the Y direction, and the electric charge (i.e., the current) of the second planar conductor 20 is deviated in the negative X direction. Therefore, according to this structure, deviation occurs in the electric charge (the current) concentrated on the first planar conductor 10 and the second planar conductor 20, so that the directivity of a radiation gain is inclined.

Tenth Exemplary Embodiment

A tenth exemplary embodiment of the present invention provides an example in which a configuration of the first planar conductor and the second planar conductor is further different from the configuration described in the exemplary embodiments that have been described.

Figure 33:
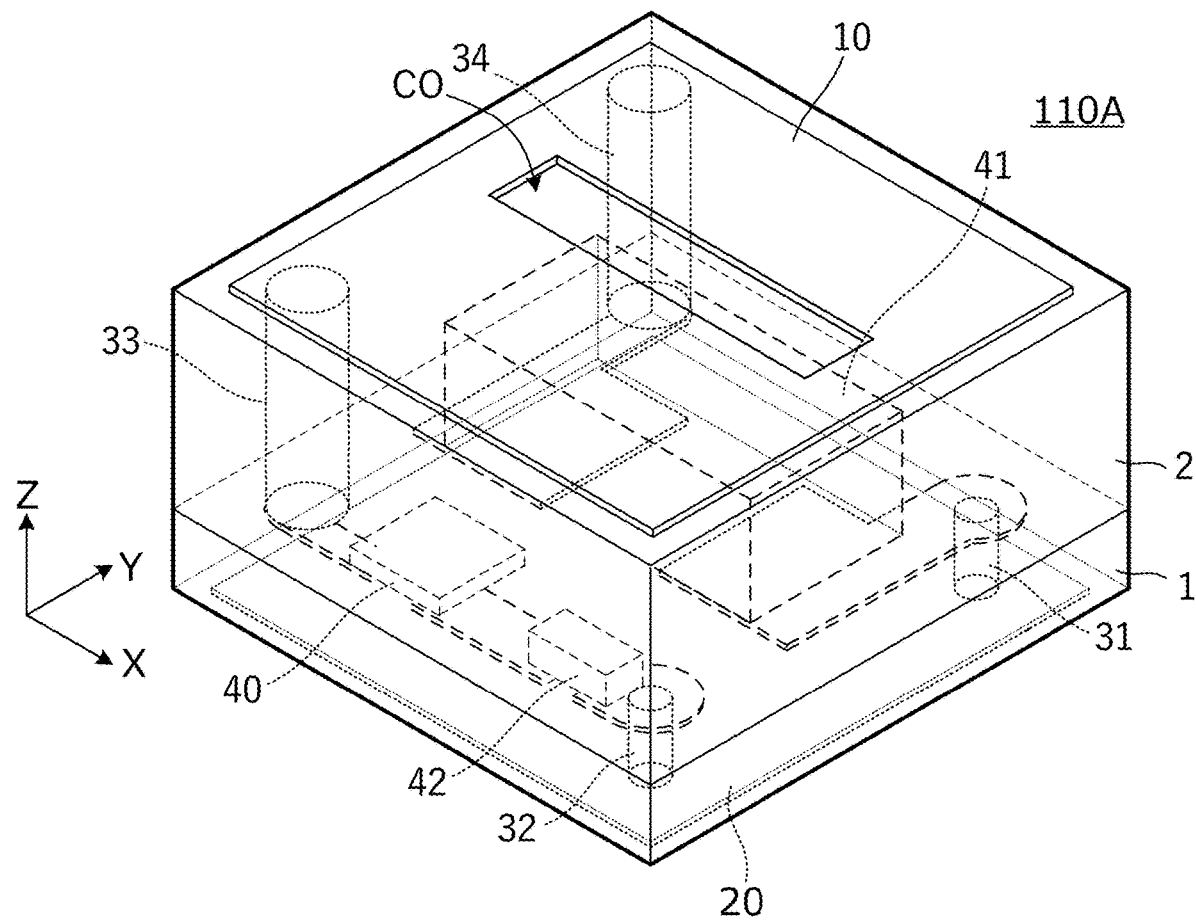
FIG. 33 is a perspective view of an RFIC module according to a tenth exemplary embodiment of the present invention.
Figure 34:
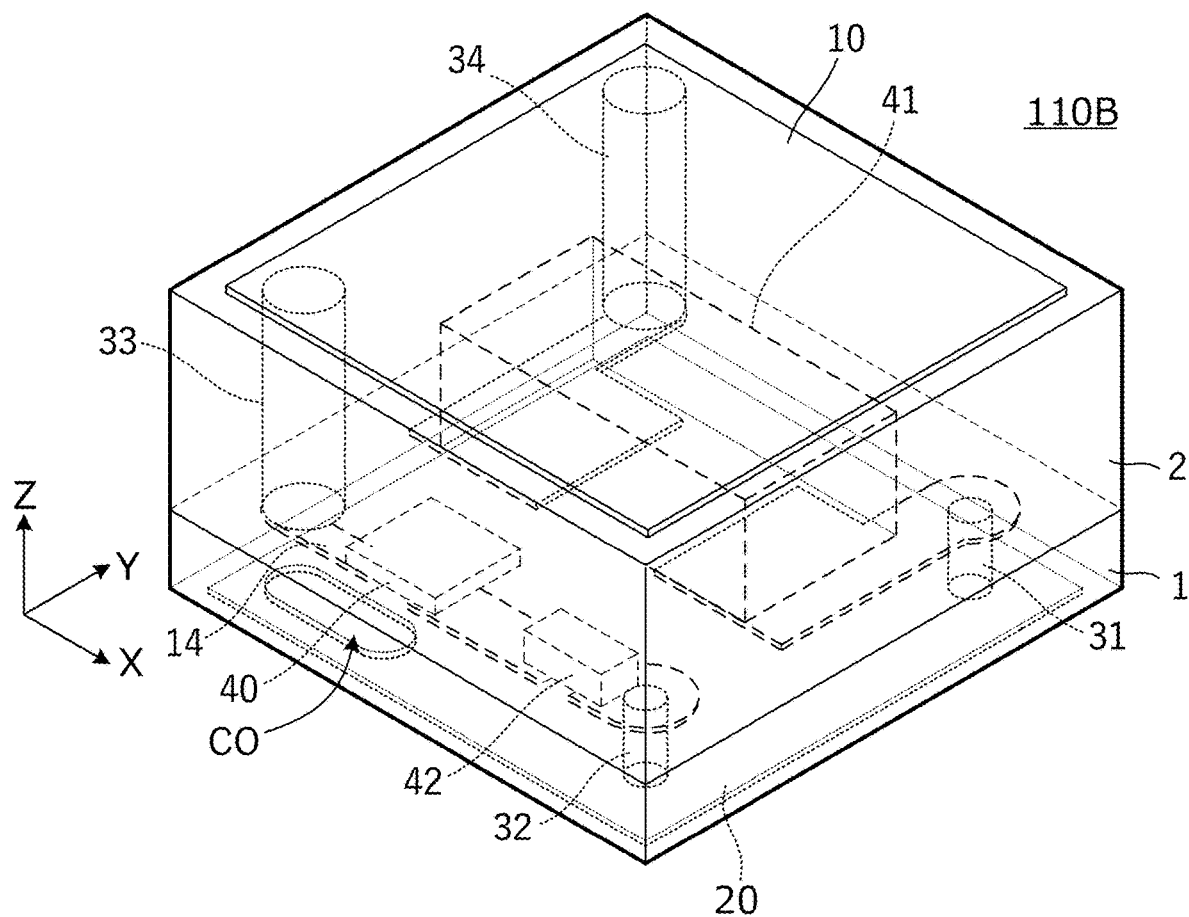
FIG. 34 is a perspective view of another RFIC module according to the tenth exemplary embodiment of the present invention.

FIG. 33 is a perspective view of an RFIC module 110A according to the tenth exemplary embodiment. FIG. 34 is a perspective view of another RFIC module 110B according to the tenth exemplary embodiment. The basic configuration of the RFIC modules 110A and 110B is the same as the configuration of the RFIC module 104 shown in FIG. 16A.

The RFIC module 110A shown in FIG. 33 includes a conductor opening CO in the first planar conductor 10. This conductor opening CO is provided at a position along the inductor 41. In addition, the winding axis of the inductor 41 extends in an X-axis direction, and the conductor opening CO extends in the direction of the winding axis. With such a structure, influence on the inductor 41 by being adjacent to the first planar conductor 10 will be limited. In other words, the first planar conductor 10 will not interfere with magnetic flux that the inductor 41 generates, so that, even when the distance between the inductor 41 and the first planar conductor 10 is reduced, no adverse effect is caused on characteristics, which is effective in miniaturization of the RFIC module.

The RFIC module 110B shown in FIG. 34 includes a conductor opening CO in the second planar conductor 20. This conductor opening CO is provided at a position along the RFIC 40 and a wiring electrode 14 between the RFIC 40 and the third via conductor 33. With such a structure, parasitic capacitance that occurs between the RFIC 40 and the electrode 14, and the second planar conductor 20 is significantly reduced. Therefore, the distance between the RFIC 40 and the second planar conductor 20 is able to be reduced, which is effective in miniaturization of the RFIC module.

Eleventh Exemplary Embodiment

An eleventh exemplary embodiment provides an example of an RFIC module including an inductor and a capacitor in an insulating base material.

Figure 35A:
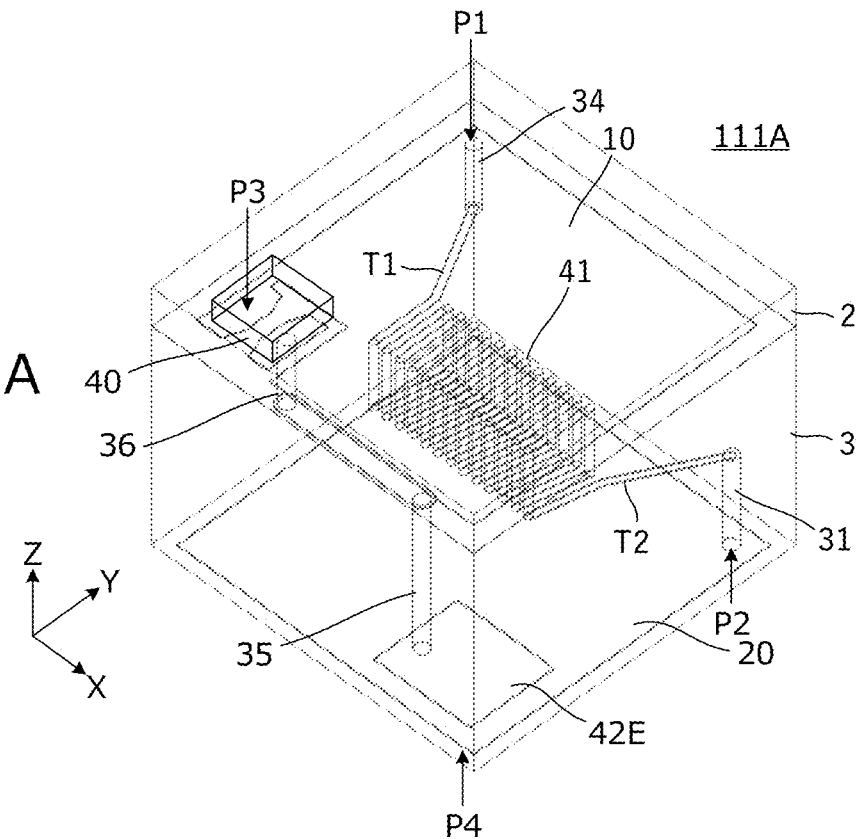
FIG. 35A is a perspective view of an RFIC module according to an eleventh exemplary embodiment.
Figure 35B:
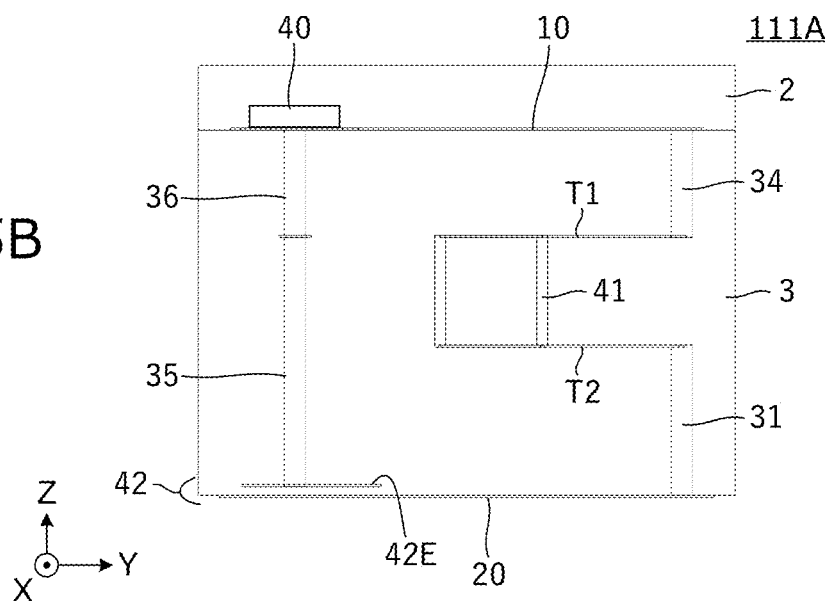
FIG. 35B is a front view seen in the negative X-axis direction.

FIG. 35A is a perspective view of an RFIC module 111A according to the eleventh exemplary embodiment, and FIG. 35B is a front view seen in the negative X-axis direction. However, both of FIG. 35A and FIG. 35B show an inside in a see-through manner.

The RFIC module 111A includes an insulating base material 3, and an insulator layer 2 that covers an upper surface of the insulating base material 3. The insulating base material 3 can be a multilayer substrate made of glass-epoxy, for example. The insulating base material 3 includes a first planar conductor 10 on an upper surface and a second planar conductor 20 on a lower surface, respectively. In addition, this insulating base material 3 includes an inductor 41, a capacitor electrode 42E, via conductors 31, 34, 35, and 36, and the like therein. A capacitor 42 is provided in a portion in which the capacitor electrode 42E faces the second planar conductor 20.

The inductor 41 includes a rectangular helical conductor defined by a plurality of conductor patterns along an X-Y plane and a plurality of via conductors extending in a Z-axis direction.

A first end T1 of the inductor 41 is connected to a first point P1 that is a portion of an outer edge of the first planar conductor 10 through the fourth via conductor 34, and a second end T2 of the inductor 41 is connected to a second point P2 that is a portion of an outer edge of the second planar conductor 20 through the via conductor 31. In addition, a first end of the RFIC 40 is connected to a third point P3 that is a portion of the outer edge of the first planar conductor 10, and a second end of the RFIC 40 is connected to a fourth point P4 that is a portion of the outer edge of the second planar conductor 20 through the via conductors 36 and 35 and the capacitor 42.

Figure 36A:
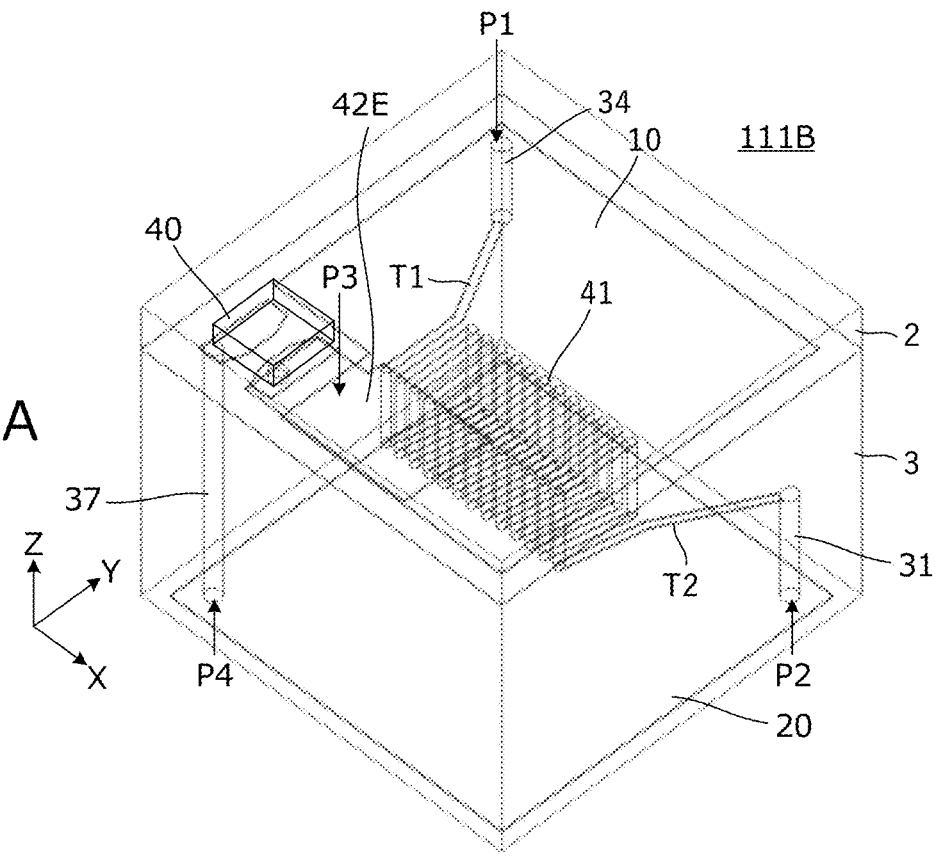
FIG. 36A is a perspective view of another RFIC module according to the eleventh exemplary embodiment of the present invention.
Figure 36B:
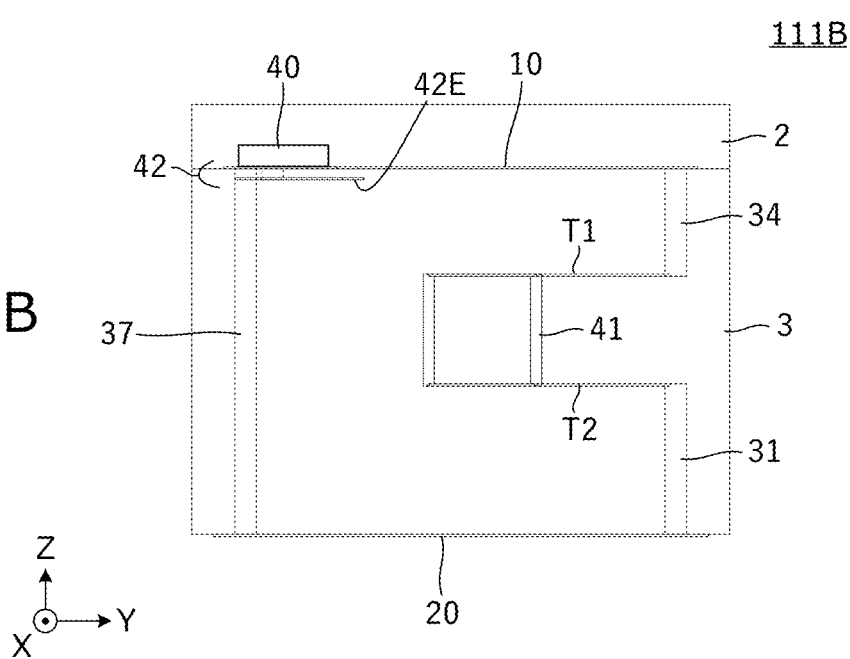
FIG. 36B is a front view seen in the negative X-axis direction.

FIG. 36A is a perspective view of another RFIC module 111B according to the eleventh exemplary embodiment, and FIG. 36B is a front view seen in the negative X-axis direction. However, both of FIG. 36A and FIG. 36B show an inside in a see-through manner.

The RFIC module 111B includes an insulating base material 3 and an insulator layer 2 that covers an upper surface of the insulating base material 3. An insulating base material 3 is a multilayer substrate made of glass-epoxy, for example. The insulating base material 3 includes a first planar conductor 10 on an upper surface and a second planar conductor 20 on a lower surface, respectively. In addition, this insulating base material 3 includes an inductor 41, a capacitor electrode 42E, via conductors 31, 34, and 37, and the like therein. A capacitor 42 is provided in a portion in which the capacitor electrode 42E and the first planar conductor 10 face each other.

The inductor 41 includes a rectangular helical conductor defined by a plurality of conductor patterns along an X-Y plane and a plurality of via conductors extending in a Z-axis direction.

A first end T1 of the inductor 41 is connected to a first point P1 that is a portion of an outer edge of the first planar conductor 10 through the fourth via conductor 34, and a second end T2 of the inductor 41 is connected to a second point P2 that is a portion of an outer edge of the second planar conductor 20 through the via conductor 31. In addition, a first end of the RFIC 40 is connected to a third point P3 that is a portion of the outer edge of the first planar conductor 10 through the capacitor 42, and a second end of the RFIC 40 is connected to a fourth point P4 that is a portion of the outer edge of the second planar conductor 20 through the via conductor 37.

According to the present exemplary embodiment, the inductor as a component and the capacitor as a component are not required, which reduces mounting cost and is suitable for miniaturization.

Twelfth Exemplary Embodiment

A twelfth exemplary embodiment provides an example of an RFIC module using a conductor element including a body of a metal plate, instead of a planar conductor and a via conductor.

Figure 37:
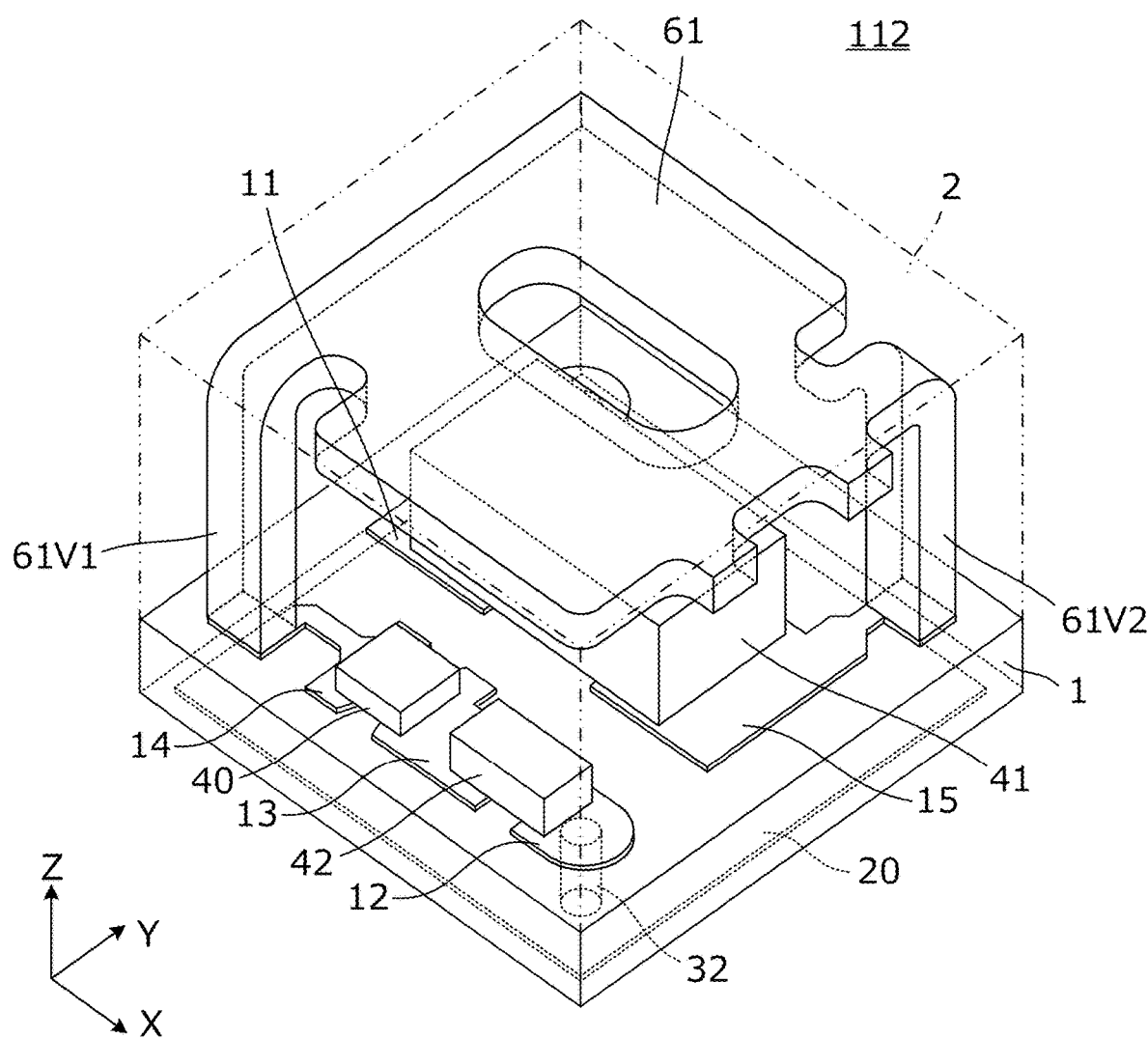
FIG. 37 is a perspective view of an RFIC module according to a twelfth exemplary embodiment of the present invention.
Figure 38:
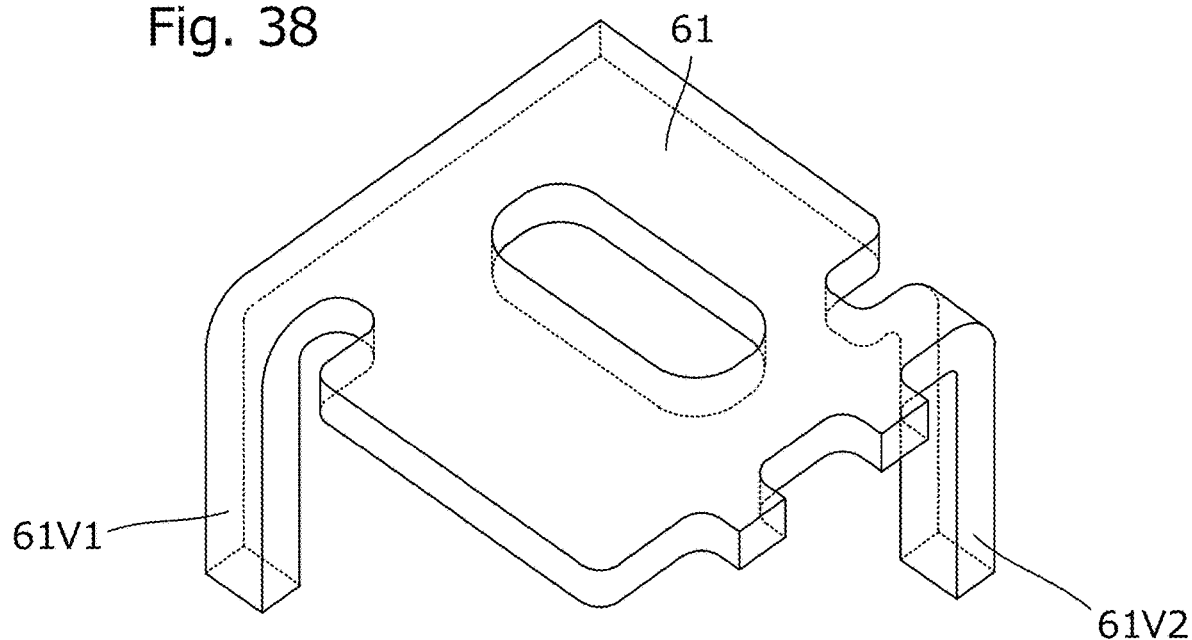
FIG. 38 is an exploded perspective view of a main portion of the RFIC module according to the twelfth exemplary embodiment of the present invention.
Figure 38:
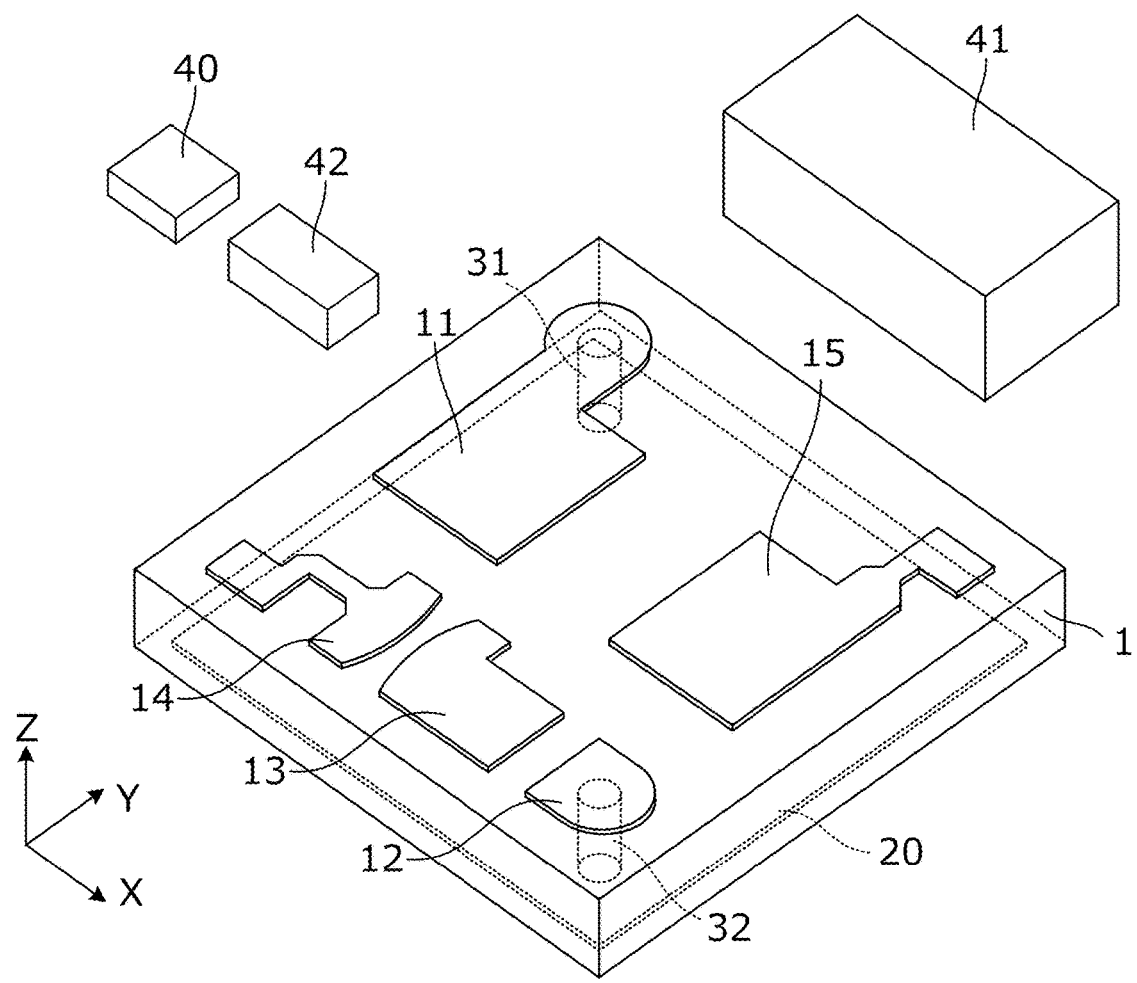

FIG. 37 is a perspective view of an RFIC module 112 according to the twelfth exemplary embodiment. FIG. 38 is an exploded perspective view of a main portion of the RFIC module 112.

The RFIC module 112 includes a conductor element 61, a second planar conductor 20, an RFIC 40, an inductor 41, and a capacitor 42.

As shown in FIG. 38, the RFIC 40, the inductor 41, and the capacitor 42 are mounted on each electrode 11, 12, 13, 14, and 15 of an upper surface of an insulating base material 1. Subsequently, a leg portion 61V1 of a conductor element 61 is connected to the electrode 14, and a leg portion 61V2 is connected to the electrode 15. These portions are connected by soldering, for example.

The conductor element 61 is configured to include a single body of a metal plate corresponding to a first planar conductor 10, a third via conductor 33, and a fourth via conductor 34 that are shown in FIG. 16 or FIG. 20. In other words, a surface of the conductor element 61 that is opposed in parallel to the second planar conductor 20 corresponds to the first planar conductor 10, the leg portion 61V1 corresponds to the third via conductor 33, and the leg portion 61V2 corresponds to the fourth via conductor 34. The conductor element 61 is manufactured by sheet-metal work such as punching of a copper sheet and bending work.

In FIG. 37, a covered range of the insulator layer 2 is indicated by a chain double-dashed line. The insulator layer 2 includes an epoxy resin, for example. Other configurations are the same as the configurations of the RFIC module shown in FIG. 16 and FIG. 20.

For example, the height of this RFIC module 112 is 2 mm, one side of the lower surface of the RFIC module 112 is 2.5 mm, the thickness of the insulating base material 1 is 0.4 mm, and the height from the upper surface of the insulating base material 1 to the inner top surface of the conductor element 61 is 1.25 mm.

According to the present exemplary embodiment, it is unnecessary to perform processing to provide the first planar conductor 10, the third via conductor 33 and the fourth via conductor 34 to the insulator layer 2, so that a manufacturing process is simplified and costs are reduced. In addition, the resistance component and inductance component of the leg portions 61V1 and 61V2 are able to be easily reduced.

Thirteenth Exemplary Embodiment

A thirteenth exemplary embodiment illustrates an RFIC module with improved manufacturability of the RFIC module described in the twelfth exemplary embodiment, and a method of manufacturing such an RFIC module.

Figure 39:
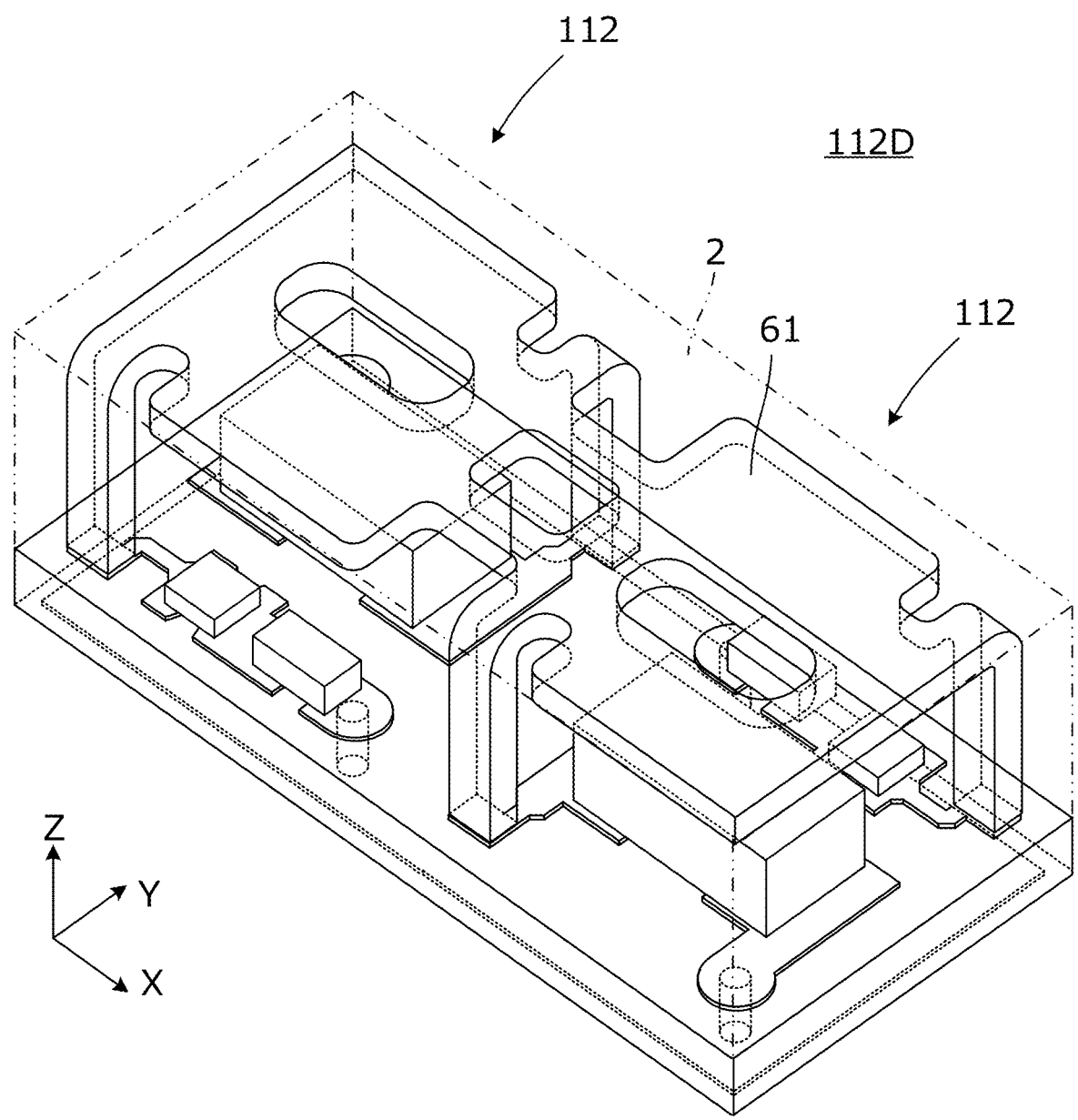
FIG. 39 is a perspective view of an RFIC module according to a thirteenth exemplary embodiment of the present invention.
Figure 40:
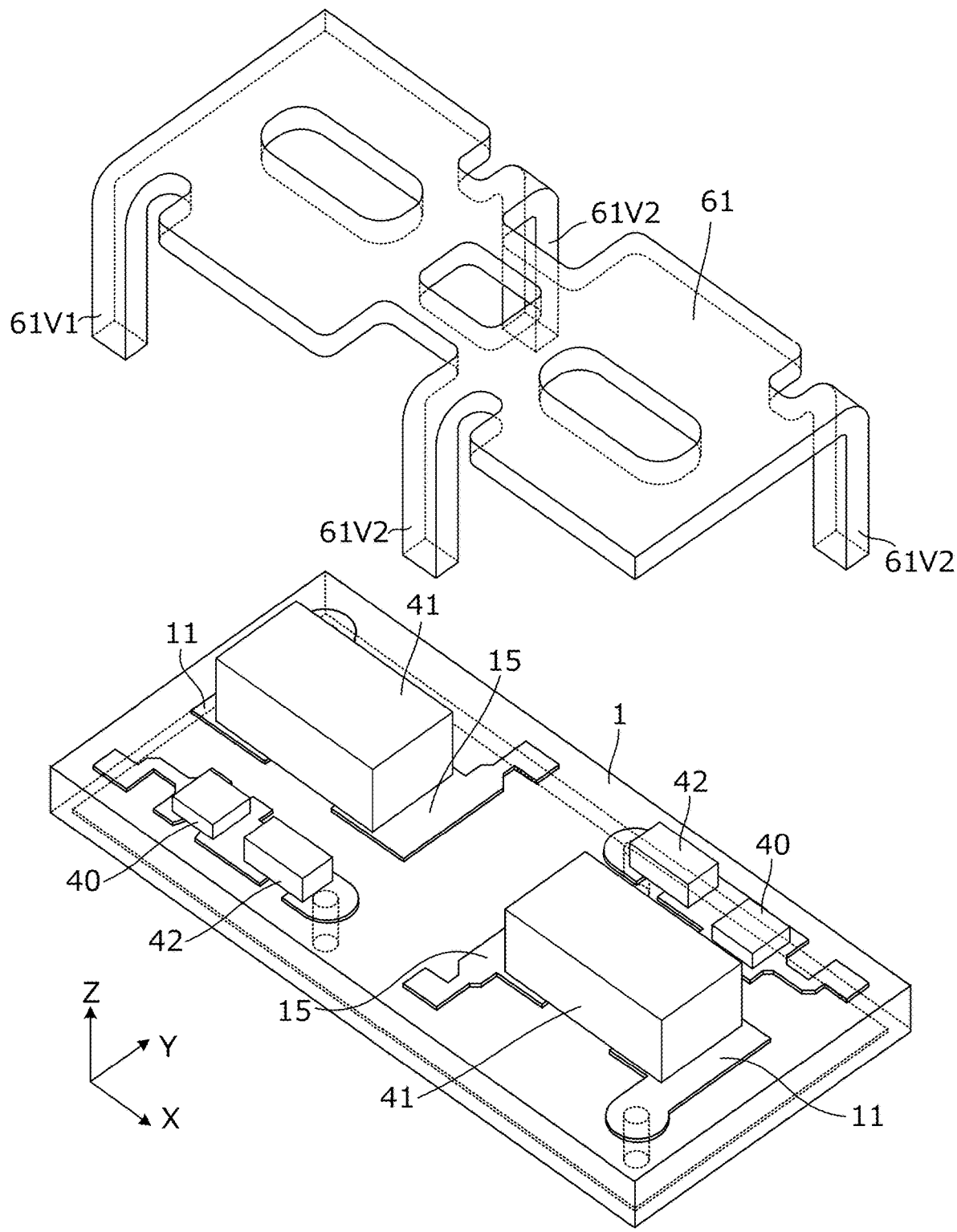
FIG. 40 is an exploded perspective view of the main portion of the RFIC module according to the thirteenth exemplary embodiment of the present invention.

FIG. 39 is a perspective view of an RFIC module 112D according to the thirteenth exemplary embodiment. FIG. 40 is an exploded perspective view of a main portion of the RFIC module 112D.

The RFIC module 112D is in a state before two RFIC modules 112 are divided. This RFIC module 112D is divided by a plane being parallel to a Y-Z plane and passing through the center, so that two RFIC modules 112 are able to be obtained.

As shown in FIG. 40, the conductor element 61 includes two sets of leg portions 61V1 and 61V2, that is, a total of four leg portions.

Electrodes for two RFIC modules are provided on the upper surface of the insulating base material 1, and an RFIC 40, an inductor 41, and a capacitor 42 are mounted. Subsequently, the conductor element 61 is mounted and an upper portion of the insulating base material 1 is covered with the insulator layer 2. Subsequently, the entirety is divided by a dicer. As a result, the RFIC module 112 shown in FIG. 37 is able to be obtained.

According to the present exemplary embodiment, a conductor element is mounted on the insulating base material 1 with the four leg portions, so that assembly is able to be easily performed.

Fourteenth Exemplary Embodiment

Figure 41:
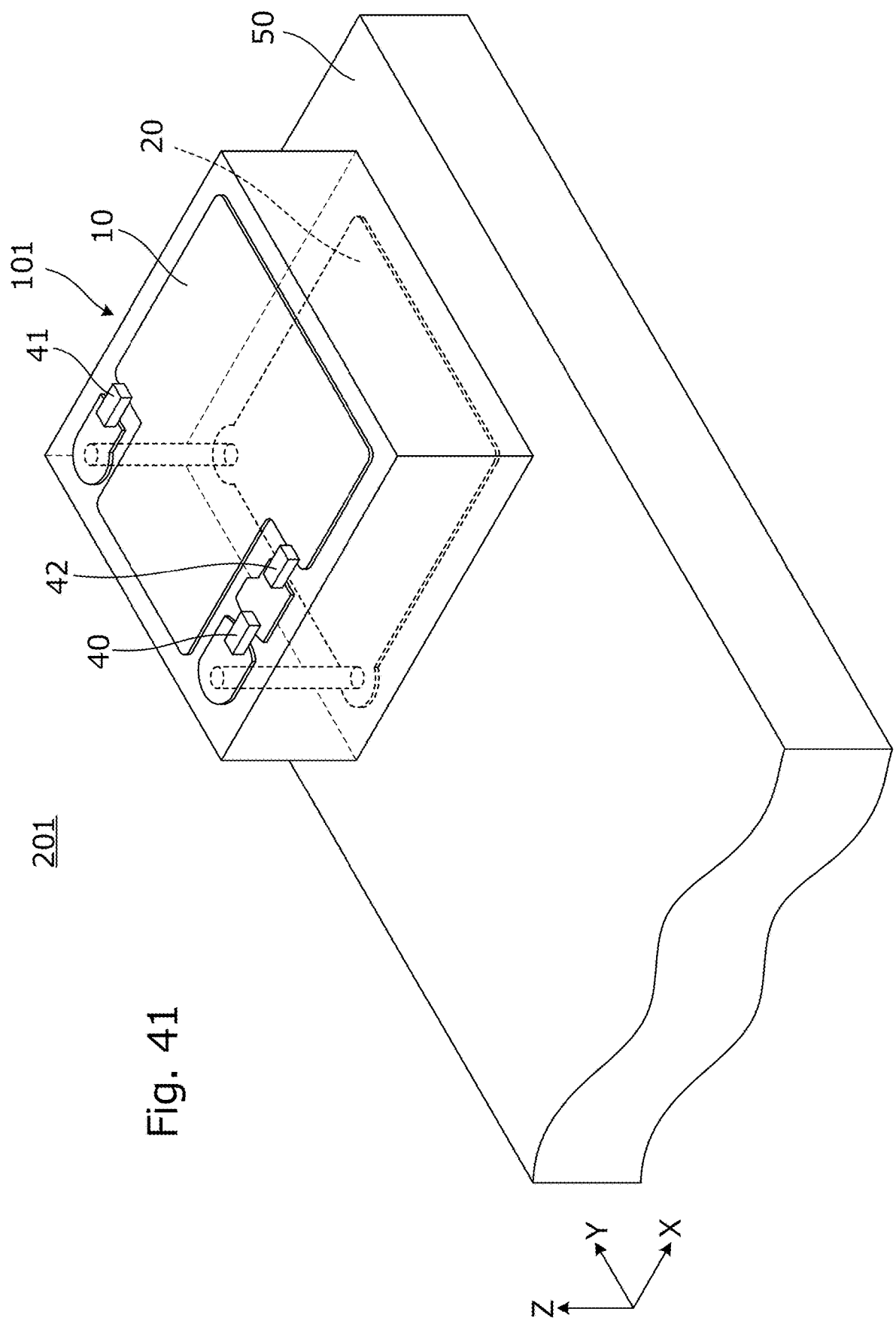
FIG. 41 is a perspective view of an RFID tag according to a fourteenth exemplary embodiment of the present invention.

A fourteenth exemplary embodiment provides an example of an RFID tag including an RFIC module. FIG. 41 is a perspective view of the RFID tag 201 according to the fourteenth exemplary embodiment. This RFID tag 201 is attached to an external surface of a predetermined article or incorporated into a predetermined article. The RFID tag 201 includes a radiation plate 50 made of metal and an RFIC module 101. The radiation plate 50 is a planar or plate shaped radiation portion that extends in a transverse direction and a longitudinal direction. In the directions shown in FIG. 41, the X direction is the transverse direction and the Y direction is the longitudinal direction. The RFIC module 101 is mounted on the radiation plate 50. The RFIC module 101 is stacked on the radiation plate 50 in the direction (the Z direction) in which the first planar conductor 10 and the second planar conductor 20 face each other. The second planar conductor 20 and the radiation plate 50 are electrically connected to each other.

A length L in the longitudinal direction of the radiation plate 50 corresponds to a half wavelength at a resonance frequency or the neighborhood of the wavelength. Therefore, the radiation plate 50 resonates at a half wavelength with both ends open and acts as a radiating element. A lower surface of the radiation plate 50 may include an adhesive layer for attaching the RFID tag 201 to a certain element and release paper that covers the surface of the adhesive layer.

Figure 42A:
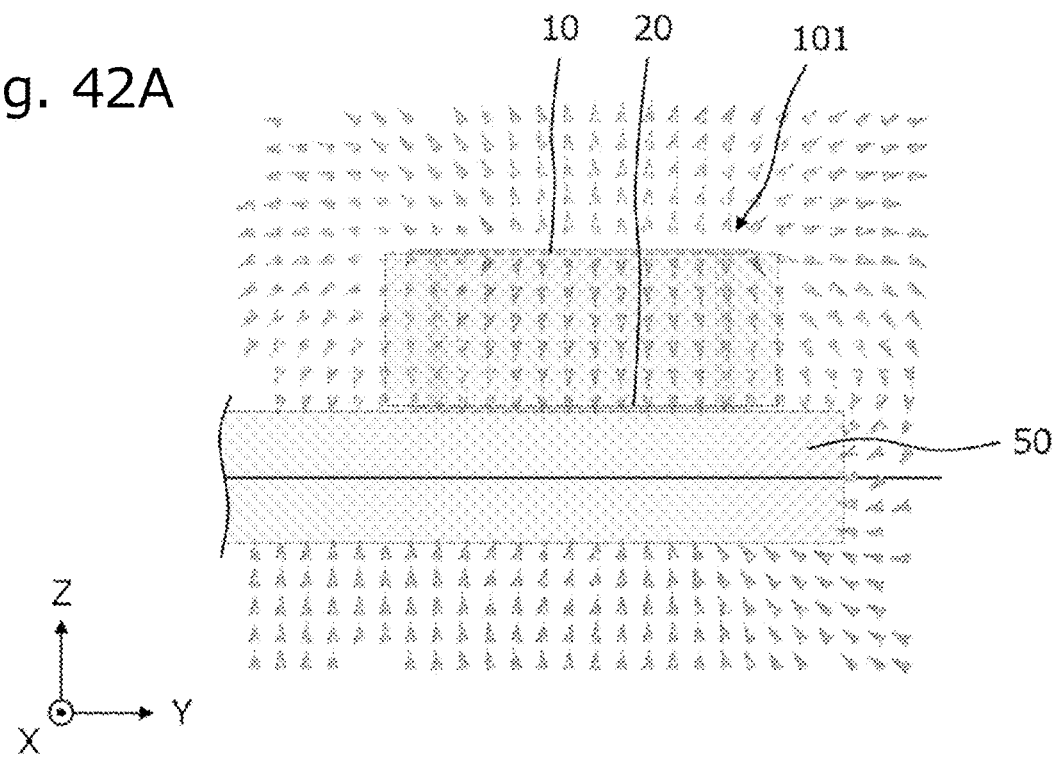
FIG. 42A is a view showing a direction of an electric field of each portion of the RFID tag, seen in a negative X direction.
Figure 42B:
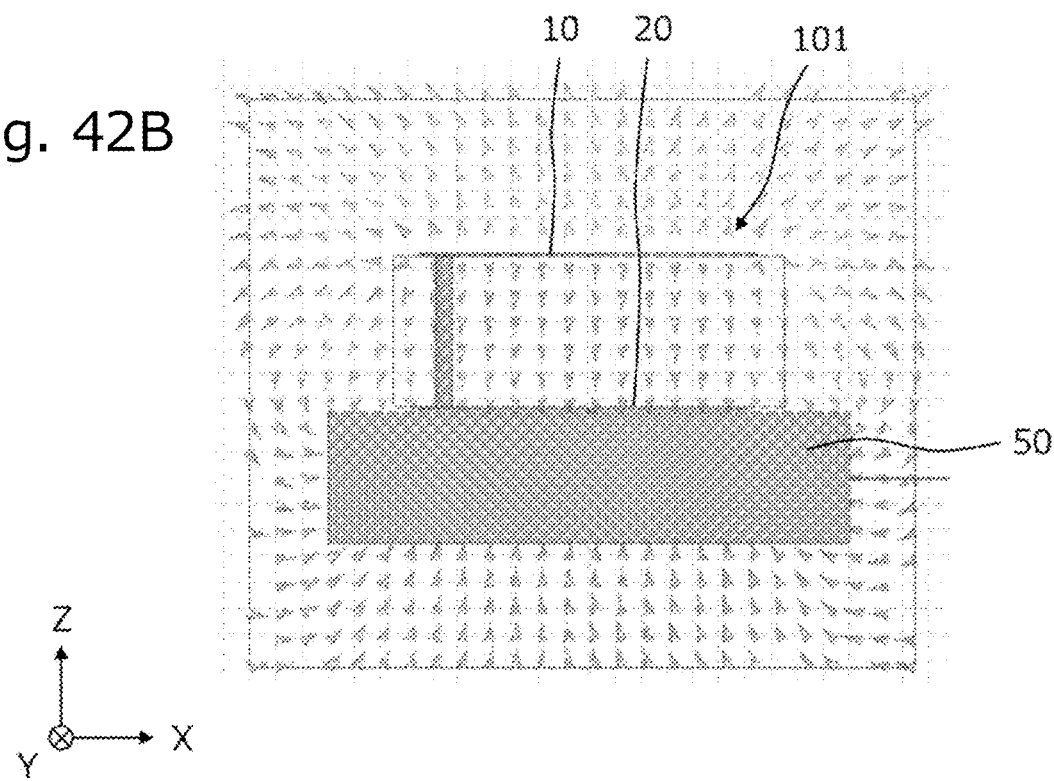
FIG. 42B is a view showing a direction of the electric field of each portion of the RFID tag, seen in a Y direction.

FIG. 42A is a view showing a direction of an electric field of each portion of the RFID tag 201, seen in the negative X direction, and FIG. 42B is a view showing a direction of the electric field of each portion of the RFID tag 201, seen in the Y direction.

In FIG. 42A and FIG. 42B, the arrowhead symbol indicates a direction of an electric field. As shown in FIG. 42A and FIG. 42B, an almost uniform electric field is generated between the first planar conductor 10 and the second planar conductor 20, and an electric field that extends outward between the periphery and external surface of the first planar conductor 10 and the radiation plate 50 is generated. In this manner, the RFIC module 101 and the radiation plate 50 configure an RFID tag that includes a large radiation portion.

Figure 43A:
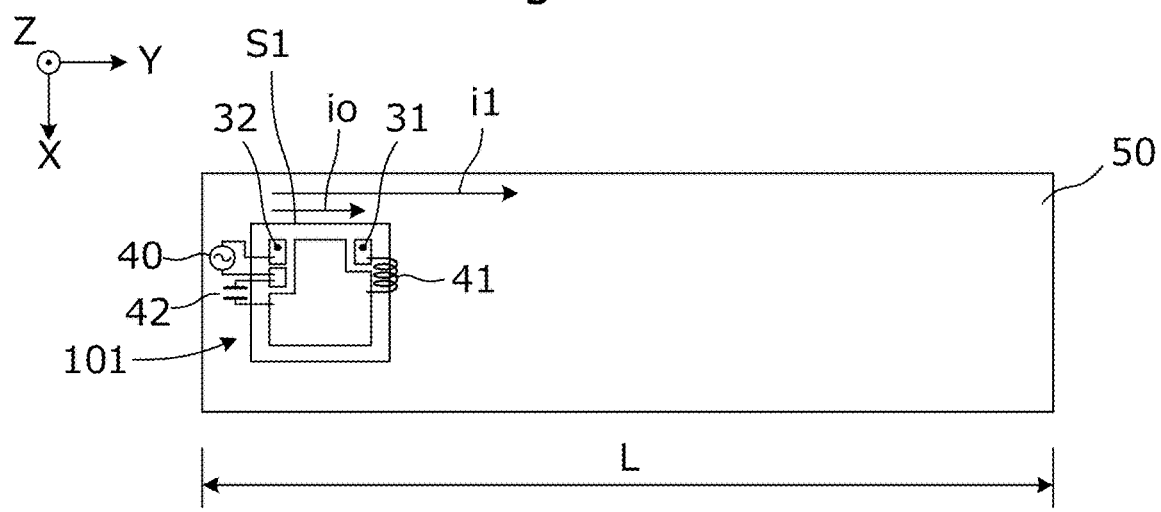
FIG. 43A and FIG. 43B are views showing an example of current induced to a radiation plate.
Figure 43B:
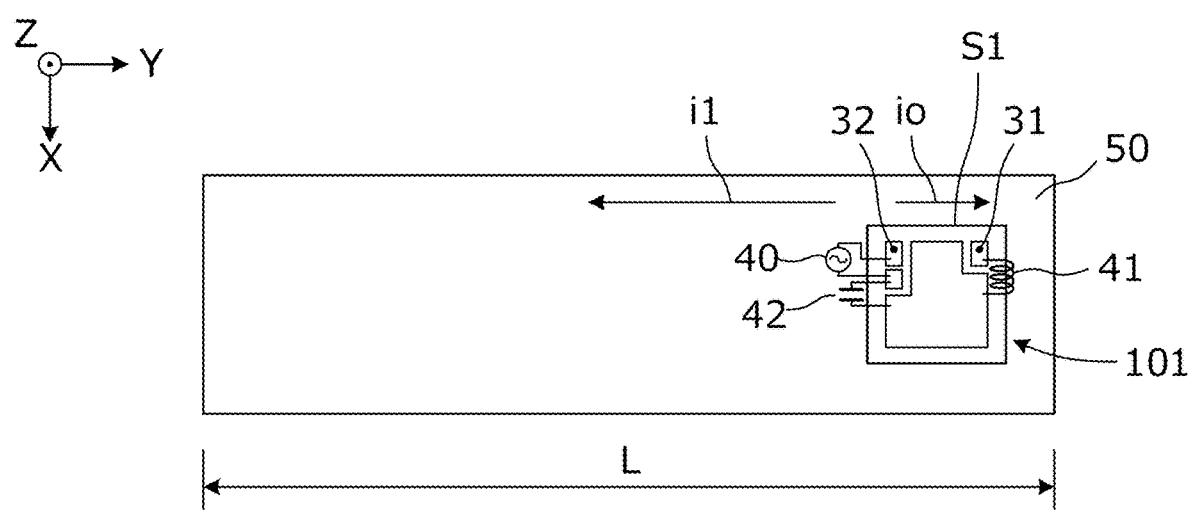

FIG. 43A and FIG. 43B are views showing an example of current induced to a radiation plate 50. In FIG. 43A and FIG. 43B, the positions in which the RFIC module 101 is mounted to the radiation plate 50 are different. In FIG. 43A and FIG. 41, the positions in which the RFIC module 101 is mounted to the radiation plate 50 are the same. In the second planar conductor 20 of the RFIC module 101, a current io flows between a connection end of the first via conductor 31, and a connection end of the second via conductor 32, and a current i1 that exits the second via conductor 32 and enters the radiation plate 50 flows in the longitudinal direction of the radiation plate 50.

In this manner, among a plurality of sides of the first planar conductor 10 and the second planar conductor 20, a side S1 near a line that connects the connecting portions of the inductor 41 and the RFIC 40 extends in the longitudinal direction (the Y direction) of the radiation plate 50. According to this configuration, a direction of a current that flows in the second planar conductor 20 between the connecting portion of the inductor 41 and the connecting portion of the RFIC 40 is aligned to the longitudinal direction of the radiation plate 50, so that the radiation efficiency of the radiation plate 50 is increased.

As shown in FIG. 43B, when a side to which the inductor 41 is connected is disposed closer to a side of an end portion of the radiation plate 50 than a side to which the RFIC 40 is connected, for example, a current io that flows in a direction from the connection end of the second via conductor 32 to the connection end of the first via conductor 31 is in the inverse direction to a current i1 that flows from the second via conductor 32 in the longitudinal direction of the radiation plate 50. In other words, compensation occurs due to the current directions being partially inverted to each other.

As shown in FIG. 43A, when the side to which the RFIC 40 is connected is disposed closer to the side of the end portion of the radiation plate 50 than the side to which the inductor 41 is connected, for example, the current io that flows in the direction from the connection end of the second via conductor 32 to the connection end of the first via conductor 31 is in the same direction to the current i1 that flows from the second via conductor 32 in the longitudinal direction of the radiation plate 50. Therefore, the compensation does not occur due to the current directions being partially inverted to each other, and thus high radiation efficiency is able to be obtained.

It is to be noted that, in the example shown in FIG. 41, FIG. 43A, and FIG. 43B, the example of the RFID tag that includes the radiation portion that has a transverse direction and a longitudinal direction, that is, a strip-like, planar or plate shape, has been shown. However, the shape of the radiation portion to configure an RFID tag is not limited to such a strip shape.

Fifteenth Exemplary Embodiment

A fifteenth exemplary embodiment provides an example of an RFID tag different from the RFID tag of the fourteenth exemplary embodiment.

Figure 44:
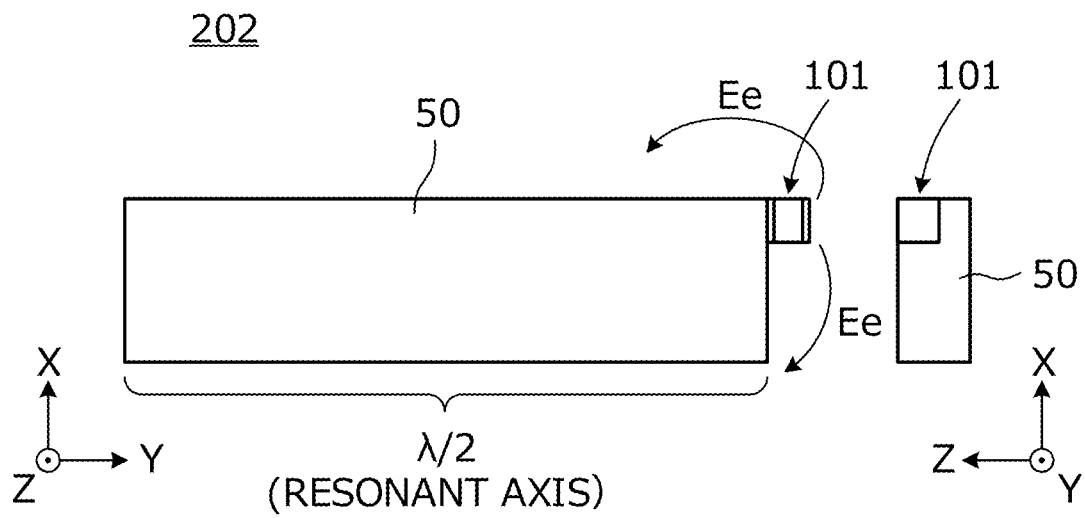
FIG. 44 is a plan view and right side view of an RFID tag according to a fifteenth exemplary embodiment of the present invention.
Figure 45:
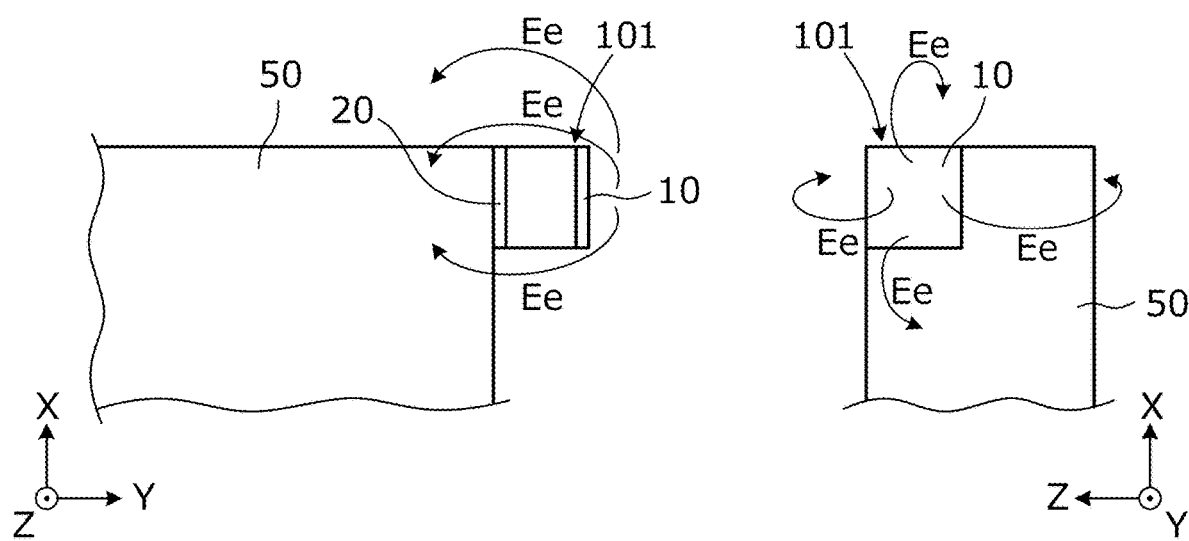
FIG. 45 is a partially enlarged plan view and partially enlarged right side view of the RFID tag.

FIG. 44 is a plan view and right side view of an RFID tag 202 according to the fifteenth exemplary embodiment. FIG. 45 is a partially enlarged plan view and partially enlarged right side view of the RFID tag 202. The radiation plate 50 is a conductor portion that the RFID tag 202 essentially includes. The radiation plate 50 is rectangular parallelepiped metal, and includes an RFIC module 101 disposed on one end surface in the longitudinal direction (e.g., the Y direction in FIG. 44). The structure of the RFIC module 101 is the same as the structure described in the above exemplary embodiments.

In the example shown in FIG. 44 and FIG. 45, a direction in which the first planar conductor 10 and the second planar conductor 20 face each other is the same as the longitudinal direction (e.g., the Y direction) of the radiation plate 50.

In FIG. 44 and FIG. 45, the arrow of a curve that extends from the first planar conductor 10 is a line Ee of electric force that shows a state of an electric field that is generated around the RFIC module 101 and the radiation plate 50. In this manner, the entirety of the line Ee of electric force that enters and exits the first planar conductor 10 contributes to field emission.

Figure 46:
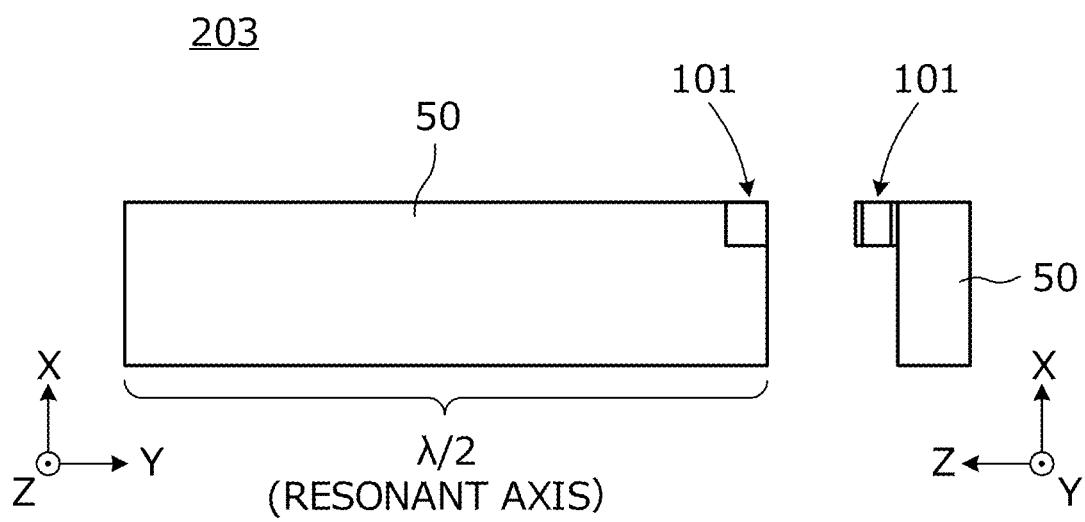
FIG. 46 is a plan view and right side view of another RFID tag according to the fifteenth exemplary embodiment of the present invention.
Figure 47:
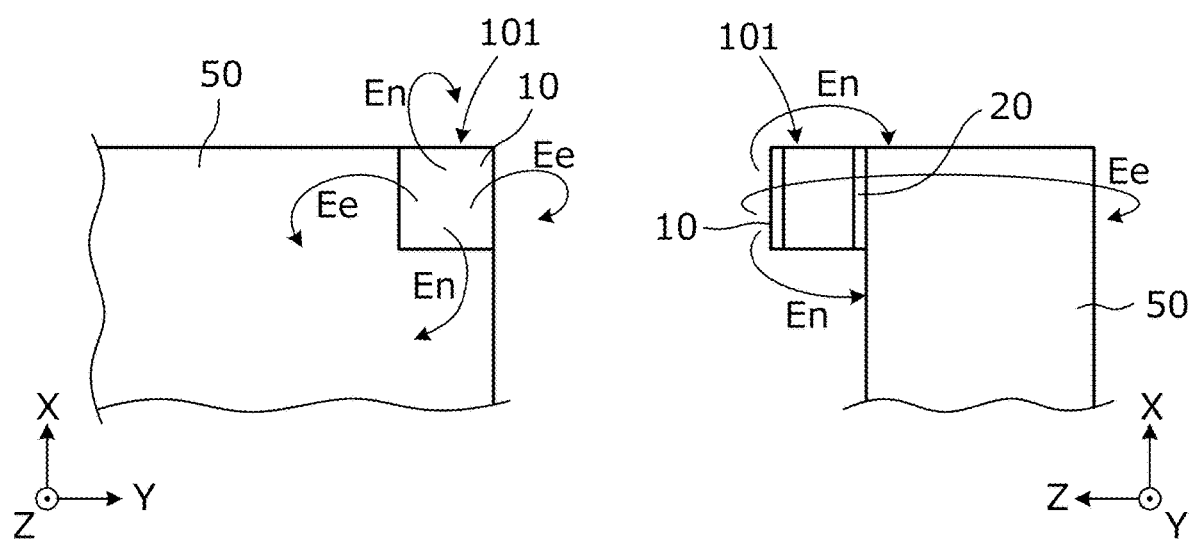
FIG. 47 is a partially enlarged plan view and partially enlarged right side view of the RFID tag.

FIG. 46 is a plan view and right side view of another RFID tag 203 according to the fifteenth exemplary embodiment. FIG. 47 is a partially enlarged plan view and partially enlarged right side view of the RFID tag 203. The radiation plate 50 is a conductor portion that the RFID tag 203 essentially includes. The radiation plate 50 is rectangular parallelepiped metal, and includes an RFIC module 101 disposed on one end portion in the longitudinal direction (e.g., the Y direction in FIG. 46). The structure of the RFIC module 101 is the same as the structure described in the above exemplary embodiments.

In the example shown in FIG. 46 and FIG. 47, a direction in which the first planar conductor 10 and the second planar conductor 20 face each other is the same as the thickness direction (e.g., the Z direction) of the radiation plate 50. In FIG. 46 and FIG. 47, the arrow of a curve that extends from the first planar conductor 10 is a line of electric force that shows a state of an electric field that is generated around the RFIC module 101 and the radiation plate 50.

In FIG. 47, since the direction of line En of electric force is a direction perpendicular or substantially perpendicular to the longitudinal direction (e.g., the Y direction) of the radiation plate 50, line En of electric force does not contribute to field emission. In other words, a polarization plane of the electromagnetic field radiated from the RFIC module 101 is not used effectively. Other lines Ee of electric force contribute to field emission.

As shown in FIG. 44 and FIG. 45, when the direction in which the first planar conductor 10 and the second planar conductor 20 face each other is the same as the longitudinal direction of the radiation plate 50, the radiation efficiency by the RFIC module 101 and the radiation plate 50 is further increased.

Sixteenth Exemplary Embodiment

A sixteenth exemplary embodiment provides an example of an RFID tag including a radiator including a spiral coil.

FIG. 48A is a perspective view of an RFID tag 204A according to the sixteenth exemplary embodiment. FIG. 48B is a partially enlarged perspective view of the RFID tag 204A.

The RFID tag 204A includes an RFIC module 111 and a radiator 51. The radiator 51 is a metal spiral coil having elasticity. The RFIC module 111 includes a portion equivalent to the RFIC module 101 shown in FIG. 1, and an insulator layer 4 provided below the portion. The insulator layer 4 is a layer of an epoxy resin, for example. The insulator layer 4 includes a hole H, and one end of the radiator 51 is inserted into this hole H. In this example, the axis of the radiator 51 has a perpendicular relationship to the surfaces of the first planar conductor 10 and the second planar conductor 20.

The radiator 51 is electric-field coupled to the first planar conductor 10 and the second planar conductor 20 of the RFIC module 111, and acts as a half wavelength resonant dipole antenna with both ends open.

Figure 49:
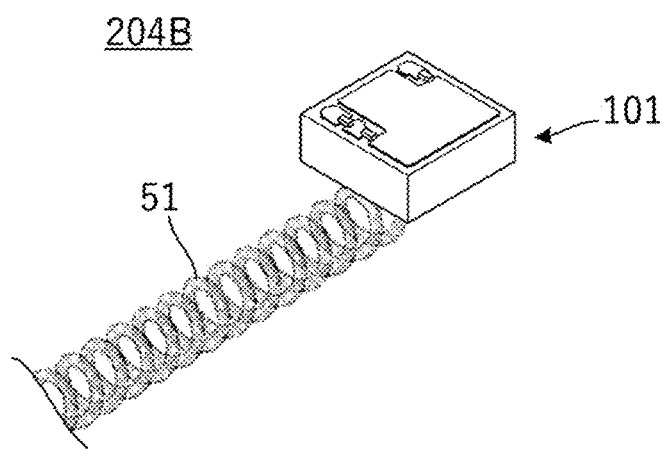
FIG. 49 is a perspective view of another RFID tag according to the sixteenth exemplary embodiment of the present invention.

FIG. 49 is a perspective view of another RFID tag 204B according to the present exemplary embodiment. The RFID tag 204B includes an RFIC module 101 and a radiator 51. The radiator 51 is a metal spiral coil having elasticity. The RFIC module 101 is an RFIC module having the same configuration as the RFIC module 101 shown in FIG. 1. The RFIC module 101 is attached to one end portion of the radiator 51 through a bonding material. In this example, the axis of the radiator 51 has a parallel relationship to the surfaces of the first planar conductor 10 and the second planar conductor 20.

Figure 50:
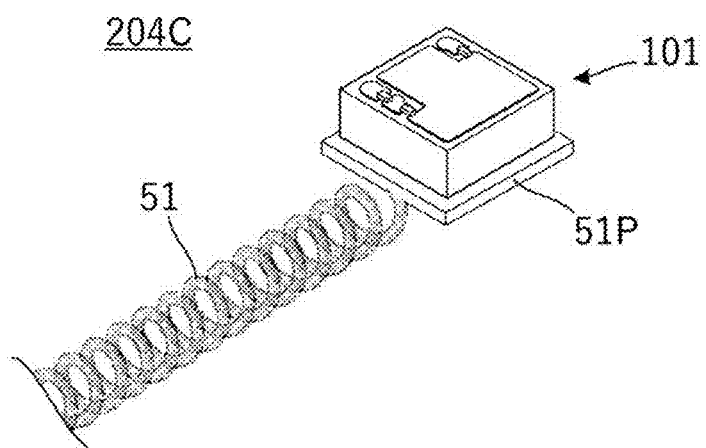
FIG. 50 is a perspective view of still another RFID tag according to the sixteenth exemplary embodiment of the present invention.

FIG. 50 is a perspective view of still another RFID tag 204C according to the present exemplary embodiment. The RFID tag 204C includes an RFIC module 101 and a radiator 51. The radiator 51 is a spiral coil. The RFIC module 101 is an RFIC module having the same configuration as the RFIC module 101 shown in FIG. 1. A plate-like portion 51P obtained by partially flattening the radiator 51 is provided at one end of the radiator 51. The RFIC module 101 is attached to a surface of the plate-like portion 51P of the radiator 51 through a bonding material. Even in this example, the axis of the radiator 51 has a parallel relationship to the surfaces of the first planar conductor 10 and the second planar conductor 20.

In both RFID tags 204B and 204C shown in FIG. 49 and FIG. 50, the radiator 51 is electric-field coupled to the first planar conductor 10 and the second planar conductor 20 of the RFIC module 101, and acts as a half wavelength resonant dipole antenna with both ends open.

According to the exemplary embodiment, the radiator 51 has elasticity, so that an RFID that is highly resistant to an external force even when having a long and thin shape is able to be obtained. For example, in a case in which any of the RFID tags 204A, 204B, and 204C is used by embedding in a portion of a rubber product or a resin product that configures an article, such an RFID tag is able to be used as an RFID tag having high vibration resistance and impact resistance.

Seventeenth Exemplary Embodiment

A seventeenth exemplary embodiment provides an example of an article including an RFIC module.

Figure 51A:
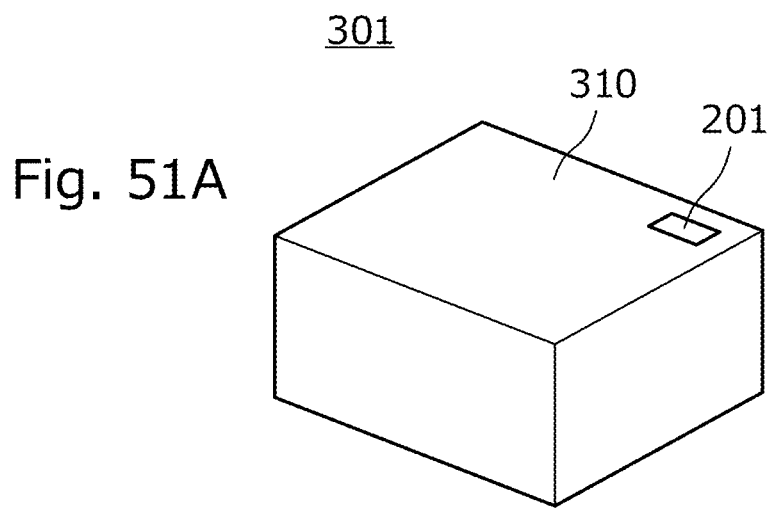
FIG. 51A is a perspective view of an article according to a seventeenth embodiment of the present invention.

FIG. 51A is a perspective view of an article 301 according to the seventeenth embodiment. This article 301 includes an insulating element 310 of which at least the surface has an insulating property, and an RFID tag 201 that is attached to this insulating element 310. It is noted that the configurations of the RFID tag 201 are the same or substantially the same as the configurations described in the fourteenth exemplary embodiment.

Figure 51B:
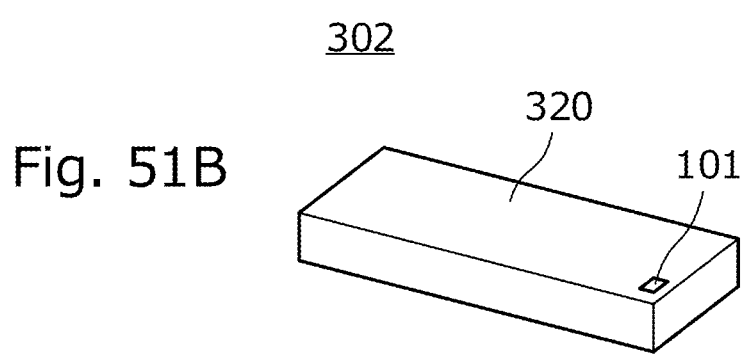
FIG. 51B is a perspective view of another article according to the seventeenth embodiment of the present invention.

FIG. 51B is a perspective view of an article 302 according to the seventeenth embodiment. This article 302 includes a conductive element 320 and an RFIC module 101 provided on this conductive element 320. The configurations of the RFIC module 101 are the same or substantially the same as the configurations described in the first exemplary embodiments.

The insulating element 310 or the conductive element 320 is, for example, a palette, a rack, or a tray that loads a certain article; or equipment such as a measuring instrument, a jig, or a tool.

Finally, it is noted that the foregoing exemplary embodiments are illustrative in all points and should not be construed to limit the present invention. It is understood that variations and modifications will be apparent to those skilled in the art. The scope of the present invention is defined not by the foregoing exemplary embodiment but by the following claims. Further, the scope of the present invention includes all modifications from the exemplary embodiments within the scopes of the claims and within the scopes of equivalents.

For example, the communication frequency is not limited to a 900-MHz band, and another exemplary embodiment may be applied similarly to other frequency bands, for example, 2.45 GHz band or the like.

In addition, in each of the above described exemplary embodiments, although the RFIC module including the capacitor 42 is shown, as already described, the capacitor 42 is not essential.

What is claimed is:

1. An RFIC module comprising:
a first planar conductor;
a second planar conductor that faces the first planar conductor;
an inductor that includes a first end connected to a first point at an outer edge of the first planar conductor and a second end connected to a second point at an outer edge of the second planar conductor; and
an RFIC that includes a first end connected to a third point at the outer edge of the first planar conductor and a second end connected to a fourth point at the outer edge of the second planar conductor.

2. The RFIC module according to claim 1, wherein a line that connects the second point to the fourth point is parallel to a line that connects the first point to the third point, with the respective lines overlapping each other in a plan view of the first and second planar conductors.

3. The RFIC module according to claim 1, wherein a line that connects the second point to the fourth point is parallel to a line that connects the first point to the third point, with the respective lines not overlapping each other in a plan view of the first and second planar conductors.

4. The RFIC module according to claim 1, wherein a line that connects the second point to the fourth point is not parallel to a line that connects the first point to the third point, and the respective lines do not cross each other in a center of each line.

5. The RFIC module according to claim 1, wherein respective lengths of the first and second planar conductors extending in any direction thereof are one-eighth wavelength or less of a communication signal processed by the RFIC.

6. The RFIC module according to claim 1, further comprising a capacitor connected in series to the RFIC.

7. The RFIC module according to claim 6, further comprising an insulating base material on which the capacitor is mounted.

8. The RFIC module according to claim 1, further comprising an insulating base material on which the inductor is mounted.

9. The RFIC module according to claim 1, further comprising:
an insulating base material that includes a first and second principal surfaces that oppose each other,
wherein the first and second planar conductors are disposed on the first and second principal surfaces of the insulating base material, respectively;
wherein the inductor and the RFIC are mounted on the first principal surface of the insulating base material; and
wherein the insulating base material includes a first via conductor that connects the second end of the inductor and the second planar conductor, and a second via conductor that connects the second end of the RFIC and the second planar conductor.

10. The RFIC module according to claim 9, wherein each of the first via conductor and the second via conductor is a single via conductor.

11. The RFIC module according to claim 1, further comprising:
an insulating base material that includes first and second principal surfaces that oppose each other; and
an insulator layer that covers the first principal surface of the insulating base material,
wherein the first planar conductor is disposed on a surface of the surface of the insulator layer;
wherein the second planar conductor is disposed on the second principal surface of the insulating base material;
wherein the inductor and the RFIC are disposed on the first principal surface of the insulating base material;
wherein the insulating base material includes:
a first via conductor that connects the second end of the inductor to the second planar conductor; and
a second via conductor that connects the second end of the RFIC to the second planar conductor; and
wherein the insulator layer includes a third via conductor that connects the first end of the RFIC to the first planar conductor and a fourth via conductor that connects the first end of the inductor to the first planar conductor.

12. The RFIC module according to claim 11, wherein each of the first via conductor, the second via conductor, the third via conductor, and the fourth via conductor is a single via conductor.

13. An RFID tag comprising:
a radiator that includes a conductor that extends in a longitudinal direction; and
an RFIC module that includes:
first and second planar conductors that face each other;
an inductor that includes a first end connected to a first point at an outer edge of the first planar conductor and a second end connected to a second point at an outer edge of the second planar conductor; and
an RFIC that includes a first end connected to a third point at the outer edge of the first planar conductor and a second end connected to a fourth point at the outer edge of the second planar conductor,
wherein the RFIC module is disposed at or adjacent to an end of the radiator in the longitudinal direction.

14. The RFID tag according to claim 13,
wherein the radiator comprises a planar shape,
wherein the first and second planar conductors each have a plurality of sides, and
wherein a side of the plurality of sides, which is adjacent to a line that connects connecting portions of the inductor and the RFIC, extends in the longitudinal direction of the radiator.

15. The RFID tag according to claim 13, wherein the first planar conductor faces the second planar conductor in a same direction as the longitudinal direction of the radiator.

16. The RFID tag according to claim 13, wherein the radiator is a spiral coil.

17. The RFIC tag according to claim 13, wherein a line that connects the second point to the fourth point is parallel to a line that connects the first point to the third point, with the respective lines overlapping each other in a plan view of the first and second planar conductors.

18. The RFIC tag according to claim 13, wherein a line that connects the second point to the fourth point is parallel to a line that connects the first point to the third point, with the respective lines not overlapping each other in a plan view of the first and second planar conductors.

19. An article that has a conductor that extends in a longitudinal direction, the article comprising an RFIC module that includes:
first and second planar conductors that face each other;
an inductor that includes a first end connected to a first point at an outer edge of the first planar conductor and a second end connected to a second point at an outer edge of the second planar conductor; and
an RFIC that includes a first end connected to a third point at the outer edge of the first planar conductor and a second end connected to a fourth point at the outer edge of the second planar conductor,
wherein the RFIC module is at or adjacent to an end of the conductor portion in the longitudinal direction.

* * * * *